United States Patent
Panchul et al.

(12)

(10) Patent No.: US 6,226,776 B1
(45) Date of Patent: May 1, 2001

(54) SYSTEM FOR CONVERTING HARDWARE DESIGNS IN HIGH-LEVEL PROGRAMMING LANGUAGE TO HARDWARE IMPLEMENTATIONS

(75) Inventors: Yuri V. Panchul, Milpitas; Donald A. Soderman, Saratoga; Denis R. Coleman, Atherton, all of CA (US)

(73) Assignee: Synetry Corporation, Milpitas, CA (US)

( * ) Notice: Subject to any disclaimer, the term of this patent is extended or adjusted under 35 U.S.C. 154(b) by 0 days.

(21) Appl. No.: 08/931,148

(22) Filed: Sep. 16, 1997

(51) Int. Cl.$^7$ .................................................. G06F 17/50
(52) U.S. Cl. ........................................... 716/3; 716/18
(58) Field of Search ...................... 395/500.04, 500.19; 716/3, 18

(56) References Cited

U.S. PATENT DOCUMENTS

| | | | |
|---|---|---|---|
| 5,197,016 | * 3/1993 | Sugimoto et al. | 395/500.19 |
| 5,437,037 | * 7/1995 | Furuichi | 395/700 |
| 5,493,507 | * 2/1996 | Shinde et al. | 395/489 |
| 5,530,843 | * 6/1996 | Koyama | 395/500.04 |
| 5,603,043 | * 2/1997 | Taylor et al. | 395/800 |
| 5,748,488 | * 5/1998 | Gregory et al. | 395/500.19 |
| 5,953,519 | * 9/1999 | Fura | 395/500.19 |

\* cited by examiner

Primary Examiner—Matthew Smith
Assistant Examiner—Leigh Marie Garbowski
(74) Attorney, Agent, or Firm—Russo & Hale LLP; William C. Milks, III

(57) ABSTRACT

A computer aided hardware design system for enabling design of an actual hardware implementation for a digital circuit using a high-level algorithmic programming language. The system converts an algorithmic representation for a hardware design initially created in the high-level programming language, such as ANSI C, to a hardware design implementation, such as an FPGA or other programmable logic or an ASIC. The C-type program representative of the hardware design is compiled into a register transfer level (RTL) hardware description language (HDL) that can be synthesized into a gate-level hardware representation. The system additionally enables simulation of the HDL design to verify design functionality. Finally, various physical design tools can be utilized to produce an actual hardware implementation. The system also permits the use of other non-C-type high-level programming languages by first translating to a C-type program. In contrast to previous hardware design tools, the system compiles all C-type programming language features, including pointers and structures, into synthesizable HDL.

54 Claims, 90 Drawing Sheets

Microfiche Appendix Included
(2 Microfiche, 176 Pages)

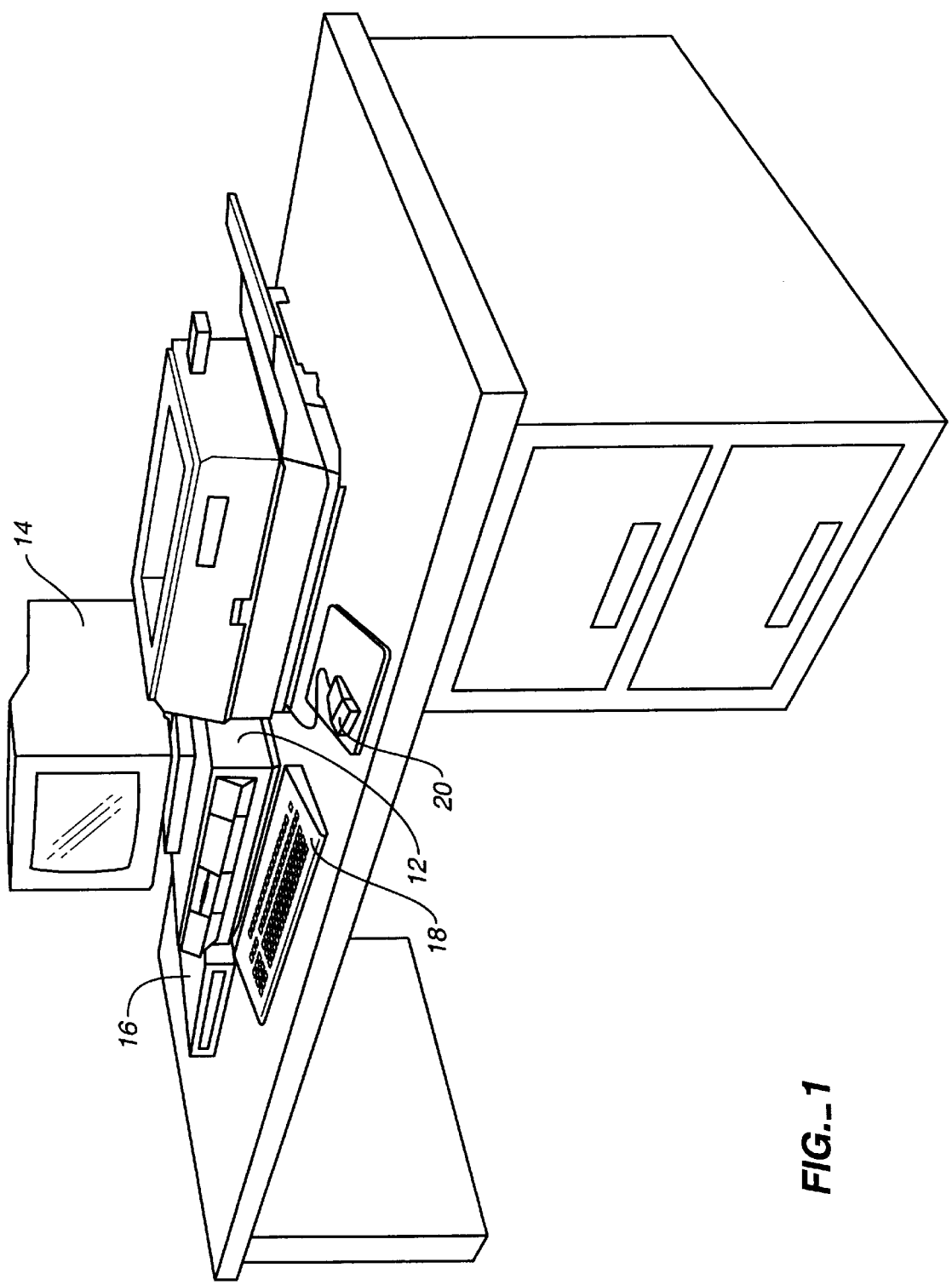
FIG._1

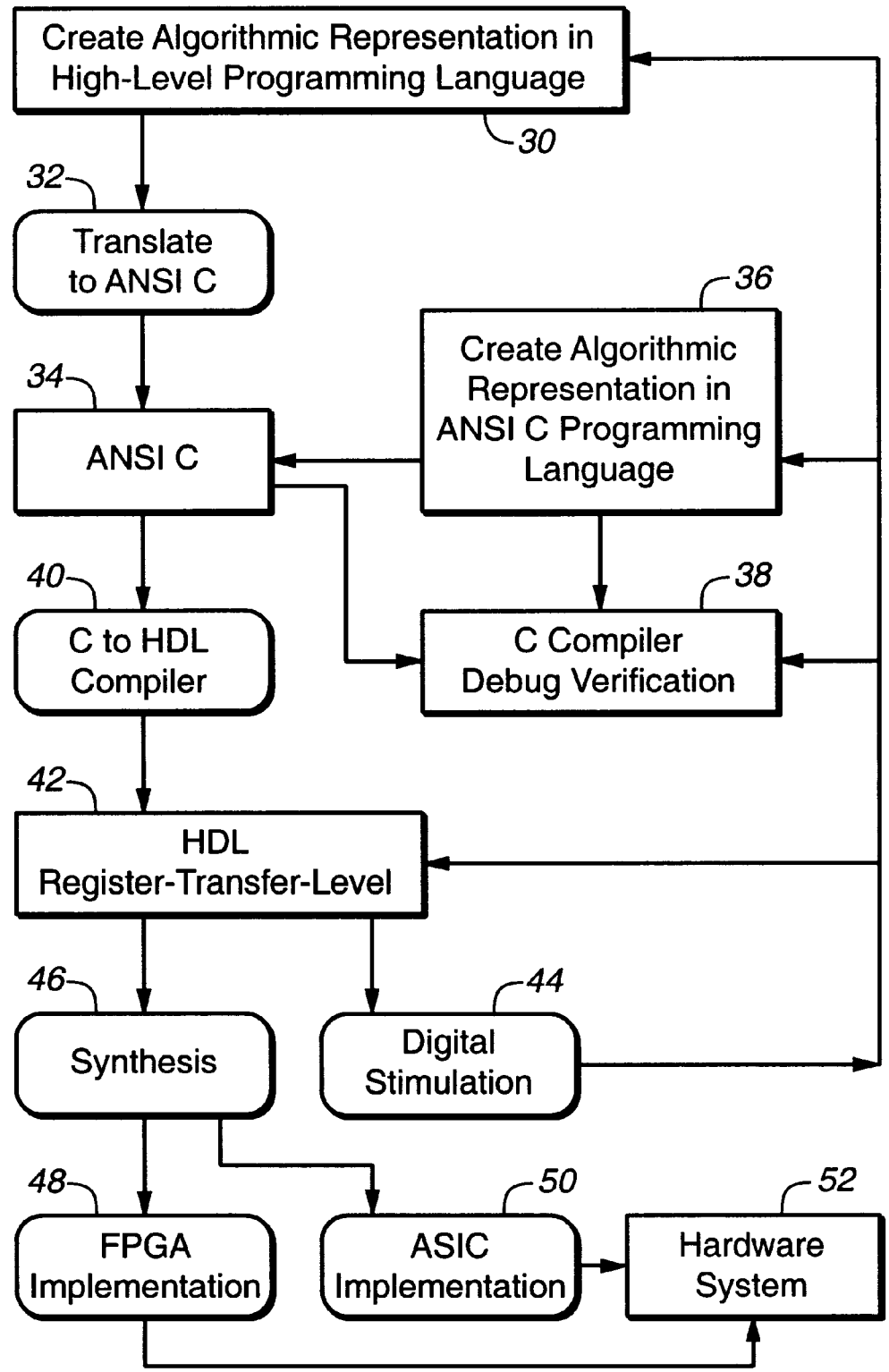
FIG._2 int func1 (unsigned a, unsigned b, unsigned c)
{
    return a + b ^ c << 3;
} int func2 (int a, int b, int c)
{
    return (a ^ b) & c;
}

FIG._3A module func1(result_func1, result_func2, param_func1_a, param_func1_b,
    param_func1_c, param_func2_a, param_func2_b, param_func2_c);

| | |
|---|---|
| output [15:0] | result_func1, result_func2; |
| input [15:0] | param_func1_a, param_func1_b, param_func1_c; |
| input [15:0] | param_func2_a, param_func2_b, param_func2_c; |
| wire [15:0] | result_func1 = <br> ((param_func1_a + param_func1_b) ^ (param_func1_c << 16'd3)); |
| wire [15:0] | result_func2 = <br> ((param_func2_a ^ param_func2_b) & param_func2_c); | endmodule

FIG._3B

```
int func1 (unsigned a, unsigned b, unsigned c)
{
   return a + (b == 1) ^ c << 3;
} int func2 (int a, int b, int c)
{
   if (a < b)
      c -= b;

return (a ^ b) & c;
} int func3 (unsigned a, unsigned b, int c)
{
   unsigned d = 0;
   unsigned e;

b++;

if (a < b)
   {
      int c = e = a - b;

if (a != 0)
      {
         c -= a & b;
         d = c++ ^ b;
      }
      else
      {
         d++;
         e = c + d ? c : 1;
      }
   }
   d = 1;
   return a < b && (a + b ^ c != 3 || a - b == 0);
}
```

*FIG._4A*

```
module funcx (clock,result_func1,result_func2,result_func3,param_func1_a,
        param_func1_b,param_func1_c,param_func2_a,param_func2_b,
        param_func2_c,param_func3_a,param_func3_b,param_func3_c);
    input       clock;
    input  [15:0] param_func1_a, param_func1_b, param_func1_c, param_func2_a, param_func2_b,
                param_func2_c, param_func3_a, param_func3_b, param_func3_c;
    output [15:0] result_func1, result_func2, result_func3;
    reg         _5_1;
    reg    [15:0] result_func1, result_func2, result_func3,
                _func2_c, _func3_b, _6_func3_d, _6_func3_e,
                _7_func3_c, _1_16, _4_16, _6_16, _7_16;
    reg    [16:0] _2_17, _3_17;
always @(posedge clock)
    begin
        _1_16 = (param_func1_b == 16'd1);
        result_func1 = ((param_func1_a + _1_16) ^ (param_func1_c << 16'd3));
        _func2_c = param_func2_c;
        _2_17 = { ~ param_func2_a [15], param_func2_a };
        _3_17 = { ~ param_func2_b [15], param_func2_b };
        if ((_2_17 < _3_17))
            _func2_c = (_func2_c - param_func2_b);
        result_func2 = ((param_func2_a ^ param_func2_b) & _func2_c);
        _func3_b = param_func3_b;
        _6_func3_d = 16'd0;
        _func3_b = (_func3_b + 16'd1);
        if ((param_func3_a < _func3_b))
         begin
            _6_func3_e = (param_func3_a - _func3_b);
            _7_func3_c = _6_func3_e;
            if ((param_func3_a != 16'd0))
             begin
                _7_func3_c = (_7_func3_c - (param_func3_a & _func3_b));
                _4_16 = _7_func3_c;
                _7_func3_c = (_4_16 + 16'd1);
                _6_func3_d = (_4_16 ^ _func3_b);
             end
            else
             begin
                _6_func3_d = (_6_func3_d + 16'd1);
                _6_func3_e = ((_7_func3_c + _6_func3_d) ? _7_func3_c : 16'd1);
             end
         end
        _6_func3_d = 16'd1;
        _6_16 = (param_func3_c != 16'd3);
        _5_1 = (param_func3_a < _func3_b) && (((param_func3_a + _func3_b) ^ _6_16)
                || ((param_func3_a - _func3_b) == 16'd0));
        _7_16 = _5_1;
        result_func3 = _7_16;
    end
endmodule
```

*FIG._4B*

```
int sum1 (int n)
{
    int i, sum = 0;
    for (i = 0; i < n; i ++)
        sum += i;
    return sum;
} int sum2 (int array [], int size)
{
    int i, sum = 0;
    for (i = 0; i < size; i ++)
        sum += array [i];
    return sum;
} int main ()
{
    int i;
    int array [10];
    int size = sizeof (array) / sizeof (*array);
    for (i = 0; i < size; i++)
        array [i] = i * 2;
    return sum1 (size) + sum2 (array, size);
}
```

FIG._5A

```
`define _5_main_array 4'h1 module RAM32X1 (O, D, WE, A4, A3, A2, A1, A0);
/* synthesis black_box xc_alias="RAM" */
    input       D, WE, A4, A3, A2, A1, A0;
    output      O;
    reg [31:0]  d;
    wire [4:0]  A = { A4, A3, A2, A1, A0 };
    assign      O = d [A];
    always @(A or D or WE)
        if (WE)
            d [A] = D;
endmodule module RAM32x1 (a, d, o, we);
    input [4:0]  a;
    input        d, we;
    output       o;
    RAM32X1 RAM32X1 (o, d, we, a [4], a [3], a [2], a [1], a [0]);
endmodule module RAM32x16 (a, d, o, we);
    input          we;
    input [4:0]    a;
    input [15:0]   d;
    output [15:0]  o;
    RAM32x1 U0  (a, d [ 0], o [ 0], we);
    RAM32x1 U1  (a, d [ 1], o [ 1], we);
    RAM32x1 U2  (a, d [ 2], o [ 2], we);
    RAM32x1 U3  (a, d [ 3], o [ 3], we);
    RAM32x1 U4  (a, d [ 4], o [ 4], we);
    RAM32x1 U5  (a, d [ 5], o [ 5], we);
    RAM32x1 U6  (a, d [ 6], o [ 6], we);
    RAM32x1 U7  (a, d [ 7], o [ 7], we);
    RAM32x1 U8  (a, d [ 8], o [ 8], we);
    RAM32x1 U9  (a, d [ 9], o [ 9], we);
    RAM32x1 U10 (a, d [10], o [10], we);
    RAM32x1 U11 (a, d [11], o [11], we);
    RAM32x1 U12 (a, d [12], o [12], we);
    RAM32x1 U13 (a, d [13], o [13], we);
    RAM32x1 U14 (a, d [14], o [14], we);
    RAM32x1 U15 (a, d [15], o [15], we);
endmodule module RAM11x16 (a, d, o, we);
    input          we;
    input [ 3:0]   a;
    input [15:0]   d;
    output [15:0]  o;
    RAM32x16 U ({ 1'b0, a }, d, o, we);
endmodule
```

FIG._5B1

```verilog
module for1 (clock, reset, result_sum1, result_sum2, result_main,
        param_sum1_n, param_sum2_array, param_sum2_size, run_sum1,
        ready_sum1, run_sum2, ready_sum2, run_main, ready_main);

input         clock, reset, run_sum1, run_sum2, run_main;
    input  [15:0] param_sum1_n, param_sum2_array, param_sum2_size;
    output        ready_sum1, ready_sum2, ready_main;
    output [15:0] result_sum1, result_sum2, result_main;
    reg    [15:0] result_sum1, result_sum2, result_main;
    reg           ready_sum1, ready_sum2, ready_main, we;
    wire   [15:0] o, d;
    reg    [ 3:0] state, a, return_state_sum1, return_state_sum2;
    reg    [15:0] _sum1_n, _2_sum1_i, _2_sum1_sum, _sum2_array, _sum2_size;
    reg    [15:0] _4_sum2_i, _4_sum2_sum, _5_main_i, _5_main_size, _5_16, _8_16;
    reg    [16:0] _1_17, _2_17, _3_17, _4_17, _6_17, _7_17;

RAM11x16 m (a, d, o, we);
    parameter _sum1 = 1, _sum2 = 5;

always @(posedge clock)
    begin
      if (reset)
      begin
          we = 0;
          state = 0;
      end
      else
      begin
        case (state)
        0: begin
          if (run_sum1)
          begin
            ready_sum1 = 0;
            return_state_sum1 = 0;
            _sum1_n = param_sum1_n;
            state = _sum1;
          end
          else if (run_sum2)
          begin
            ready_sum2 = 0;
            return_state_sum2 = 0;
            _sum2_array = param_sum2_array;
            _sum2_size = param_sum2_size;
            state = _sum2;
          end
          else if (run_main)
          begin
            ready_main = 0;
            _5_main_size = 16'd10;
            _5_main_i = 16'd0;
            state = 9;
          end
        end
```

*FIG._5B2*

```
_sum1: begin
    _2_sum1_sum = 16'd0;
    _2_sum1_i = 16'd0;
    state = 2;
    end
2: begin
    _1_17 = { ~ _2_sum1_i [15], _2_sum1_i };
    _2_17 = { ~ _sum1_n [15], _sum1_n };
    state = (_1_17 < _2_17) ? 3 : 4;
    end
3: begin
    _2_sum1_sum = (_2_sum1_sum + _2_sum1_i);
    _2_sum1_i = (_2_sum1_i + 16'd1);
    state = 2;
    end
4: begin
    result_sum1 = _2_sum1_sum;
    ready_sum1 = 1;
    state = return_state_sum1;
    end
sum2: begin
    _4_sum2_sum = 16'd0;
    _4_sum2_i = 16'd0;
    state = 6;
    end
6: begin
    _3_17 = { ~ _4_sum2_i [15], _4_sum2_i };
    _4_17 = { ~ _sum2_size [15], _sum2_size };
    state = (_3_17 < _4_17) ? 7 : 8;
    end
7: begin
    a = (_sum2_array + _4_sum2_i);
    state = 12;
    end
12: begin
    _5_16 = o;
    _4_sum2_sum = (_4_sum2_sum + _5_16);
    _4_sum2_i = (_4_sum2_i + 16'd1);
    state = 6;
    end
8: begin
    result_sum2 = _4_sum2_sum;
    ready_sum2 = 1;
    state = return_state_sum2;
    end
9: begin
    _6_17 = { ~ _5_main_i [15], _5_main_i };
    _7_17 = { ~ _5_main_size [15], _5_main_size };
    state = (_6_17 < _7_17) ? 10 : 11;
    end
```

FIG._5B3

```
10: begin
    _8_16 = (_5_main_i << 1'd1);
    a = (_5_main_array + _5_main_i);
    d = _8_16;
    we = 1;
    state = 13;
end
13: begin
    we = 0;
    _5_main_i = (_5_main_i + 16'd1);
    state = 9;
end
11: begin
    _sum1_n = _5_main_size;
    return_state_sum1 = 14;
    state = _sum1;
end
14: begin
    _sum2_array = `_5_main_array;
    _sum2_size = _5_main_size;
    return_state_sum2 = 15;
    state = _sum2;
end
15: begin
    result_main = (result_sum1 + result_sum2);
    ready_main = 1;
    state = 0;
end
default: ;
    endcase
    end
end
endmodule
```

FIG._5B4

```
include <stdio.h> void main ()
{
   int a, b;
   scanf ("%d %d", & a, & b);
   printf ("a + b = %d\n", a + b);
}
```

FIG._6A

```
module Printf (clock, scanf_0_1_line_19_a, scanf_0_2_line_19_b, printf_1_1_line_20, run_main);
   input       clock, run_main;
   input [15:0] scanf_0_1_line_19_a, scanf_0_2_line_19_b;
   output [15:0] printf_1_1_line_20;
   reg   [15:0] printf_1_1_line_20, _3_main_a, _3_main_b;

always @(posedge clock)
     begin
       if (run_main)
       begin
         _3_main_a = scanf_0_1_line_19_a;
         _3_main_b = scanf_0_2_line_19_b;
         printf_1_1_line_20 = (_3_main_a + _3_main_b);

// User Verilog code
         $write ("a + b = %d\n", printf_1_1_line_20);
         // End of user Verilog code
       end
     end
endmodule
```

FIG._6B

```
int func (a, b, c, d)
{
    return (a / b + c / d);
}
```

FIG._7A

```
module udivmod16 (a, b, div, mod);
    input  [15:0]  a, b;
    output [15:0]  div, mod;
    reg    [15:0]  div, mod, pa0, pa1, pa2, pa3, pa4, pa5, pa6, pa7, pa8, pa9, pa10, pa11, pa12,
                   pa13, pa14, pa15, pa16, shb0;
    reg    [16:0]  shb1;
    reg    [17:0]  shb2;
    reg    [18:0]  shb3;
    reg    [19:0]  shb4;
    reg    [20:0]  shb5;
    reg    [21:0]  shb6;
    reg    [22:0]  shb7;
    reg    [23:0]  shb8;
    reg    [24:0]  shb9;
    reg    [25:0]  shb10;
    reg    [26:0]  shb11;
    reg    [27:0]  shb12;
    reg    [28:0]  shb13;
    reg    [29:0]  shb14;
    reg    [30:0]  shb15;

always @(a or b)
    begin
        pa0 = a;

shb15    = b << 15;
        div [15] = pa0 >= shb15;
        pa1      = div [15] ? pa0 - shb15 : pa0;

shb14    = b << 14;
        div [14] = pa1 >= shb14;
        pa2      = div [14] ? pa1 - shb14 : pa1;

shb13    = b << 13;
        div [13] = pa2 >= shb13;
        pa3      = div [13] ? pa2 - shb13 : pa2;
```

FIG._7B1

```
shb12   = b << 12;
div [12] = pa3 >= shb12;
pa4     = div [12] ? pa3 - shb12 : pa3;
shb11   = b << 11;
div [11] = pa4 >= shb11;
pa5     = div [11] ? pa4 - shb11 : pa4;
shb10   = b << 10;
div [10] = pa5 >= shb10;
pa6     = div [10] ? pa5 - shb10 : pa5;
shb9    = b << 9;
div [ 9] = pa6 >= shb9;
pa7     = div [9] ? pa6 - shb9 : pa6;
shb8    = b << 8;
div [ 8] = pa7 >= shb8;
pa8     = div [8] ? pa7 - shb8 : pa7;
shb7    = b << 7;
div [ 7] = pa8 >= shb7;
pa9     = div [7] ? pa8 - shb7 : pa8;
shb6    = b << 6;
div [ 6] = pa9 >= shb6;
pa10    = div [6] ? pa9 - shb6 : pa9;
shb5    = b << 5;
div [ 5] = pa10 >= shb5;
pa11    = div [5] ? pa10 - shb5 : pa10;
shb4    = b << 4;
div [ 4] = pa11 >= shb4;
pa12    = div [4] ? pa11 - shb4 : pa11;
shb3    = b << 3;
div [ 3] = pa12 >= shb3;
pa13    = div [3] ? pa12 - shb3 : pa12;
shb2    = b << 2;
div [ 2] = pa13 >= shb2;
pa14    = div [2] ? pa13 - shb2 : pa13;
shb1    = b << 1;
div [ 1] = pa14 >= shb1;
pa15    = div [1] ? pa14 - shb1 : pa14;
shb0    = b << 0;
div [ 0] = pa15 >= shb0;
pa16    = div [0] ? pa15 - shb0 : pa15;
mod = pa16;
   end
endmodule
```

FIG._7B2

```
module sdivmod16 (a, b, div, mod);

input  [15:0]  a, b;
    output [15:0]  div, mod;

wire [15:0]  ua = a [15] ? - a : a;
    wire [15:0]  ub = b [15] ? - b : b;
    wire [15:0]  udiv, umod;

udivmod16 udivmod (ua, ub, udiv, umod);

wire [15:0]  div = (a [15] != b [15]) ? - udiv : udiv;
    wire [15:0]  mod = a [15] ? - umod : umod;

endmodule module DivEx (clock,reset,result_func,param_func_a,param_func_b,
              param_func_c,param_func_d,run_func,ready_func);

input         clock, reset, run_func;
    input  [15:0] param_func_a, param_func_b, param_func_c, param_func_d;
    output        ready_func;
    output [15:0] result_func;

reg  [15:0]  result_func, divmod_a, divmod_b, _1_16, _2_16;
    reg          ready_func;
    reg  [ 1:0]  state;
    wire [15:0]  div_result;

sdivmod16 sdivmod (divmod_a, divmod_b, div_result, );

always @(posedge clock)
    begin
      if (reset)
        state = 0;
      else
      begin
        case (state)

0: begin
            if (run_func)
            begin
              ready_func = 0;
              divmod_a = param_func_a;
              divmod_b = param_func_b;
              state = 1;
            end
          end
```

FIG._7B3

```
1: begin
    _1_16 = div_result;
    divmod_a = param_func_c;
    divmod_b = param_func_d;
     state = 2;
end 2: begin
    _2_16 = div_result;
    result_func = (_1_16 + _2_16);
    ready_func = 1;
     state = 0;
end default: ;

endcase
  end
end endmodule
```

FIG._7B4

```
int data_in;
int out1;
int out2;
int data_out;

void pipeline_stage_1 ()
{
   out1 = data_in + 1;
} void pipeline_stage_2 ()
{
   out2 = out1 + out1;
} void pipeline_stage_3 ()
{
   data_out = out2 ^ 1234;
} ifndef __SYNETRY__
include <stdio.h> void main ()
{
   for (;;)
   {
      scanf ("%d", & data_in);

pipeline_stage_1 ();
      pipeline_stage_2 ();
      pipeline_stage_3 ();

printf ("%d", data_out);
   }
}
endif
```

*FIG._8A*

```
module Pipeline (clock, _data_in, _data_out, run_pipeline_stage_1,run_pipeline_stage_2,
run_pipeline_stage_3);
    input       clock, run_pipeline_stage_1, run_pipeline_stage_2, run_pipeline_stage_3;
    input  [15:0] _data_in;
    output [15:0] _data_out;
    reg    [15:0] _data_out, _out1, _out2;

always @(posedge clock)
  begin
    if (run_pipeline_stage_1)
       _out1 = (_data_in + 16'd1);
  end always @(posedge clock)
  begin
    if (run_pipeline_stage_2)
       _out2 = (_out1 + _out1);
  end always @(posedge clock)
  begin
    if (run_pipeline_stage_3)
       _data_out = (_out2 ^ 16'd1234);
  end
endmodule
```

FIG._8B

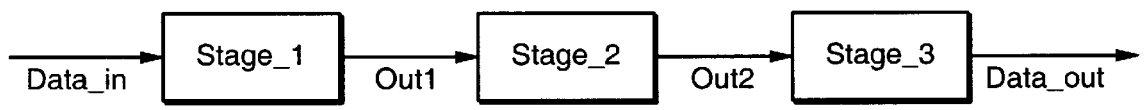

FIG._8C

```
int func (float a, double b, long double c, int i)
{
    return - a + b * c - 16.5 / c;
}
```

FIG._9A

```
module Float (clock,reset,zero_substractor_float_operand,
    zero_substractor_float_run,zero_substractor_float_ready,zero_substractor_float_result,
    convertor_from_float_to_long_double_operand,convertor_from_float_to_long_double_run,
    convertor_from_float_to_long_double_ready,convertor_from_float_to_long_double_result,
    convertor_from_double_to_long_double_operand,convertor_from_double_to_long_double_run,
    convertor_from_double_to_long_double_ready,convertor_from_double_to_long_double_result,
    multiplier_long_double_a,multiplier_long_double_b,multiplier_long_double_run,
    multiplier_long_double_ready,multiplier_long_double_result,adder_long_double_a,
    adder_long_double_b,adder_long_double_run, adder_long_double_ready,adder_long_double_result,
    divider_long_double_a,divider_long_double_b,divider_long_double_run,
    divider_long_double_ready,divider_long_double_result,substractor_long_double_a,
    substractor_long_double_b,substractor_long_double_run,substractor_long_double_ready,
    substractor_long_double_result,convertor_from_long_double_to_signed_16_operand,
    convertor_from_long_double_to_signed_16_run,convertor_from_long_double_to_signed_16_ready,con
    vertor_from_long_double_to_signed_16_result, result_func,param_func_a,param_func_b,
    param_func_c,param_func_i,run_func,ready_func);
```

| | | |
|---|---|---|
| input | | clock, reset, zero_substractor_float_ready, convertor_from_float_to_long_double_ready, convertor_from_double_to_long_double_ready, multiplier_long_double_ready, adder_long_double_ready, divider_long_double_ready, substractor_long_double_ready, convertor_from_long_double_to_signed_16_ready, run_func; |
| input | [15:0] | convertor_from_long_double_to_signed_16_result, param_func_i; |
| input | [31:0] | zero_substractor_float_result, param_func_a; |
| input | [63:0] | param_func_b; |
| input | [79:0] | convertor_from_float_to_long_double_result, param_func_c, convertor_from_double_to_long_double_result, multiplier_long_double_ready, adder_long_double_result, divider_long_double_result, substractor_long_double_result; |
| output | | zero_substractor_float_run, convertor_from_float_to_long_double_run, convertor_from_double_to_long_double_run, multiplier_long_double_run, adder_long_double_run, divider_long_double_run, substractor_long_double_run, convertor_from_long_double_to_signed_16_run, ready_func; |
| output | [15:0] | result_func; |
| output | [31:0] | zero_substractor_float_operand, convertor_from_float_to_long_double_operand; |
| output | [63:0] | convertor_from_double_to_long_double_operand; |
| output | [79:0] | multiplier_long_double_a, multiplier_long_double_b, adder_long_double_a, adder_long_double_b, divider_long_double_a, divider_long_double_b, substractor_long_double_a, substractor_long_double_b, convertor_from_long_double_to_signed_16_operand; |

FIG._9B1

```
reg           zero_substractor_float_run, convertor_from_float_to_long_double_run,
              convertor_from_double_to_long_double_run, multiplier_long_double_run,
              adder_long_double_run, divider_long_double_run, substractor_long_double_run,
              convertor_from_long_double_to_signed_16_run, ready_func;
reg   [ 4:0]  state;
reg   [15:0]  result_func, _8_16;
reg   [31:0]  zero_substractor_float_operand, convertor_from_float_to_long_double_operand, _1_32;
reg   [63:0]  convertor_from_double_to_long_double_operand;
reg   [79:0]  multiplier_long_double_a, multiplier_long_double_b, adder_long_double_a,
              adder_long_double_b, divider_long_double_a, divider_long_double_b,
              substractor_long_double_a, substractor_long_double_b,
              convertor_from_long_double_to_signed_16_operand, 2_80, _3_80, _4_80, _5_80,
              _6_80, _7_80;
always @(posedge clock)
  begin
    if (reset)
      state = 0;
    else
    begin
      case (state)
        0: begin
          if (run_func)
          begin
            ready_func = 0;
            zero_substractor_float_operand = param_func_a;
            zero_substractor_float_run = 1;
            state = 1;
          end
        end 1: begin
          zero_substractor_float_run = 0;
          _1_32 = zero_substractor_float_result;
          if (zero_substractor_float_ready)
            state = 2;
        end 2: begin
          convertor_from_float_to_long_double_operand = _1_32;
          convertor_from_float_to_long_double_run = 1;
          state = 3;
        end 3: begin
          convertor_from_float_to_long_double_run = 0;
          _2_80 = convertor_from_float_to_long_double_result;
          if (convertor_from_float_to_long_double_ready)
            state = 4;
        end
```

*FIG._9B2*

```
4: begin
     convertor_from_double_to_long_double_operand = param_func_b;
     convertor_from_double_to_long_double_run = 1;
     state = 5;
   end
5: begin
     convertor_from_double_to_long_double_run = 0;
     _3_80 = convertor_from_double_to_long_double_result;
     if (convertor_from_double_to_long_double_ready)
        state = 6;
   end
6: begin
     multiplier_long_double_a = _3_80;
     multiplier_long_double_b = param_func_c;
     multiplier_long_double_run = 1;
     state = 7;
   end
7: begin
     multiplier_long_double_run = 0;
     _4_80 = multiplier_long_double_result;
     if (multiplier_long_double_ready)
        state = 8;
   end
8: begin
     adder_long_double_a = _2_80;
     adder_long_double_b = _4_80;
     adder_long_double_run = 1;
     state = 9;
   end
9: begin
     adder_long_double_run = 0;
     _5_80 = adder_long_double_result;
     if (adder_long_double_ready)
        state = 10;
   end
10: begin
      divider_long_double_a = 80'h00000000000803040;
      divider_long_double_b = param_func_c;
      divider_long_double_run = 1;
      state = 11;
    end
11: begin
      divider_long_double_run = 0;
      _6_80 = divider_long_double_result;
      if (divider_long_double_ready)
         state = 12;
    end
```

FIG._9B3

```
12: begin
     substractor_long_double_a = _5_80;
     substractor_long_double_b = _6_80;
     substractor_long_double_run = 1;
     state = 13;
   end
13: begin
     substractor_long_double_run = 0;
     _7_80 = substractor_long_double_result;
     if (substractor_long_double_ready)
        state = 14;
   end 14: begin
     convertor_from_long_double_to_signed_16_operand = _7_80;
     convertor_from_long_double_to_signed_16_run = 1;
     state = 15;
   end 15: begin
     convertor_from_long_double_to_signed_16_run = 0;
     _8_16 = convertor_from_long_double_to_signed_16_result;
     if (convertor_from_long_double_to_signed_16_ready)
        state = 16;
   end 16: begin
     result_func = _8_16;
     ready_func = 1;
     state = 0;
   end default: ;
   endcase
  end
 end endmodule
```

FIG._9B4

```
typedef struct
{
    int real;
    int image;
}
Complex;

Complex add (Complex a, Complex b)
{
    Complex c;
    c.real  = a.real  + b.real;
    c.image = a.image + b.image;
    return c;
}

Complex x = { 1, 2 }, y = { 3, 4 }, z;

void main ()
{
    z = add (x, add (x, y));
}
```

FIG._10A

```
`define _add_a    4'h1
`define _add_b    4'h3
`define _3_add_c  4'h5
`define _x        4'h7
`define _y        4'h9
`define _z        4'hB
```

```verilog
module Complex (clock, reset, a, d, o, we, result_add, param_add_a,
                param_add_b, run_add, ready_add, run_main, ready_main);
    input          clock, reset, run_add, run_main;
    input  [15:0]  o;
    input  [31:0]  param_add_a, param_add_b;

output         we, ready_add, ready_main;
    output [ 3:0]  a;
    output [15:0]  d;
    output [31:0]  result_add;

reg            we, ready_add, ready_main;
    reg    [ 3:0]  a;
    reg    [ 4:0]  state, return_state_add;
    reg    [15:0]  d, _1_16, _2_16, _3_16, _4_16, _5_16, _6_16;
    reg    [31:0]  result_add, _7_32, _8_32, _9_32, _10_32;

parameter _add = 1;

always @(posedge clock)
    begin
        if (reset)
        begin
            we = 0;
            state = 0;
        end
        else
        begin
            case (state)
            0: begin
                if (run_add)
                begin
                    ready_add = 0;
                    return_state_add = 0;
                    a = `_add_a;
                    d = param_add_a [31:16];
                    we = 1;
                    state = 2;
                end
                else if (run_main)
                begin
                    ready_main = 0;
                    a = `_x;
                    state = 14;
                end
            end
```

FIG._10B1

```
2: begin
       we = 0;
       a = `_add_a + 4'd1;
       d = param_add_a [15:0];
       we = 1;
       state = 3;
   end 3: begin
       we = 0;
       a = `_add_b;
       d = param_add_b [31:16];
       we = 1;
       state = 4;
   end 4: begin
       we = 0;
       a = `_add_b + 4'd1;
       d = param_add_b [15:0];
       we = 1;
       state = 5;
   end 5: begin
       we = 0;
       state = _add;
   end _add: begin
       a = `_add_a;
       state = 6;
   end 6: begin
       _1_16 = o;
       a = `_add_b;
       state = 7;
   end 7: begin
       _2_16 = o;
       _3_16 = (_1_16 + _2_16);
       a = `_3_add_c;
       d = _3_16;
       we = 1;
       state = 8;
   end 8: begin
       we = 0;
       a = (`_add_a + 16'd1);
       state = 9;
   end
```

FIG._10B2

```
9: begin
     _4_16 = o;
     a = (`_add_b + 16'd1);
     state = 10;
   end 10: begin
     _5_16 = o;
     _6_16 = (_4_16 + _5_16);
     a = (`_3_add_c + 16'd1);
     d = _6_16;
     we = 1;
     state = 11;
   end 11: begin
     we = 0;
     a = `_3_add_c;
     state = 12;
   end 12: begin
     _7_32 [31:16] = o;
     a = `_3_add_c + 4'd1;
     state = 13;
   end 13: begin
     _7_32 [15:0] = o;
     result_add = _7_32;
     ready_add = 1;
     state = return_state_add;
   end 14: begin
     _8_32 [31:16] = o;
     a = `_x + 4'd1;
     state = 15;
   end 15: begin
     _8_32 [15:0] = o;
     a = `_add_a;
     d = _8_32 [31:16];
     we = 1;
     state = 16;
   end 16: begin
     we = 0;
     a = `_add_a + 4'd1;
     d = _8_32 [15:0];
     we = 1;
     state = 17;
   end
```

FIG._10B3

```
17: begin
        we = 0;
        a = `_x;
        state = 18;
    end

18: begin
        _9_32 [31:16] = o;
        a = `_x + 4'd1;
        state = 19;
    end 19: begin
        _9_32 [15:0] = o;
        a = `_add_a;
        d = _9_32 [31:16];
        we = 1;
        state = 20;
    end 20: begin
        we = 0;
        a = `_add_a + 4'd1;
        d = _9_32 [15:0];
        we = 1;
        state = 21;
    end 21: begin
        we = 0;
        a = `_y;
        state = 22;
    end 22: begin
        _10_32 [31:16] = o;
        a = `_y + 4'd1;
        state = 23;
    end 23: begin
        _10_32 [15:0] = o;
        a = `_add_b;
        d = _10_32 [31:16];
        we = 1;
        state = 24;
    end 24: begin
        we = 0;
        a = `_add_b + 4'd1;
        d = _10_32 [15:0];
        we = 1;
        state = 25;
    end
```

FIG._10B4

```
25: begin
        we = 0;
        return_state_add = 26;
        state = _add;
    end
26: begin
        a = `_add_b;
        d = result_add [31:16];
        we = 1;
        state = 27;
    end
27: begin
        we = 0;
        a = `_add_b + 4'd1;
        d = result_add [15:0];
        we = 1;
        state = 28;
    end
28: begin
        we = 0;
        return_state_add = 29;
        state = _add;
    end
29: begin
        a = `_z;
        d = result_add [31:16];
        we = 1;
        state = 30;
    end
30: begin
        we = 0;
        a = `_z + 4'd1;
        d = result_add [15:0];
        we = 1;
        state = 31;
    end
31: begin
        we = 0;
        ready_main = 1;
        state = 0;
    end
    default: ;
        endcase
    end
end
endmodule
```

FIG._10B5

```c
#ifndef __SYNETRY__
#include <assert.h>
#include <stdio.h>
#include <stdlib.h>
#else
#define NULL ((NODE *) 0)
#define assert(a)
#endif
#define MAX_NODES 10
struct _Node
{   struct _Node * pLeft;
    struct _Node * pRight;
    int       nKey;
    int       nValue;
};
typedef struct _Node NODE;
static NODE Nodes [MAX_NODES];
static int  nNodes;
NODE * pTree;
void Initialize (void)
{   nNodes = 0;
    pTree  = NULL;
}
static NODE * NewNode (int nKey, int nValue)
{   assert (nNodes >= 0 && nNodes <= MAX_NODES);
    if (nNodes == MAX_NODES)
        return NULL;
    Nodes [nNodes].pLeft  = NULL;
    Nodes [nNodes].pRight = NULL;
    Nodes [nNodes].nKey   = nKey;
    Nodes [nNodes].nValue = nValue;
    return & Nodes [nNodes++];
}

NODE * FindNode (int nKey)
{   NODE * p;
    p = pTree;
    while (p != NULL)
    {
        if (p -> nKey < nKey)
            p = p -> pLeft;
        else if (p -> nKey > nKey)
            p = p -> pRight;
        else
            return p;
    }
    return NULL;
}
int FindValue (int nKey)
{   NODE * p;
    return (p = FindNode (nKey)) == NULL ? -1 : p -> nValue;
}
```

*FIG._11A1*

```
NODE * FindOrAddNode (nKey, nValue)
int nKey;
int nValue;
{   NODE * * p;
    p = & pTree;
    while (*p != NULL)
    {    if ((*p) -> nKey < nKey)
            p = & (*p) -> pLeft;
        else if ((*p) -> nKey > nKey)
            p = & (*p) -> pRight;
        else
            return (*p);
    }
    return *p = NewNode (nKey, nValue);
}
int FindOrAddValue (nKey, nValue)
int nKey;
int nValue;
{   NODE * p = FindOrAddNode (nKey, nValue);
    return p == NULL ? -1 : p -> nValue;
}
ifndef __SYNETRY__
void PrintTree (int nLevel, NODE * p)
{   if (p == NULL)
        return;
    PrintTree (nLevel + 1, p -> pLeft);
    printf ("%*s%d [%d]\n", nLevel * 4, "", p -> nKey, p -> nValue);
    PrintTree (nLevel + 1, p -> pRight);
} void main ()
{   int anKeys [20]
        = { 12, 4, 7, 2, 18, 24, 0, 5, 14, 1, 43, 6, 19, 21, 26, 11, 37, 8, 4, 9};
    int i;

Initialize ();
    for (i = 0; i < 20; i++)
        FindOrAddValue (anKeys [i], i);
    for (i = 0; i < 20; i++)
        printf ("%d: %d\n", i, FindValue (i));
    printf ("\nTree:\n");
    PrintTree (0, pTree);
}
endif
```

FIG._11A2

```
`define _Nodes  6'h1
`define _pTree  6'h29 module Tree ( clock, reset, a, d, o, we, result_FindNode, result_FindValue, result_FindOrAddNode,
              result_FindOrAddValue, param_FindNode_nKey, param_FindValue_nKey,
              param_FindOrAddNode_nKey, param_FindOrAddNode_nValue,
              param_FindOrAddValue_nKey, param_FindOrAddValue_nValue,
              run_Initialize, ready_Initialize, run_FindNode, ready_FindNode,
              run_FindValue, ready_FindValue, run_FindOrAddNode,
              ready_FindOrAddNode, run_FindOrAddValue, ready_FindOrAddValue );
  input           clock, reset, run_Initialize, run_FindNode, run_FindValue, run_FindOrAddNode,
                  run_FindOrAddValue;
  input  [15:0]   o, param_FindNode_nKey, param_FindValue_nKey, param_FindOrAddNode_nKey,
                  param_FindOrAddNode_nValue, param_FindOrAddValue_nKey,
                  param_FindOrAddValue_nValue;
  output          we, ready_Initialize, ready_FindNode, ready_FindValue, ready_FindOrAddNode,
                  ready_FindOrAddValue;
  output [ 5:0]   a, result_FindNode, result_FindOrAddNode, d, result_FindValue, result_FindOrAddValue;
  reg             we, ready_Initialize, ready_FindNode, ready_FindValue, ready_FindOrAddNode,
                  ready_FindOrAddValue;
  reg    [ 5:0]   a, result_FindNode, result_FindOrAddNode, d, result_FindValue, result_FindOrAddValue,
                  state, result_NewNode, _7_FindNode_p, _10_FindValue_p, _13_FindOrAddNode_p,
                  _17_FindOrAddValue_p, return_state_NewNode, return_state_FindNode,
                  return_state_FindOrAddNode, _1_6, _2_6, _3_6, _4_6, _5_6, _6_6, _7_6, _8_6, _9_6,
                  _10_6, _12_6, _13_6, _14_6, _18_6, _22_6, _23_6, _24_6, _27_6, _28_6, _29_6,
                  _33_6, _34_6, _38_6, _39_6, _40_6;
  reg    [15:0]   _nNodes, _NewNode_nKey, _NewNode_nValue, _FindNode_nKey,
                  _FindOrAddNode_nKey, _FindOrAddNode_nValue, _30_16, _35_16, _11_16, _15_16,
                  _19_16, _25_16, _26_16, _41_16, _42_16;
  reg    [16:0]   _16_17, _17_17, _20_17, _21_17, _31_17, _32_17, _36_17, _37_17;

parameter    _NewNode        = 1,
               _FindNode       = 5,
               _FindOrAddNode  = 14;

always @(posedge clock)
  begin
    if (reset)
    begin
      we = 0;
      state = 0;
    end
```

FIG._11B1

```
      else
      begin
        case (state)
          0: begin
              if (run_Initialize)
              begin
                ready_Initialize = 0;
                _nNodes = 16'd0;
                _1_6 = 16'd0;
                a = `_pTree;
                d [15:10] = _1_6;
                we = 1;
                state = 23;
              end
              else if (run_FindNode)
              begin
                ready_FindNode = 0;
                return_state_FindNode = 0;
                _FindNode_nKey = param_FindNode_nKey;
                state = _FindNode;
              end
              else if (run_FindValue)
              begin
                ready_FindValue = 0;
                _FindNode_nKey = param_FindValue_nKey;
                return_state_FindNode = 33;
                state = _FindNode;
              end
              else if (run_FindOrAddNode)
              begin
                ready_FindOrAddNode = 0;
                return_state_FindOrAddNode = 0;
                _FindOrAddNode_nKey = param_FindOrAddNode_nKey;
                _FindOrAddNode_nValue = param_FindOrAddNode_nValue;
                state = _FindOrAddNode;
              end
              else if (run_FindOrAddValue)
              begin
                ready_FindOrAddValue = 0;
                _FindOrAddNode_nKey = param_FindOrAddValue_nKey;
                _FindOrAddNode_nValue = param_FindOrAddValue_nValue;
                return_state_FindOrAddNode = 48;
                state = _FindOrAddNode;
              end
          end
          23: begin
              we = 0;
              ready_Initialize = 1;
              state = 0;
          end
        _NewNode: state = (_nNodes == 16'd10) ? 2 : 3;
```

FIG._11B2

```
2: begin
     _2_6 = 16'd0;
     result_NewNode = _2_6;
     state = 4;
   end 3: begin
     _3_6 = 16'd0;
     _4_6 = (_nNodes << 2'd2);
     _5_6 = _3_6;
     a = (`_Nodes + _4_6);
     d [15:10] = _5_6;
     we = 1;
     state = 24;
   end 24: begin
      we = 0;
      _6_6 = 16'd0;
      _7_6 = (_nNodes << 2'd2);
      _8_6 = _6_6;
      a = ((`_Nodes + _7_6) + 6'd1);
      d [15:10] = _8_6;
      we = 1;
      state = 25;
    end 25: begin
      we = 0;
      _9_6 = (_nNodes << 2'd2);
      a = ((`_Nodes + _9_6) + 6'd2);
      d = _NewNode_nKey;
      we = 1;
      state = 26;
    end 26: begin
      we = 0;
      _10_6 = (_nNodes << 2'd2);
      a = ((`_Nodes + _10_6) + 6'd3);
      d = _NewNode_nValue;
      we = 1;
      state = 27;
    end 27: begin
      we = 0;
      _11_16 = _nNodes;
      _nNodes = (_11_16 + 16'd1);
      _12_6 = (_11_16 << 2'd2);
      result_NewNode = (`_Nodes + _12_6);
      state = 4;
    end
```

*FIG._11B3*

```
     4: state = return_state_NewNode;
FindNode: begin
        a = `_pTree;
        state = 28;
     end 28: begin
        _13_6 = o [15:10];
        _7_FindNode_p = _13_6;
        state = 6;
     end 6: begin
        _14_6 = 16'd0;
        state = (_7_FindNode_p != _14_6) ? 7 : 12;
     end 7: begin
        a = (_7_FindNode_p + 6'd2);
        state = 29;
     end 29: begin
        _15_16 = o;
        _16_17 = { ~ _15_16 [15], _15_16 };
        _17_17 = { ~ _FindNode_nKey [15], _FindNode_nKey };
        state = (_16_17 < _17_17) ? 8 : 9;
     end 8: begin
        a = _7_FindNode_p;
        state = 30;
     end 30: begin
        _18_6 = o [15:10];
        _7_FindNode_p = _18_6;
        state = 6;
     end 9: begin
        a = (_7_FindNode_p + 6'd2);
        state = 31;
     end 31: begin
        _19_16 = o;
        _20_17 = { ~ _19_16 [15], _19_16 };
        _21_17 = { ~ _FindNode_nKey [15], _FindNode_nKey };
        state = (_20_17 > _21_17) ? 10 : 11;
     end 10: begin
        a = (_7_FindNode_p + 6'd1);
        state = 32;
     end
```

FIG._11B4

```
32: begin
    _22_6 = o [15:10];
    _7_FindNode_p = _22_6;
    state = 6;
end 11: begin
    result_FindNode = _7_FindNode_p;
    state = 13;
end 12: begin
    _23_6 = 16'd0;
    result_FindNode = _23_6;
    state = 13;
end 13: begin
    ready_FindNode = 1;
    state = return_state_FindNode;
end 33: begin
    _10_FindValue_p = result_FindNode;
    _24_6 = 16'd0;
    state = (result_FindNode == _24_6) ? 34 : 35;
end 34: begin
    _25_16 = -16'd1;
    state = 36;
end 35: begin
    a = (_10_FindValue_p + 6'd3);
    state = 37;
end 37: begin
    _26_16 = o;
    _25_16 = _26_16;
    state = 36;
end 36: begin
    result_FindValue = _25_16;
    ready_FindValue = 1;
    state = 0;
end
```

FIG._11B5

```
_FindOrAddNode: begin
    _13_FindOrAddNode_p = `_pTree;
    state = 15;
end 15: begin
    a = _13_FindOrAddNode_p;
    state = 38;
end 38: begin
    _27_6 = o [15:10];
    _28_6 = 16'd0;
    state = (_27_6 != _28_6) ? 16 : 21;
end 16: begin
    a = _13_FindOrAddNode_p;
    state = 39;
end 39: begin
    _29_6 = o [15:10];
    a = (_29_6 + 6'd2);
    state = 40;
end 40: begin
    _30_16 = o;
    _31_17 = { ~ _30_16 [15], _30_16 };
    _32_17 = { ~ _FindOrAddNode_nKey [15], _FindOrAddNode_nKey };
    state = (_31_17 < _32_17) ? 17 : 18;
end 17: begin
    a = _13_FindOrAddNode_p;
    state = 41;
end 41: begin
    _33_6 = o [15:10];
    _13_FindOrAddNode_p = _33_6;
    state = 15;
end 18: begin
    a = _13_FindOrAddNode_p;
    state = 42;
end 42: begin
    _34_6 = o [15:10];
    a = (_34_6 + 6'd2);
    state = 43;
end
```

*FIG._11B6*

```
43: begin
    _35_16 = o;
    _36_17 = { ~ _35_16 [15], _35_16 };
    _37_17 = { ~ _FindOrAddNode_nKey [15], _FindOrAddNode_nKey };
    state = (_36_17 > _37_17) ? 19 : 20;
end 19: begin
    a = _13_FindOrAddNode_p;
    state = 44;
end 44: begin
    _38_6 = o [15:10];
    _13_FindOrAddNode_p = (_38_6 + 6'd1);
    state = 15;
end 20: begin
    a = _13_FindOrAddNode_p;
    state = 45;
end 45: begin
    _39_6 = o [15:10];
    result_FindOrAddNode = _39_6;
    state = 22;
end 21: begin
    _NewNode_nKey = _FindOrAddNode_nKey;
    _NewNode_nValue = _FindOrAddNode_nValue;
    return_state_NewNode = 46;
    state = _NewNode;
end 46: begin
    a = _13_FindOrAddNode_p;
    d [15:10] = result_NewNode;
    we = 1;
    state = 47;
end 47: begin
    we = 0;
    result_FindOrAddNode = result_NewNode;
    state = 22;
end
```

FIG._11B7

```
22: begin
    ready_FindOrAddNode = 1;
    state = return_state_FindOrAddNode;
  end 48: begin
    _17_FindOrAddValue_p = result_FindOrAddNode;
    _40_6 = 16'd0;
    state = (_17_FindOrAddValue_p == _40_6) ? 49 : 50;
  end 49: begin
    _41_16 = -16'd1;
    state = 51;
  end 50: begin
    a = (_17_FindOrAddValue_p + 6'd3);
    state = 52;
  end 52: begin
    _42_16 = o;
    _41_16 = _42_16;
    state = 51;
  end 51: begin
    result_FindOrAddValue = _41_16;
    ready_FindOrAddValue = 1;
    state = 0;
  end default: ;
  endcase
  end
end endmodule
```

FIG._11B8

```
include <stdio.h>
int event_occured = 0;
pragma synchronous on_event void on_event ()
{
   event_occured = 1;
} void main ()
{
   int a, b, c;
   scanf ("%d %d", & a, & b);
   c = event_occured ? a + b : a - b;
   printf ("%d\n", c);
}
```

FIG._12A

```
module Event_sy (clock,reset,scanf_0_1_line_16_a,scanf_0_2_line_16_b,printf_1_1_line_20_c,
                 run_on_event,run_main);
   input         clock, reset, run_on_event, run_main;
   input  [15:0] scanf_0_1_line_16_a, scanf_0_2_line_16_b;
   output [15:0] printf_1_1_line_20_c;
   reg    [15:0] printf_1_1_line_20_c, _event_occured, _108_main_a, _108_main_b, _108_main_c;

always @(posedge clock)
   begin
      if (run_on_event)
         _event_occured = 16'd1;
      if (reset)
         _event_occured = 16'd0;
   end always @(posedge clock)
   begin
      if (run_main)
      begin
         _108_main_a = scanf_0_1_line_16_a;
         _108_main_b = scanf_0_2_line_16_b;
         _108_main_c = (_event_occured ? (_108_main_a + _108_main_b) :
                        (_108_main_a - _108_main_b));
         printf_1_1_line_20_c = _108_main_c;
      end
   end endmodule
```

FIG._12B

```
include <stdio.h> int event_occured = 0;
pragma asynchronous on_event
void on_event ()
{
   event_occured = 1;
} void main ()
{
   int a, b, c;
   scanf ("%d %d", & a, & b);
   c = event_occured ? a + b : a - b;
   printf ("%d\n", c);
}
```

*FIG._13A*

```
module Event_as(clock,reset,scanf_0_1_line_16_a,scanf_0_2_line_16_b,printf_1_1_line_20_c,
                run_on_event,run_main);
   input        clock, reset, run_on_event, run_main;
   input  [15:0] scanf_0_1_line_16_a, scanf_0_2_line_16_b;
   output [15:0] printf_1_1_line_20_c;
   reg    [15:0] printf_1_1_line_20_c, _event_occured, _108_main_a, _108_main_b, _108_main_c;

always @(posedge run_on_event)
   begin
      if (reset)
         _event_occured = 16'd0;
      else
         _event_occured = 16'd1;
   end always @(posedge clock)
   begin
      if (run_main)
      begin
         _108_main_a = scanf_0_1_line_16_a;
         _108_main_b = scanf_0_2_line_16_b;
         _108_main_c = (_event_occured ? (_108_main_a + _108_main_b) :
                                         (_108_main_a - _108_main_b));
         printf_1_1_line_20_c = _108_main_c;
      end
   end endmodule
```

*FIG._13B*

```
int func1 (unsigned n)
{
   unsigned i, result = 0;
   for (i = 0; i <= n; i++)
      result += i;
   return result;
} int func2 (unsigned n)
{
   unsigned i, result = 0;
   for (i = 0; i <= n; i++)
      result += i;
   return result;
}
```

*FIG._14A*

```
module Sum (clock, reset, result__func1, param__func1__n, run__func1, ready__func1, result__func2,
            param__func2__n, run__func2, ready__func2 );
   input         clock, reset, run__func1, run__func2;
   input  [15:0] param__func1__n, param__func2__n;
   output        ready__func1, ready__func2;
   output [15:0] result__func1, result__func2;
   reg           ready__func1, ready__func2;
   reg    [1:0]  state1, state2;
   reg    [15:0] result__func1, result__func2, s_2_func1_i, s_2_func1_result, s_2_func2_i,
                 s_2_func2_result;;
   always @(posedge clock)
      begin
         if (reset)
            state1 = 0;
         else
         begin
            case (state1)
            0: begin
               if (run__func1)
                  begin
                     ready__func1 = 0;
                     s_2_func1_result = 16'd0;
                     s_2_func1_i = 16'd0;
                     state1 = 1;
                  end
               end
```

*FIG._14B1*

```
        1: state1 = (s_2_func1_i <= param__func1__n) ? 2 : 3;

2: begin
             s_2_func1_result = (s_2_func1_result + s_2_func1_i);
             s_2_func1_i = (s_2_func1_i + 16'd1);
             state1 = 1;
           end 3: begin
             result__func1 = s_2_func1_result;
             ready__func1 = 1;
             state1 = 0;
           end
        endcase
      end
    end always @(posedge clock)
    begin
      if (reset)
        state2 = 0;
      else
      begin
        case (state2)
          0: begin
               if (run__func2)
                 begin
                   ready__func2 = 0;
                   s_2_func2_result = 16'd0;
                   s_2_func2_i = 16'd0;
                   state2 = 1;
                 end
             end 1: state2 = (s_2_func2_i <= param__func2__n) ? 2 : 3;

2: begin
               s_2_func2_result = (s_2_func2_result + s_2_func2_i);
               s_2_func2_i = (s_2_func2_i + 16'd1);
               state2 = 1;
             end 3: begin
               result__func2 = s_2_func2_result;
               ready__func2 = 1;
               state2 = 0;
             end
        endcase
      end
    end
endmodule
```

FIG._14B2

```c
include <stdio.h>
#include <stdarg.h>
/* Returns the average of a variable list of integers. */ static int average (int first, ...)
{
  int count = 0, sum = 0, i = first;
  va_list marker;

va_start (marker, first);    /* Initialize variable arguments. */ while (i != -1)
  {
    sum += i;
    count++;
    i = va_arg (marker, int);
  } va_end (marker);             /* Reset variable arguments.      */ return sum ? (sum / count) : 0;
} void main ()
{
  /* Call with 3 integers (-1 is used as terminator). */
  printf ("Average is: %d\n", average (2, 3, 4, -1));

/* Call with 4 integers. */
  printf ("Average is: %d\n", average (5, 7, 9, 11, -1));

/* Call with just -1 terminator. */
  printf ("Average is: %d\n", average (-1));
}
```

FIG._15A

```
`define _average_first 5'h1
module udivmod16 (a, b, div, mod);
   input  [15:0]  a, b;
   output [15:0]  div, mod;
   reg    [15:0]  div, mod, pa0, pa1, pa2, pa3, pa4, pa5, pa6, pa7, pa8, pa9, pa10,
                  pa11, pa12, pa13, pa14, pa15, pa16, shb0;
   reg    [16:0]  shb1;
   reg    [17:0]  shb2;
   reg    [18:0]  shb3;
   reg    [19:0]  shb4;
   reg    [20:0]  shb5;
   reg    [21:0]  shb6;
   reg    [22:0]  shb7;
   reg    [23:0]  shb8;
   reg    [24:0]  shb9;
   reg    [25:0]  shb10;
   reg    [26:0]  shb11;
   reg    [27:0]  shb12;
   reg    [28:0]  shb13;
   reg    [29:0]  shb14;
   reg    [30:0]  shb15;

always @(a or b)
   begin
     pa0 = a;

shb15    = b << 15;
     div [15] = pa0 >= shb15;
     pa1      = div [15] ? pa0 - shb15 : pa0;

shb14    = b << 14;
     div [14] = pa1 >= shb14;
     pa2      = div [14] ? pa1 - shb14 : pa1;

shb13    = b << 13;
     div [13] = pa2 >= shb13;
     pa3      = div [13] ? pa2 - shb13 : pa2;

shb12    = b << 12;
     div [12] = pa3 >= shb12;
     pa4      = div [12] ? pa3 - shb12 : pa3;

shb11    = b << 11;
     div [11] = pa4 >= shb11;
     pa5      = div [11] ? pa4 - shb11 : pa4;

shb10    = b << 10;
     div [10] = pa5 >= shb10;
     pa6      = div [10] ? pa5 - shb10 : pa5;

shb9     = b << 9;
     div [ 9] = pa6 >= shb9;
     pa7      = div [9] ? pa6 - shb9 : pa6;
```

FIG._15B1

```
        shb8     = b << 8;
        div [ 8] = pa7 >= shb8;
        pa8      = div [8] ? pa7 - shb8 : pa7;

shb7     = b << 7;
        div [ 7] = pa8 >= shb7;
        pa9      = div [7] ? pa8 - shb7 : pa8;

shb6     = b << 6;
        div [ 6] = pa9 >= shb6;
        pa10     = div [6] ? pa9 - shb6 : pa9;

shb5     = b << 5;
        div [ 5] = pa10 >= shb5;
        pa11     = div [5] ? pa10 - shb5 : pa10;

shb4     = b << 4;
        div [ 4] = pa11 >= shb4;
        pa12     = div [4] ? pa11 - shb4 : pa11;

shb3     = b << 3;
        div [ 3] = pa12 >= shb3;
        pa13     = div [3] ? pa12 - shb3 : pa12;

shb2     = b << 2;
        div [ 2] = pa13 >= shb2;
        pa14     = div [2] ? pa13 - shb2 : pa13;

shb1     = b << 1;
        div [ 1] = pa14 >= shb1;
        pa15     = div [1] ? pa14 - shb1 : pa14;

shb0     = b << 0;
        div [ 0] = pa15 >= shb0;
        pa16     = div [0] ? pa15 - shb0 : pa15;

mod = pa16;
    end
endmodule module sdivmod16 (a, b, div, mod);
    input  [15:0]  a, b;
    output [15:0]  div, mod;
    wire   [15:0]  ua = a [15] ? - a : a;
    wire   [15:0]  ub = b [15] ? - b : b;
    wire   [15:0]  udiv, umod;
    udivmod16 udivmod (ua, ub, udiv, umod);
    wire   [15:0]  div = (a [15] != b [15]) ? - udiv : udiv;
    wire   [15:0]  mod = a [15] ? - umod : umod;
endmodule
```

FIG._15B2

```
module RAM32X1 (O, D, WE, A4, A3, A2, A1, A0)
    /* synthesis black_box xc_alias="RAM" */ ;
    output      O;
    input       D, WE, A4, A3, A2, A1, A0;
    reg [31:0]  d;
    wire [4:0]  A = { A4, A3, A2, A1, A0 };
    assign O = d [A];
    always @(A or D or WE)
        if (WE)
            d [A] = D;
endmodule module RAM32x1 (a, d, o, we);
    input               d, we;
    input [4:0]         a;
    output              o;
    RAM32X1 RAM32X1 (o, d, we, a [4], a [3], a [2], a [1], a [0]);
endmodule module RAM32x16 (a, d, o, we);
    input           we;
    input [ 4:0]    a;
    input [15:0]    d;
    output [15:0]   o;
    RAM32x1 U0  (a, d [ 0], o [ 0], we);
    RAM32x1 U1  (a, d [ 1], o [ 1], we);
    RAM32x1 U2  (a, d [ 2], o [ 2], we);
    RAM32x1 U3  (a, d [ 3], o [ 3], we);
    RAM32x1 U4  (a, d [ 4], o [ 4], we);
    RAM32x1 U5  (a, d [ 5], o [ 5], we);
    RAM32x1 U6  (a, d [ 6], o [ 6], we);
    RAM32x1 U7  (a, d [ 7], o [ 7], we);
    RAM32x1 U8  (a, d [ 8], o [ 8], we);
    RAM32x1 U9  (a, d [ 9], o [ 9], we);
    RAM32x1 U10 (a, d [10], o [10], we);
    RAM32x1 U11 (a, d [11], o [11], we);
    RAM32x1 U12 (a, d [12], o [12], we);
    RAM32x1 U13 (a, d [13], o [13], we);
    RAM32x1 U14 (a, d [14], o [14], we);
    RAM32x1 U15 (a, d [15], o [15], we);
endmodule module RAM18x16 (a, d, o, we);
    input           we;
    input [ 4:0]    a;
    input [15:0]    d;
    output [15:0]   o;
    RAM32x16 U (a, d, o, we);
endmodule
```

FIG._15B3

```
module StdArg (clock, reset, printf_1_1_line_42, printf_2_1_line_45, printf_3_1_line_48,
               run_main, ready_main );
    input      clock, reset, run_main;
    output     ready_main;
    output [15:0] printf_1_1_line_42, printf_2_1_line_45, printf_3_1_line_48
    reg        ready_main, we;
    reg    [ 4:0] state, a, return_state_average;
    reg    [15:0] printf_1_1_line_42, printf_2_1_line_45, printf_3_1_line_48, divmod_a, divmod_b,
                  d, result_average, _108_average_count, _108_average_sum, _108_average_i,
                  _108_average_marker, _1_16, _2_16, _3_16, _4_16, _5_16, _6_16, _7_16, _8_16,
                  _9_16, _10_16, _11_16, _12_16, _13_16, _14_16;
    wire   [15:0] div_result, o;
    sdivmod16 sdivmod (divmod_a, divmod_b, div_result, );

RAM18x16 m (a, d, o, we);
    parameter _average = 1;

always @(posedge clock)
    begin
      if (reset)
      begin
        we = 0;
        state = 0;
      end
      else
      begin
        case (state)

0: begin
            if (run_main)
            begin
              ready_main = 0;
              _5_16 = 16'd2;
              a = `_average_first;
              d = _5_16;
              we = 1;
              state = 11;
            end
          end _average: begin
            _108_average_count = 16'd0;
            _108_average_sum = 16'd0;
            a = `_average_first;
            state = 5;
          end 5: begin
            _1_16 = o;
            _108_average_i = _1_16;
            _108_average_marker = (`_average_first + 16'd1);
            state = 2;
          end 2: state = (_108_average_i != -16'd1) ? 3 : 4;
```

FIG._15B4

```
3: begin
    _108_average_sum = (_108_average_sum + _108_average_i);
    _108_average_count = (_108_average_count + 16'd1);
    _108_average_marker = (_108_average_marker + 16'd1);
    a = (_108_average_marker - 16'd1);
    state = 6;
end 6: begin
    _2_16 = o;
    _108_average_i = _2_16;
    state = 2;
end 4: begin
    _108_average_marker = 16'd0;
    state = _108_average_sum ? 7 : 8;
end 7: begin
    divmod_a = _108_average_sum;
    divmod_b = _108_average_count;
    state = 10;
end 10: begin
    _4_16 = div_result;
    _3_16 = _4_16;
    state = 9;
end 8: begin
    _3_16 = 16'd0;
    state = 9;
end 9: begin
    result_average = _3_16;
    state = return_state_average;
end
11: begin
    we = 0;
    _6_16 = 16'd3;
    a = (_average_first + 16'd1);
    d = _6_16;
    we = 1;
    state = 12;
end
```

*FIG._15B5*

```
12: begin
      we = 0;
      _7_16 = 16'd4;
      a = (`_average_first + 16'd2);
      d = _7_16;
      we = 1;
      state = 13;
    end 13: begin
      we = 0;
      _8_16 = -16'd1;
      a = (`_average_first + 16'd3);
      d = _8_16;
      we = 1;
      state = 14;
    end 14: begin
      we = 0;
      return_state_average = 15;
      state = _average;
    end 15: begin
      printf_1_1_line_42 = result_average;
      // User Verilog code
      $write ("Average is: %d\n", printf_1_1_line_42);
      // End of user Verilog code
      _9_16 = 16'd5;
      a = `_average_first;
      d = _9_16;
      we = 1;
      state = 16;
    end 16: begin
      we = 0;
      _10_16 = 16'd7;
      a = (`_average_first + 16'd1);
      d = _10_16;
      we = 1;
      state = 17;
    end 17: begin
      we = 0;
      _11_16 = 16'd9;
      a = (`_average_first + 16'd2);
      d = _11_16;
      we = 1;
      state = 18;
    end
```

*FIG._15B6*

```
18: begin
      we = 0;
      _12_16 = 16'd11;
      a = (_average_first + 16'd3);
      d = _12_16;
      we = 1;
      state = 19;
   end
19: begin
      we = 0;
      _13_16 = -16'd1;
      a = (_average_first + 16'd4);
      d = _13_16;
      we = 1;
      state = 20;
   end
20: begin
      we = 0;
      return_state_average = 21;
      state = _average;
   end
21: begin
      printf_2_1_line_45 = result_average;
      // User Verilog code
      $write ("Average is: %d\n", printf_2_1_line_45);
      // End of user Verilog code
      _14_16 = -16'd1;
      a = `_average_first;
      d = _14_16;
      we = 1;
      state = 22;
   end
22: begin
      we = 0;
      return_state_average = 23;
      state = _average;
   end
23: begin
      printf_3_1_line_48 = result_average;
      // User Verilog code
      $write ("Average is: %d\n", printf_3_1_line_48);
      // End of user Verilog code
      ready_main = 1;
      state = 0;
   end
   default: ;
  endcase
 end
end
endmodule
```

FIG._15B7

```c
include <stdio.h> static void MoveRing (int nRings, int Tower1, int Tower2, int Tower3)
{
   if (nRings == 0)
      return;

MoveRing (nRings - 1, Tower1, Tower3, Tower2);

printf ("%d -> %d\n", Tower1, Tower2);

MoveRing (nRings - 1, Tower3, Tower2, Tower1);
} void Hanoi (int nRings)
{
    MoveRing (nRings, 1, 2, 3);
} ifndef __SYNETRY__
void main (void)
{
   printf ("Five rings Hanoi Towers\n");
   Hanoi (5);
}
endif
```

*FIG._16A*

```
`define recursion_stack 8'h1
module Hanoi (clock, reset, a, d, o, we, printf_1_1_line_22_Tower1, printf_1_2_line_22_Tower2,
              param_Hanoi_nRings, run_Hanoi, ready_Hanoi );
   input          clock, reset, run_Hanoi;
   input   [ 7:0] o, param_Hanoi_nRings;
   output         we, ready_Hanoi;
   output  [ 7:0] a, d, printf_1_1_line_22_Tower1, printf_1_2_line_22_Tower2;
   reg            we, ready_Hanoi;
   reg     [ 4:0] state, return_state_MoveRing;
   reg     [ 7:0] a, d, printf_1_1_line_22_Tower1, printf_1_2_line_22_Tower2, recursion_stack_pointer,
                  _MoveRing_nRings, _MoveRing_Tower1, _MoveRing_Tower2, _MoveRing_Tower3,
                  _1_8, _2_8, _3_8, _4_8, _5_8, _6_8, _7_8, _8_8, _9_8, _10_8, _11_8, _12_8;
   parameter _MoveRing = 1;

always @(posedge clock)
   begin
     if (reset)
     begin
        we = 0;
        recursion_stack_pointer = `recursion_stack;
        state = 0;
     end
     else
     begin
        case (state)

0: begin
           if (run_Hanoi)
           begin
              ready_Hanoi = 0;
              _MoveRing_nRings = param_Hanoi_nRings;
              _MoveRing_Tower1 = 8'd1;
              _MoveRing_Tower2 = 8'd2;
              _MoveRing_Tower3 = 8'd3;
              return_state_MoveRing = 26;
              state = _MoveRing;
           end
        end _MoveRing: state = (_MoveRing_nRings == 8'd0) ? 3 : 2;

2: begin
              _1_8 = (_MoveRing_nRings - 8'd1);
              _2_8 = _MoveRing_Tower1;
              _3_8 = _MoveRing_Tower3;
              _4_8 = _MoveRing_Tower2;
              a = recursion_stack_pointer;
              d = _MoveRing_nRings;
              we = 1;
              state = 4;
           end
```

FIG._16B1

```
4: begin
     we = 0;
     a = recursion_stack_pointer + 1;
     d = _MoveRing_Tower1;
     we = 1;
     state = 5;
   end 5: begin
     we = 0;
     a = recursion_stack_pointer + 2;
     d = _MoveRing_Tower2;
     we = 1;
     state = 6;
   end 6: begin
     we = 0;
     a = recursion_stack_pointer + 3;
     d = _MoveRing_Tower3;
     we = 1;
     state = 7;
   end 7: begin
     we = 0;
     _9_8 = return_state_MoveRing;
     a = recursion_stack_pointer + 4;
     d = _9_8;
     we = 1;
     state = 8;
   end 8: begin
     we = 0;
     recursion_stack_pointer = recursion_stack_pointer + 5;
     _MoveRing_nRings = _1_8;
     _MoveRing_Tower1 = _2_8;
     _MoveRing_Tower2 = _3_8;
     _MoveRing_Tower3 = _4_8;
     return_state_MoveRing = 9;
     state = _MoveRing;
   end 9: begin
     recursion_stack_pointer = recursion_stack_pointer - 5;
     a = recursion_stack_pointer;
     state = 10;
   end 10: begin
     _MoveRing_nRings = o;
     a = recursion_stack_pointer + 1;
     state = 11;
   end
```

FIG._16B2

```
11: begin
      _MoveRing_Tower1 = o;
      a = recursion_stack_pointer + 2;
      state = 12;
    end 12: begin
      _MoveRing_Tower2 = o;
      a = recursion_stack_pointer + 3;
      state = 13;
    end 13: begin
      _MoveRing_Tower3 = o;
      a = recursion_stack_pointer + 4;
      state = 14;
    end 14: begin
      _10_8 = o;
      return_state_MoveRing = _10_8;
      printf_1_1_line_22_Tower1 = _MoveRing_Tower1;
      printf_1_2_line_22_Tower2 = _MoveRing_Tower2;
      // User Verilog code
      $write ("%d -> %d\n", printf_1_1_line_22_Tower1, printf_1_2_line_22_Tower2);
      // End of user Verilog code
      _5_8 = (_MoveRing_nRings - 8'd1);
      _6_8 = _MoveRing_Tower3;
      _7_8 = _MoveRing_Tower2;
      _8_8 = _MoveRing_Tower1;
      a = recursion_stack_pointer;
      d = _MoveRing_nRings;
      we = 1;
      state = 15;
    end 15: begin
      we = 0;
      a = recursion_stack_pointer + 1;
      d = _MoveRing_Tower1;
      we = 1;
      state = 16;
    end 16: begin
      we = 0;
      a = recursion_stack_pointer + 2;
      d = _MoveRing_Tower2;
      we = 1;
      state = 17;
    end
```

FIG._16B3

```
17: begin
     we = 0;
     a = recursion_stack_pointer + 3;
     d = _MoveRing_Tower3;
     we = 1;
     state = 18;
   end 18: begin
     we = 0;
     _11_8 = return_state_MoveRing;
     a = recursion_stack_pointer + 4;
     d = _11_8;
     we = 1;
     state = 19;
   end 19: begin
     we = 0;
     recursion_stack_pointer = recursion_stack_pointer + 5;
     _MoveRing_nRings = _5_8;
     _MoveRing_Tower1 = _6_8;
     _MoveRing_Tower2 = _7_8;
     _MoveRing_Tower3 = _8_8;
     return_state_MoveRing = 20;
     state = _MoveRing;
   end 20: begin
     recursion_stack_pointer = recursion_stack_pointer - 5;
     a = recursion_stack_pointer;
     state = 21;
   end 21: begin
     _MoveRing_nRings = o;
     a = recursion_stack_pointer + 1;
     state = 22;
   end
22: begin
     _MoveRing_Tower1 = o;
     a = recursion_stack_pointer + 2;
     state = 23;
   end
23: begin
     _MoveRing_Tower2 = o;
     a = recursion_stack_pointer + 3;
     state = 24;
   end
```

*FIG._16B4*

```
24: begin
      _MoveRing_Tower3 = 0;
      a = recursion_stack_pointer + 4;
      state = 25;
    end
25: begin
      _12_8 = 0;
      return_state_MoveRing = _12_8;
      state = 3;
    end
3: state = return_state_MoveRing;
26: begin
      ready_Hanoi = 1;
      state = 0;
    end
    default: ;
    endcase
   end
  end
endmodule
```

FIG._16B5

```
include <stdio.h> void f1 ()
{
   printf ("%d\n", 1);
} void f2 ()
{
   printf ("%d\n", 2);
} void main (n)
{
   void (* f) ();

```
module PtrFtn (clock, reset, printf_1_1_line_19, printf_2_1_line_24, param_main_n, run_f1, ready_f1,
               run_f2, ready_f2, run_main, ready_main);
   input         clock, reset, run_f1, run_f2, run_main;
   input  [15:0] param_main_n;
   output        ready_f1, ready_f2, ready_main;
   output [15:0] printf_1_1_line_19, printf_2_1_line_24;
   reg           ready_f1, ready_f2, ready_main;
   reg    [ 1:0] state, return_state_f1, return_state_f2;
   reg    [15:0] printf_1_1_line_19, printf_2_1_line_24, _110_main_f;
   parameter _f1 = 1, _f2 = 2;

always @(posedge clock)
   begin
      if (reset)
      begin
         printf_1_1_line_19 = 0;
         printf_2_1_line_24 = 0;
         _110_main_f        = 0;
         ready_f1           = 0;
         return_state_f1    = 0;
         ready_f2           = 0;
         return_state_f2    = 0;
         ready_main         = 0;
         state = 0;
      end
```

FIG._17B1

```
            else
            begin
              case (state)
                0: begin
                     if (run_f1)
                     begin
                       ready_f1 = 0;
                       return_state_f1 = 0;
                       state = _f1;
                     end else if (run_f2)
                     begin
                       ready_f2 = 0;
                       return_state_f2 = 0;
                       state = _f2;
                     end else if (run_main)
                     begin
                       ready_main = 0;
                       _110_main_f = ((param_main_n == 16'd1) ? _f1 : _f2);
                       state = _110_main_f;
                     end
                   end _f1: begin
                       printf_1_1_line_19 = 16'd1;
                       // User Verilog code
                       $write ("%d\n", printf_1_1_line_19);
                       // End of user Verilog code
                       ready_f1 = 1;
                       state = return_state_f1;
                     end _f2: begin
                       printf_2_1_line_24 = 16'd2;
                       // User Verilog code
                       $write ("%d\n", printf_2_1_line_24);
                       // End of user Verilog code
                       ready_f2 = 1;
                       state = return_state_f2;
                     end 3: begin
                     ready_main = 1;
                     state = 0;
                   end default: ;
              endcase
            end
          end
endmodule
```

FIG._17B2

```
int sum (int array [], int size)
{
    int i, sum = 0;

for (i = 0; i < size; i ++)
        sum += array [i];

return sum;
} int main ()
{
    int i;
    int array [10];
    int size = sizeof (array) / sizeof (*array);

array [0] = 1;
    array [1] = 2;
    array [2] = 3;

for (i = 3; i < size; i++)
        array [i] = i * 2;

return sum (array, size);
}
```

*FIG._18A*

```
// Global macro definitions
`define UNIT_MAIN      16'h5000
`define UNIT_SIZE      16
`define ADDRESS_SIZE   16
`define DATA_SIZE      32

// Local macro definitions
`define STATE_SIZE        5
`define WORD_SIZE         32
`define WORD_MEMORY_SIZE  15
`define MEMORY_SIZE       480

// External functions defined in the translated C file
`define _sum              32'h50000001
`define offset__sum       1
`define var__sum          memory [1]
`define state__sum        5'd1
`define _sum__array       32'h50000002
`define offset__sum__array  2
`define var__sum__array   memory [2]
`define _sum__size        32'h50000003
`define offset__sum__size 3
`define var__sum__size    memory [3]
`define _main             32'h50000004
`define offset__main      4
`define var__main         memory [4]
`define state__main       5'd2

// Static, auto and register variables located in module's internal memory
`define main_3_main_array         32'h50000005
`define offset_main_3_main_array  5 module main (reset, clock, master, in_unit, in_address, in_data, in_read, in_call, out_unit,
             out_address, out_data, out_read, out_call );
    input     reset, clock, in_call, in_read;
    output    master, out_read, out_call;
    reg       master, out_read, out_call;

input  [`UNIT_SIZE    - 1 : 0] in_unit;
    input  [`ADDRESS_SIZE - 1 : 0] in_address;
    input  [`DATA_SIZE    - 1 : 0] in_data;

output [`UNIT_SIZE    - 1 : 0] out_unit;
    output [`ADDRESS_SIZE - 1 : 0] out_address;
    output [`DATA_SIZE    - 1 : 0] out_data;

reg    [`UNIT_SIZE    - 1 : 0] out_unit;
    reg    [`ADDRESS_SIZE - 1 : 0] out_address;
    reg    [`DATA_SIZE    - 1 : 0] out_data;

// Module data
    reg    [`STATE_SIZE - 1 : 0] state;
    reg    [`STATE_SIZE - 1 : 0] return_state;
    reg    [`WORD_SIZE  - 1 : 0] memory [0 : `WORD_MEMORY_SIZE - 1];
```

FIG._18B1

```
// Predefined states parameter [4:0]
    init     = 5'd0,
    idle     = 5'd20,
    read     = 5'd21,
    write    = 5'd22,
    intercall  = 5'd23,
    intercall2 = 5'd24,
    intercall3 = 5'd25,
    answer   = 5'd26,
    answer2  = 5'd27;
// Function result registers
    reg [31:0] result__sum, result__main;
// Static, auto and register variables located on registers
    reg [31:0] main_2_sum_i, main_2_sum_sum, main_3_main_i, main_3_main_size;
// Temporary registers
    reg [31 : 0]   _6_32, _8_32, _9_32, _11_32;      reg [ 0 : 0]   _7_1, _10_1;
always @(posedge reset or posedge clock) // Clock cycle
begin
    if (reset)
    begin
       master = 0;
       state  = idle;
    end
    else
    begin
       case (state)
       idle: begin
         if (in_unit == `UNIT_MAIN)
           begin
             if (in_call)
             begin
               out_unit = in_unit;
               out_address = in_address;
               out_data = answer;
               return_state = in_address;
               state = write;
             end
             else
             begin
               out_unit    = in_unit;
               out_address = in_address;
               return_state = answer;
               if (in_read)
                  state = read;
               else
               begin
                  out_data = in_data;
                  state = write;
               end
             end
           end
         end
       end
```

FIG._18B2

```
init: begin
   master = 1;
   state = answer;
end

`state__sum: begin
   main_2_sum_sum = 32'd0;
   main_2_sum_i = 32'd0;
   state = `STATE_SIZE'd11;
end `STATE_SIZE'd11: begin
   _6_32 = (main_2_sum_i - `var__sum__size);
   _7_1 = _6_32 [31] == 1'b1;
   state = _7_1 ? `STATE_SIZE'd12 : `STATE_SIZE'd13;
end `STATE_SIZE'd12: begin
   { out_unit, out_address } = (`var__sum__array + main_2_sum_i);
   return_state = `STATE_SIZE'd17;
   state = read;
end `STATE_SIZE'd17: begin
   _8_32 = out_data;
   main_2_sum_sum = (main_2_sum_sum + _8_32);
   main_2_sum_i = (main_2_sum_i + 32'd1);
   state = `STATE_SIZE'd11;
end `STATE_SIZE'd13: begin
   result__sum = main_2_sum_sum;
   { out_unit, out_address } = `_sum;
   out_data = result__sum;
   master = 1;
   state = `var__sum;
end `state__main: begin
   main_3_main_size = 32'd10;
   memory [`main_3_main_array - (`UNIT_MAIN << `ADDRESS_SIZE)] = 32'd1;
   memory [(`main_3_main_array + 32'd1) - (`UNIT_MAIN << `ADDRESS_SIZE)] = 32'd2;
   memory [(`main_3_main_array + 32'd2) - (`UNIT_MAIN << `ADDRESS_SIZE)] = 32'd3;
   main_3_main_i = 32'd3;
   state = `STATE_SIZE'd14;
end `STATE_SIZE'd14: begin
   _9_32 = (main_3_main_i - main_3_main_size);
   _10_1 = _9_32 [31] == 1'b1;
   state = _10_1 ? `STATE_SIZE'd15 : `STATE_SIZE'd16;
end
```

FIG._18B3

```
`STATE_SIZE'd15: begin
    _11_32 = (main_3_main_i << 1'd1);
    { out_unit, out_address } = (`main_3_main_array + main_3_main_i);
    out_data = _11_32;
    return_state = `STATE_SIZE'd18;
    state = write;
end `STATE_SIZE'd18: begin
    main_3_main_i = (main_3_main_i + 32'd1);
    state = `STATE_SIZE'd14;
end `STATE_SIZE'd16: begin
    `var__sum__array = `main_3_main_array;
    `var__sum__size = main_3_main_size;
    `var__sum = `STATE_SIZE'd19;
    state = `state__sum;
end `STATE_SIZE'd19: begin
    result__main = result__sum;
    { out_unit, out_address } = `_main;
    out_data = result__main;
    master = 1;
    state = `var__main;
end read: begin
    if (out_unit != `UNIT_MAIN)
    begin
        out_read = 1;
        out_call = 0;
        master = 1;
        state` = intercall;
    end
    else
    begin
        out_data = memory [out_address];
        if (return_state == answer)
            master = 1;
        state = return_state;
    end
end
```

FIG._18B4

```
write: begin
   if (out_unit != `UNIT_MAIN)
   begin
      out_read = 0;
      out_call = 0;
      master  = 1;
      state = intercall;
   end
   else
   begin
      memory [out_address] = out_data;
      if (return_state == answer)
         master = 1;
      state = return_state;
   end
end intercall: begin
   state = intercall2;
end intercall2: begin
   master = 0;
   state = intercall3;
end intercall3: begin
   if (( in_unit, in_address ) == { out_unit, out_address })
   begin
      out_data = in_data;
      state = return_state;
   end
end answer: begin
   state = answer2;
end answer2: begin
   master = 0;
   state = idle;
end default:
   state = idle;
endcase
      end
   end
endmodule
```

*FIG.\_18B5*

```
int data_in;
int out1;
int out2;
int data_out;

void pipeline_stage_1 ()
{
   while (data_in != 0)
      out1 = data_in + 1;

if (data_in == 1)
      while (data_in == 1)
         out1 = 2;
} void pipeline_stage_2 ()
{
   while (out1 == 0)
      out2 = 0;

while (out1 != 0)
      out2 = out1 + 1;
} void pipeline_stage_3 ()
{
   if (out2 == 1)
      while (out2 == 1)
         data_out = 2;

while (out2 != 0)
      data_out = out2 + 1;
} ifndef __SYNETRY__ include <stdio.h> void main ()
{
   for (;;)
   {
      scanf ("%d", & data_in);
      pipeline_stage_1 ();
      pipeline_stage_2 ();
      pipeline_stage_3 ();
      printf ("%d", data_out);
   }
} endif
```

FIG._19A

```verilog
module Pipeline(clock,reset,_data_in,_data_out,run_pipeline_stage_1,ready_pipeline_stage_1,
        run_pipeline_stage_2,ready_pipeline_stage_2,run_pipeline_stage_3,ready_pipeline_stage_3);
    input           clock, reset, run_pipeline_stage_1, run_pipeline_stage_2, run_pipeline_stage_3;
    input   [15:0]  _data_in;
    output          ready_pipeline_stage_1, ready_pipeline_stage_2, ready_pipeline_stage_3;
    output  [15:0]  _data_out;
    reg             ready_pipeline_stage_1, ready_pipeline_stage_2, ready_pipeline_stage_3;
    reg     [ 2:0]  state1, state2, state3;
    reg     [15:0]  _data_out, _out1, _out2;

always @(posedge clock)
    begin
      if (reset)
         state1 = 0;
      else
      begin
        case (state1)

0: begin
            if (run_pipeline_stage_1)
            begin
              ready_pipeline_stage_1 = 0;
              state1 = 1;
            end
          end 1: state1 = (_data_in != 16'd0) ? 2 : 3;

2: begin
            _out1 = (_data_in + 16'd1);
            state1 = 1;
          end 3: state1 = (_data_in == 16'd1) ? 4 : 6;

4: state1 = (_data_in == 16'd1) ? 5 : 6;

5: begin
            _out1 = 16'd2;
            state1 = 4;
          end

6: begin
            ready_pipeline_stage_1 = 1;
            state1 = 0;
          end default: ;

endcase
      end
    end
```

FIG._19B1

```
always @(posedge clock)
begin
   if (reset)
      state2 = 0;
   else
   begin
      case (state2)

0: begin
               if (run_pipeline_stage_2)
               begin
                  ready_pipeline_stage_2 = 0;
                  state2 = 1;
               end
            end 1: state2 = (_out1 == 16'd0) ? 2 : 3;

2: begin
               _out2 = 16'd0;
               state2 = 1;
            end 3: state2 = (_out1 != 16'd0) ? 4 : 5;

4: begin
               _out2 = (_out1 + 16'd1);
               state2 = 3;
            end 5: begin
               ready_pipeline_stage_2 = 1;
               state2 = 0;
            end default: ;

endcase
   end
end
```

*FIG._19B2*

```
always @(posedge clock)
begin
  if (reset)
     state3 = 0;
  else
  begin
     case (state3)
       0: begin
            if (run_pipeline_stage_3)
            begin
               ready_pipeline_stage_3 = 0;
               state3 = (_out2 == 16'd1) ? 1 : 3;
            end
          end
       1: state3 = (_out2 == 16'd1) ? 2 : 3;
       2: begin
            _data_out = 16'd2;
            state3 = 1;
          end
       3: state3 = (_out2 != 16'd0) ? 4 : 5;
       4: begin
            _data_out = (_out2 + 16'd1);
            state3 = 3;
          end
       5: begin
            ready_pipeline_stage_3 = 1;
            state3 = 0;
          end
       default: ;
     endcase
   end
end
endmodule
```
FIG._19B3
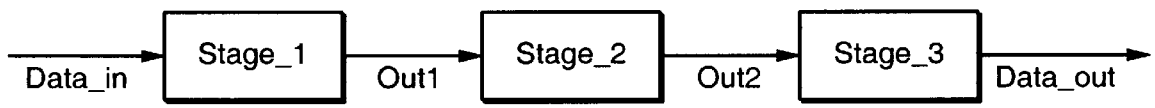
FIG._19C

```c
include <stdio.h> typedef enum { true = 1, false = 0 } bool;

void main ()
{
   bool bLightIsOn = true;

printf ("Light.c - C program working on APS-X84 FPGA test card\n");

for (;;)
   {
      int counter;

printf
      (
         "Enter the number of clock ticks"
         " to wait before the light change: "
      );

scanf ("%d", & counter);

if (counter < 0)
         counter = 0;

while (counter -- != 0)
         printf ("Waiting...\n");

bLightIsOn = ! bLightIsOn;

printf ("Light is: %d\n", bLightIsOn);
   }
}
```

FIG._20A

```verilog
module Light (clock, reset, scanf_0_1_line_33_counter, printf_4_1_line_43_bLightIsOn,
                run_main, ready_main );
    input           clock, reset, run_main;
    input   [ 7:0]  scanf_0_1_line_33_counter;

output          ready_main;
    output  [ 1:0]  printf_4_1_line_43_bLightIsOn;
    reg             ready_main, _1_1;
    reg     [ 1:0]  printf_4_1_line_43_bLightIsOn, _3_main_bLightIsOn, 3_2;
    reg     [ 2:0]  state;
    reg     [ 7:0]  _4_main_counter, _2_8;

always @(posedge clock)
    begin
        if (reset)
            state = 0;
        else
        begin
            case (state)

0: begin
                    if (run_main)
                    begin
                        ready_main = 0;
                        _3_main_bLightIsOn = 2'd1;
                        // User Verilog code
                        $write ("Light.c - C program working on APS-X84 FPGA test card\n");
                        // End of user Verilog code
                        state = 1;
                    end
                end 1: begin
                    // User Verilog code
                    $write ("Enter the number of clock ticks to wait before the light change: ");
                    // End of user Verilog code
                    _4_main_counter = scanf_0_1_line_33_counter;
                    _1_1 = _4_main_counter [7] == 1'b1;
                    if (_1_1)
                        _4_main_counter = 8'd0;
                    state = 2;
                end 2: begin
                    _2_8 = _4_main_counter;
                    _4_main_counter = (_2_8 - 8'd1);
                    state = (_2_8 != 8'd0) ? 3 : 4;
                end
```

*FIG._20B1*

```
       3: begin
          // User Verilog code
          $write ("Waiting...\n");
          // End of user Verilog code
          state = 2;
       end 4: begin
          _3_2 = (! _3_main_bLightIsOn);
          _3_main_bLightIsOn = _3_2;
          printf_4_1_line_43_bLightIsOn = _3_main_bLightIsOn;
          // User Verilog code
          $write ("Light is: %d\n", printf_4_1_line_43_bLightIsOn);
          // End of user Verilog code
          state = 1;
       end default: ;

endcase
    end
  end endmodule

//     APSX84.v - Verilog wrapper module which instantiates module Light.v.
//               This design is intended to run on APS-X84 board.
// module APSX84 ( clock, clock_enable, reset, data, LCD);

input         clock         /* synthesis xc_loc=P24 */ ;
   input         clock_enable  /* synthesis xc_loc=P3 */ ;
   input         reset         /* synthesis xc_loc=P4 */ ;
   input  [5:0]  data          /* synthesis xc_loc="P10,P9,P8,P7,P6,P5" */ ;
   output        LCD           /* synthesis xc_loc=P35 */ ;

wire          internal_clock = clock & clock_enable;
   wire  [7:0]   data8 = { data, 2'b0 };
   wire  [1:0]   LCD2;
   wire          LCD = LCD2 [0];
   wire          run_main = 1;

Light Light ( internal_clock, reset, data8, LCD2, run_main,);

endmodule
```

FIG._20B2

```
int sum (int n)
{
  int i, sum = 0;
  for (i = 0; i != n; i++)
    sum += i;

return sum;
}
```

FIG._21A

```
module Sum (clock, reset, result__sum, param__sum__n, run__sum, ready__sum );
  input        clock, reset, run__sum;
  input [15:0] param__sum__n;
  output       ready__sum;
  output [15:0] result__sum;
  reg          ready__sum;
  reg   [ 1:0] state;
  reg   [15:0] result__sum, s_2_sum_i, s_2_sum_sum;
  always @(posedge clock)
  begin
    if (reset)
      state = 0;
    else
    begin
      case (state)
        0: begin
          if (run__sum)
          begin
            ready__sum = 0;
            s_2_sum_sum = 16'd0;
            s_2_sum_i = 16'd0;
            state = 1;
          end
        end 1: state = (s_2_sum_i != param__sum__n) ? 2 : 3;

2: begin
          s_2_sum_sum = (s_2_sum_sum + s_2_sum_i);
          s_2_sum_i = (s_2_sum_i + 16'd1);
          state = 1;
        end 3: begin
          result__sum = s_2_sum_sum;
          ready__sum = 1;
          state = 0;
        end
        default: ;
      endcase
    end
  end
endmodule
```

FIG._21B

```vhdl
library IEEE;
use IEEE.STD_Logic_1164.all;
use IEEE.Numeric_Std.all;

entity synetry_sum is
port( clock      : in  std_logic;
      reset      : in  boolean;
      run_sum    : in  boolean;
      param_sum_n : in  integer range 0 to 65535;
      result_sum : out integer range 0 to 65535;
      ready_sum  : out boolean );
end entity synetry_sum;

architecture RTL of synetry_sum is
begin
   process_synetry_sum : process
       variable state     : integer range 0 to 3;
       variable s_2_sum_i   : integer range 0 to 65535;
       variable s_2_sum_sum : integer range 0 to 65535;
   begin
      wait until clock'event and clock = '1';
      if (reset) then
         state := 0;
      else
         case (state)is
            when 0 =>
               if (run_sum)then
                  ready_sum <= false;
                  s_2_sum_sum := 0;
                  s_2_sum_i := 0;
                  state := 1;
               end if;
            when 1 =>
               if (s_2_sum_i /= param_sum_n) then
                  state := 2;
               else
                  state := 3;
               end if;
            when 2 =>
               s_2_sum_sum := s_2_sum_sum + s_2_sum_i;
               s_2_sum_i := s_2_sum_i + 1;
               state := 1;
            when 3 =>
               result_sum <= s_2_sum_sum;
               ready_sum <= true;
               state := 0;
         end case;
      end if;
      wait;
   end process process_synetry_sum;
end architecture RTL;
```

FIG._21C

```
int read (int * p)
{
  return * p;
}
```

FIG._22A

```
module Read(clock,reset,a,d,o,we,result_read,param_read_p,run_read,ready_read);
    input          clock, reset, run_read;
    input  [ 3:0]  o, param_read_p;
    output         we, ready_read;
    output [ 3:0]  a, d, result_read;
    reg            we, ready_read, state;
    reg    [ 3:0]  a, d, result_read;

always @(posedge clock)
    begin
      if (reset)
      begin
        we = 0;
        state = 0;
      end
      else
      begin
        case (state)

0:begin
          if (run_read)
          begin
            ready_read = 0;
            a = param_read_p;
            state = 1;
          end
        end 1:begin
          _1_4 = o;
          result_read = _1_4;
          ready_read = 1;
          state = 0;
        end default: ;
        endcase
      end
    end
endmodule
```

FIG._22B

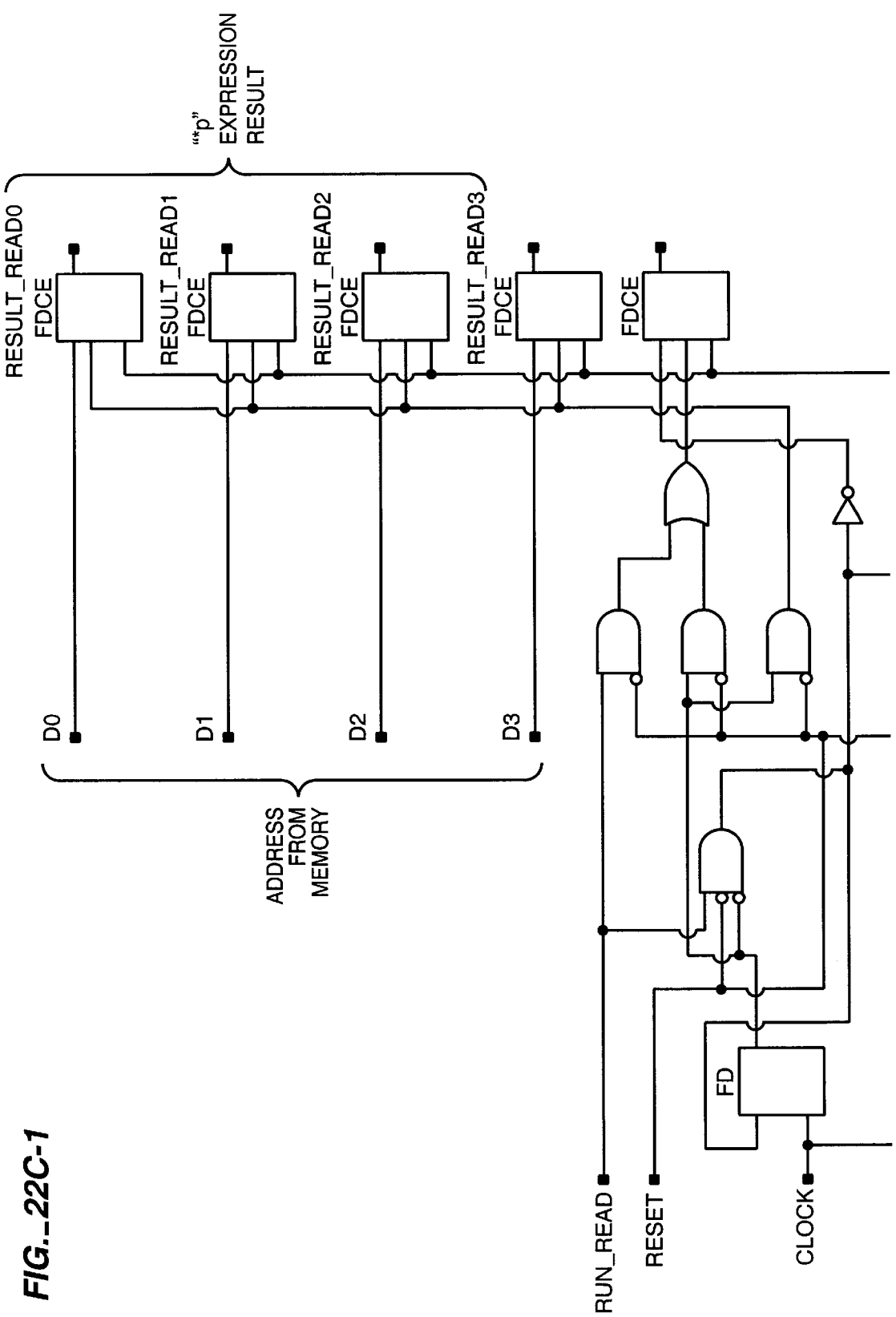
FIG._22C-1

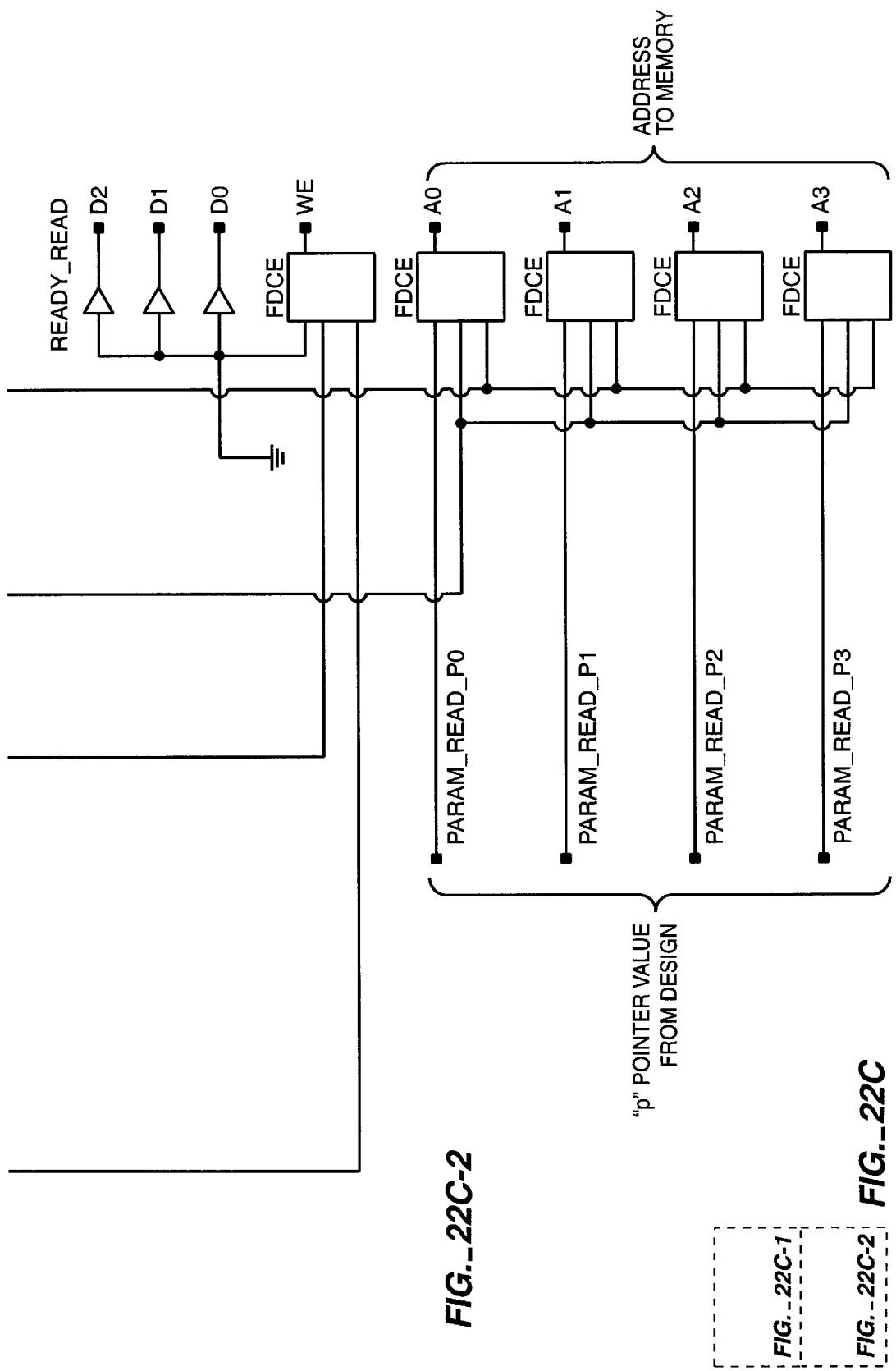
FIG._22C-2
FIG._22C
FIG._22C-1
FIG._22C-2

```
void write (int * p, int d)
{
  * p = d;
}
```

FIG._23A

```
module Write(clock,reset,a,d,o,we,param_write_p,param_write_d,run_write,ready_write);
   input        clock, reset, run_write;
   input  [ 3:0]  o, param_write_p, param_write_d;
   output       we, ready_write;
   output [ 3:0]  a, d;
   reg          we, ready_write, state;
   reg    [ 3:0]  a, d;

always @(posedge clock)
   begin
     if (reset)
     begin
       we = 0;
       state = 0;
     end
     else
     begin
       case (state)

0:begin
          if (run_write)
          begin
            ready_write = 0;
            a = param_write_p;
            d = param_write_d;
            we = 1;
            state = 1;
          end
        end 1:begin
          we = 0;
          ready_write = 1;
          state = 0;
        end default:   ;

endcase
     end
   end endmodule
```

FIG._23B

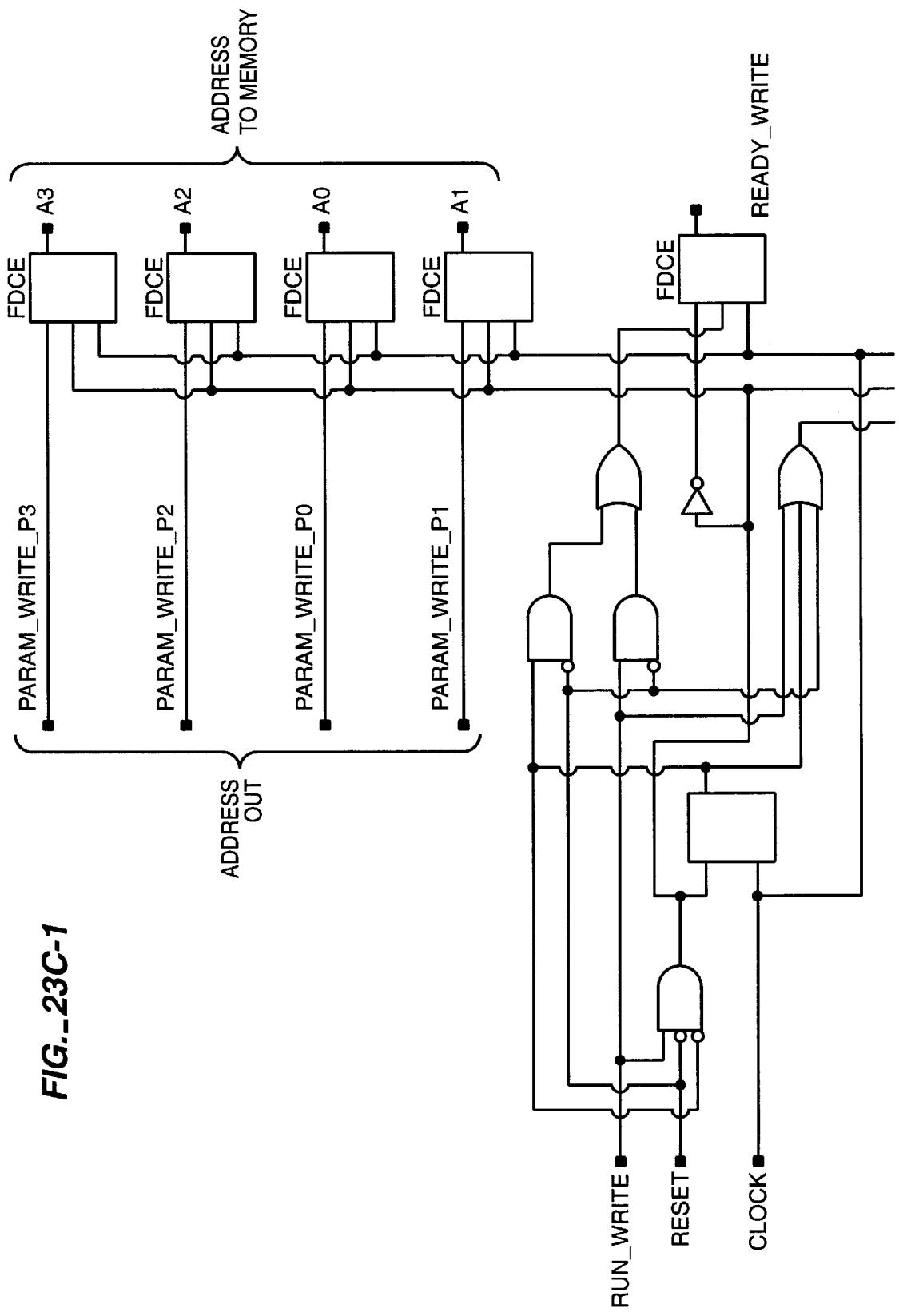
FIG._23C-1

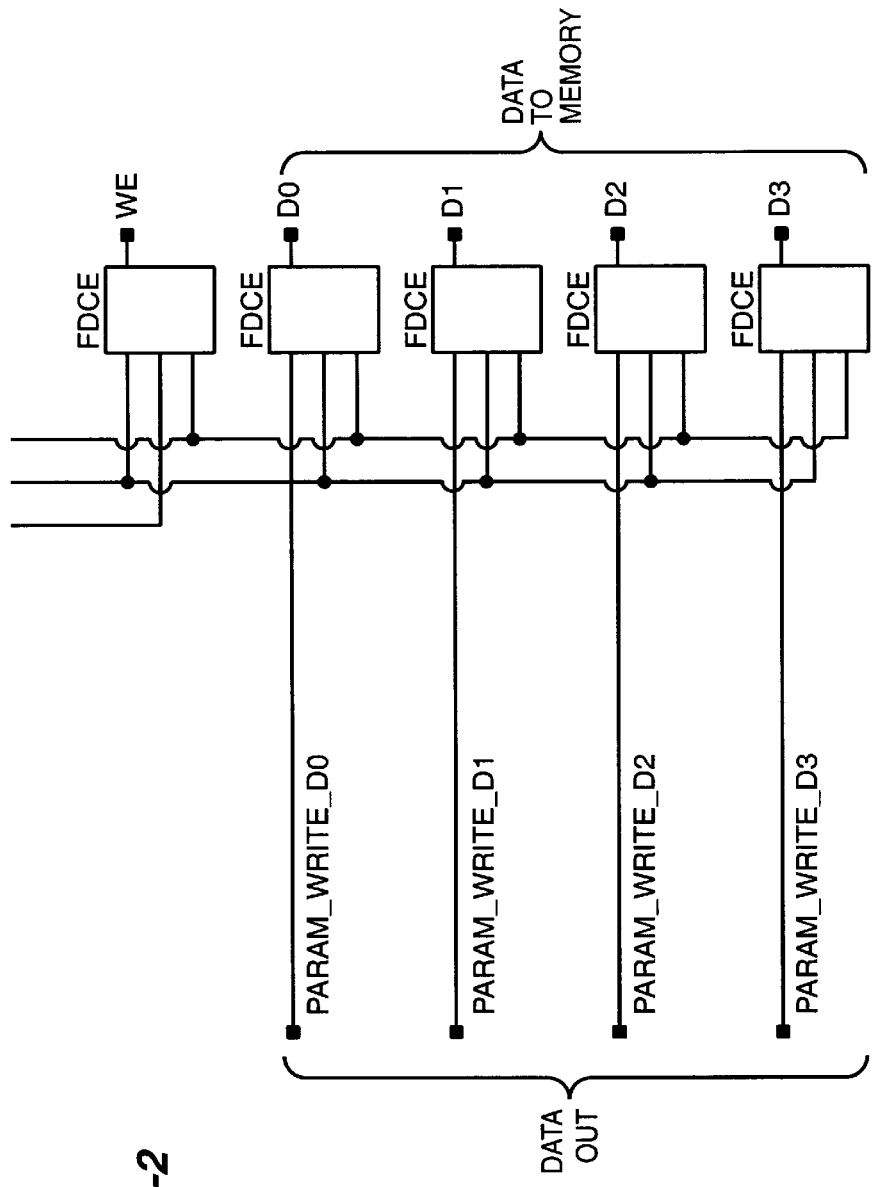
FIG._23C-2
FIG._23C

```
typedef struct
{
        int a;
        int b;
} STRUCTURE;

int read_member_b (STRUCTURE *p)
{
   return p -> b;
}
```

*FIG._24A*

```
module Struct1(clock,reset,a,d,o,we,result_read_member_b,param_read_member_b_p,
                run_read_member_b,ready_read_member_b);
   input         clock, reset, run_read_member_b;
   input  [ 3:0] o, param_read_member_b_p;
   output        we, ready_read_member_b;
   output [ 3:0] a, d, result_read_member_b;
   reg           we, ready_read_member_b, state;
   reg    [ 3:0] a, d, result_read_member_b, _1_4;

always @(posedge clock)
   begin
      if (reset)
      begin
         we = 0;
         state = 0;
      end
      else
      begin
         case (state)

0:begin
              if (run_read_member_b)
               begin
                 ready_read_member_b = 0;
                 a = (param_read_member_b_p + 4'd1);
                  state = 1;
               end
           end 1:begin
              _1_4 = o;
              result_read_member_b = _1_4;
              ready_read_member_b = 1;
               state = 0;
           end default: ;

endcase
      end
   end
endmodule
```

*FIG._24B*

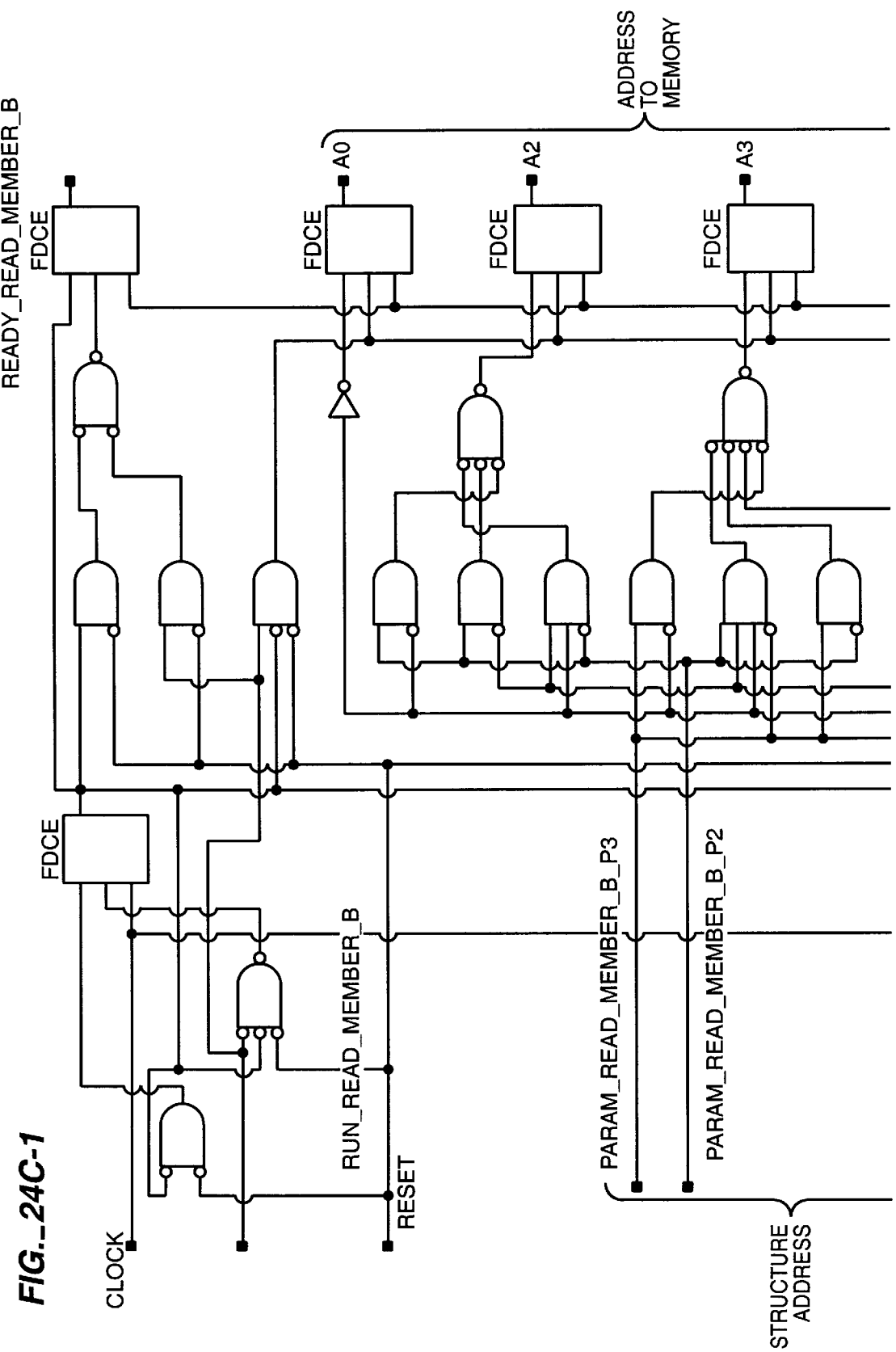
FIG._24C-1

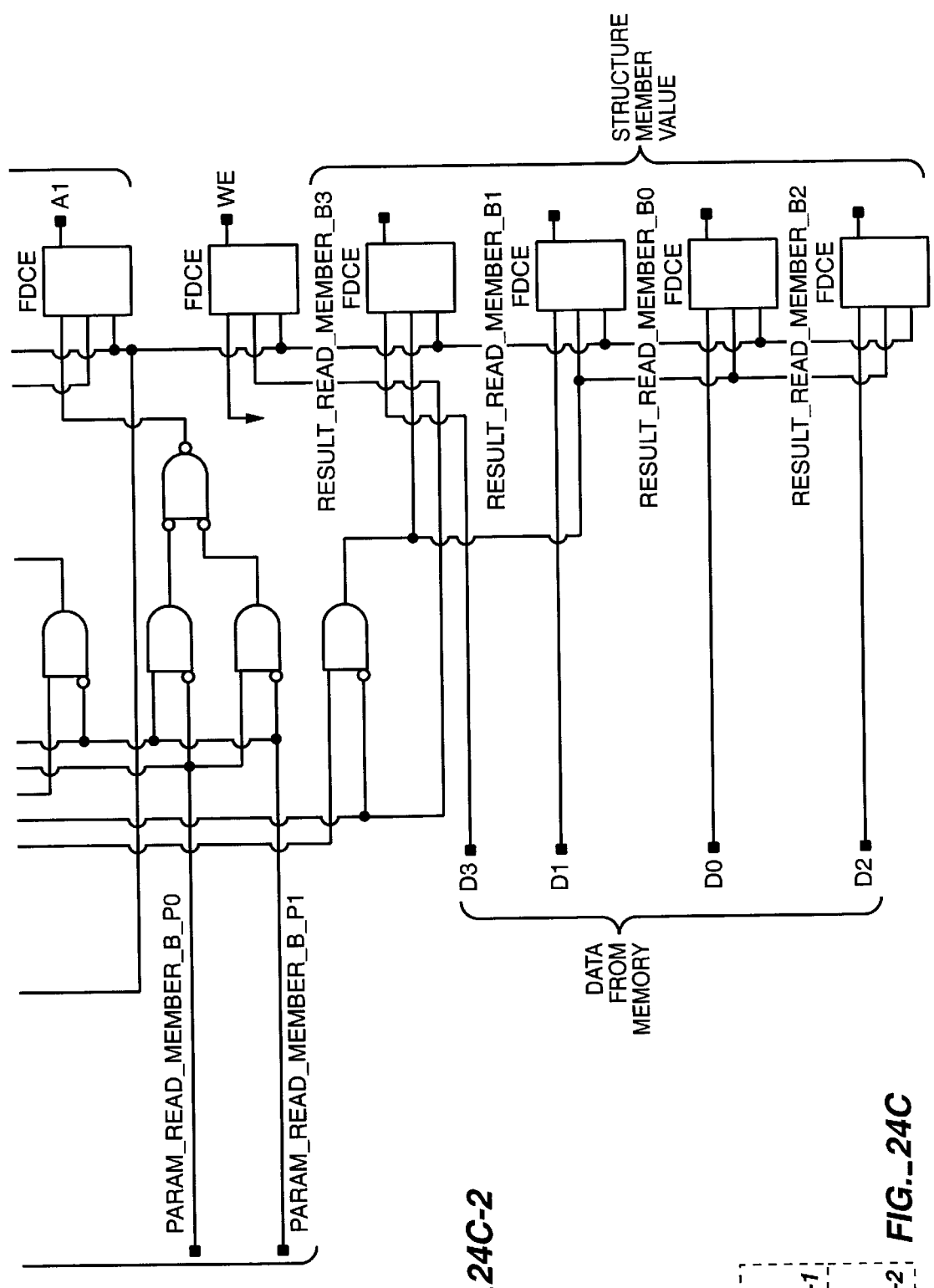
FIG._24C-2
FIG._24C

```
typedef struct
{
        int a;
        int b;
} STRUCTURE;

void write_member_b (STRUCTURE *p, int n)

```
module Struct2(clock,reset,a,d,o,we,param_write_member_b_p,param_write_member_b_n,
               run_write_member_b,ready_write_member_b);
    input         clock, reset, run_write_member_b;
    input  [3:0]  o, param_write_member_b_p, param_write_member_b_n;
    output        we, ready_write_member_b;
    output [3:0]  a, d;
    reg           we, ready_write_member_b, ready_write_member_b, state;
    reg    [3:0]  a, d;
    always @(posedge clock)
    begin
      if (reset)
      begin
        we = 0;
        state = 0;
      end
      else
      begin
        case (state)
          0:begin
             if (run_write_member_b)
               begin
                 ready_write_member_b = 0;
                 a = (param_write_member_b_p + 4'd1);
                 d = param_write_member_b_n;
                 we = 1;
                 state = 1;
               end
           end 1:begin
             we = 0;
             ready_write_member_b = 1;
             state = 0;
           end default: ;
        endcase
      end
    end
endmodule
```

FIG._25B

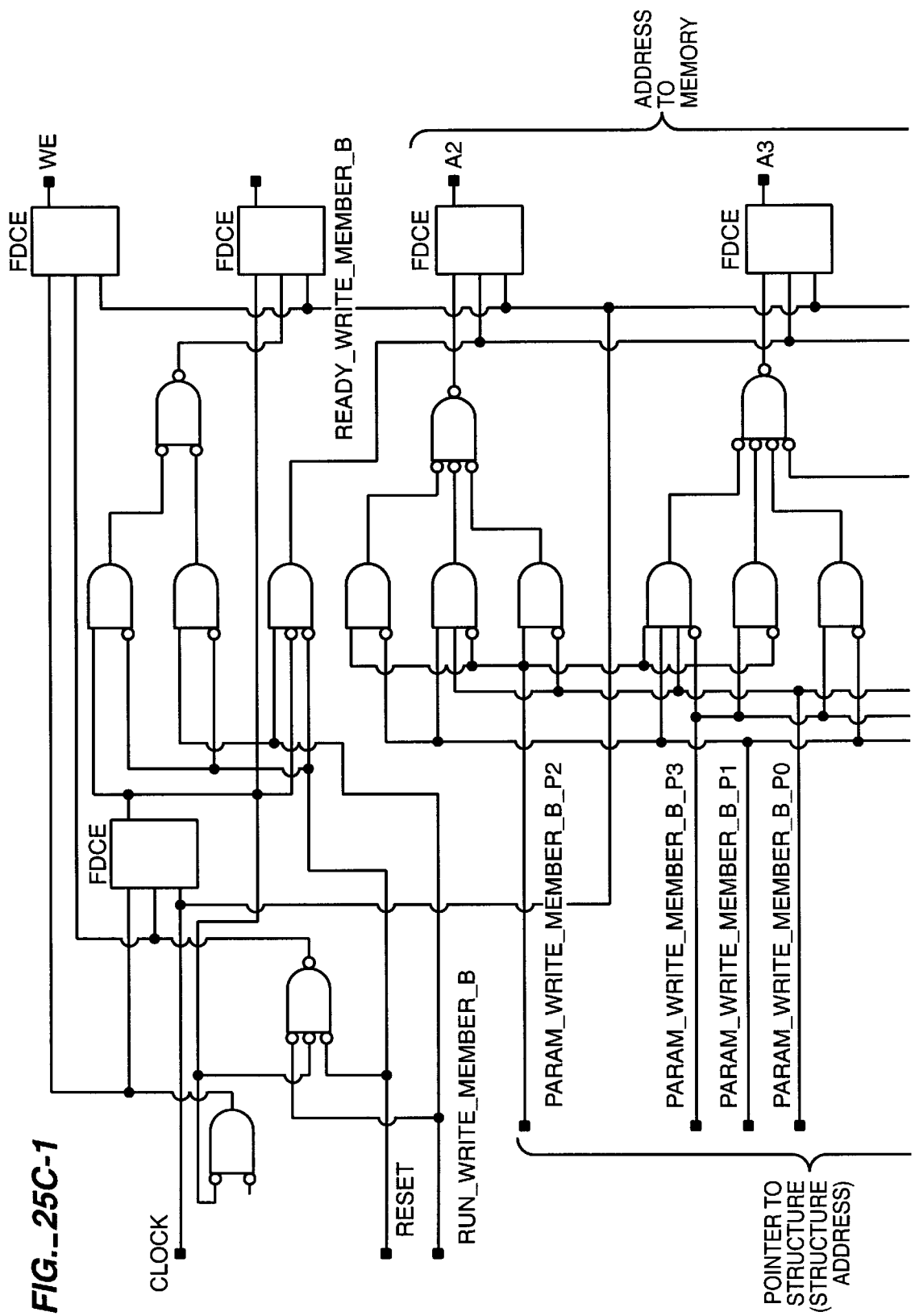
FIG._25C-1

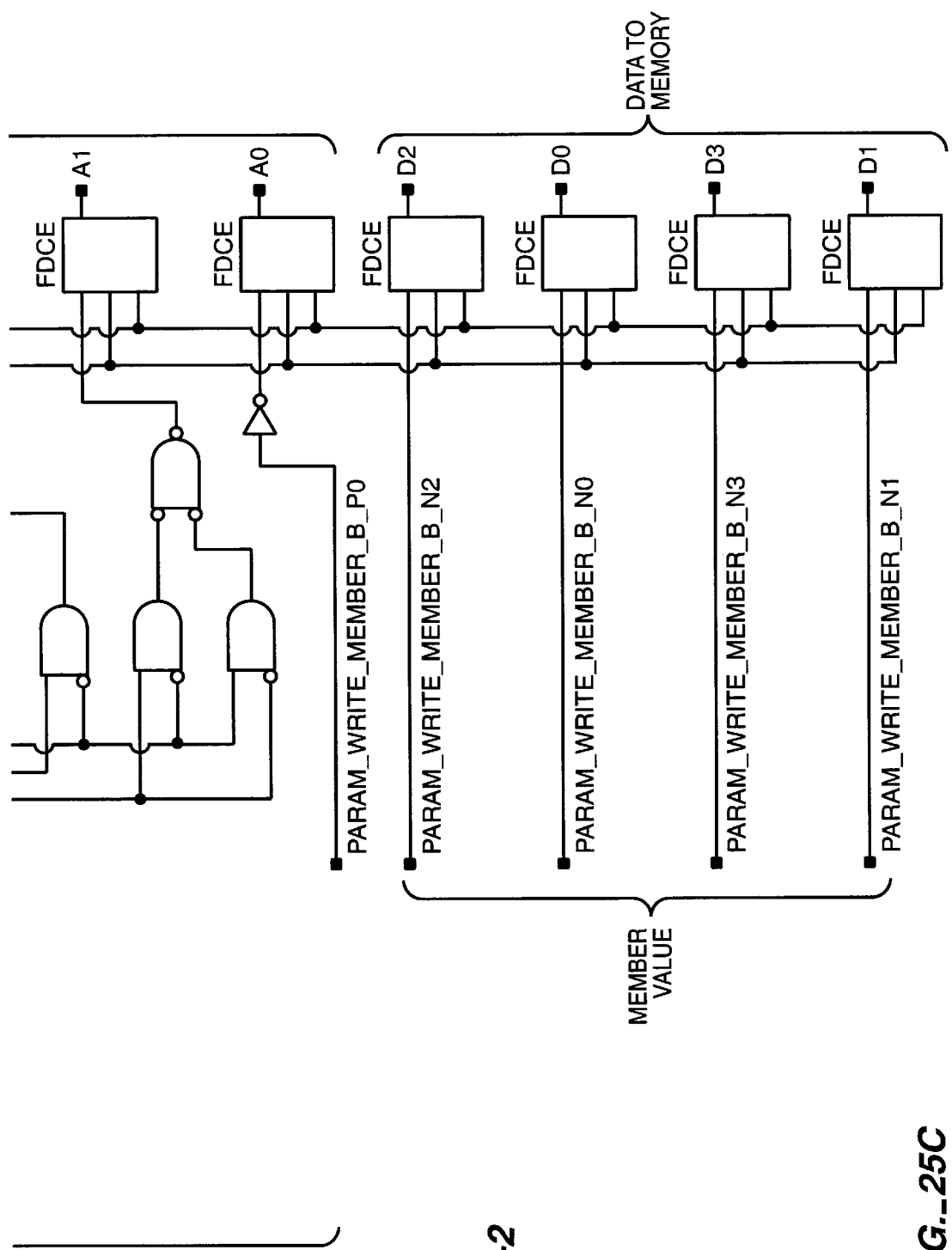
FIG._25C-2
FIG._25C
FIG._25C-1
FIG._25C-2

```
typedef struct
{
        int a;
        int b;
} STRUCTURE;

STRUCTURE s;

int read_member_b (void)

{
  return s.b;
}
```

FIG._26A

```
`define _s 2'h1
module Struct4(clock,reset,a,d,o,we,result_read_member_b,run_read_member_b,ready_read_member_b);
    input       clock, reset, run_read_member_b;
    input  [ 3:0] o;
    output      we, ready_read_member_b;
    output [ 1:0] a, d, result_read_member_b;
    reg         we, ready_read_member_b, state;
    reg    [ 1:0] a, d, result_read_member_b;
    reg    [ 3:0] _1_4 ;
    always @(posedge clock)
    begin
      if (reset)
      begin
        we = 0;
        state = 0;
      end
      else
      begin
        case (state)

0: begin
          if (run_read_member_b)
          begin
            ready_read_member_b = 0;
            a = (`_s + 4'd1);
            state = 1;
          end
        end 1: begin
          _1_4 = o;
          result_read_member_b = _1_4;
          ready_read_member_b = 1;
          state = 0;
        end default: ;
        endcase
      end
    end
endmodule
```

FIG._26B

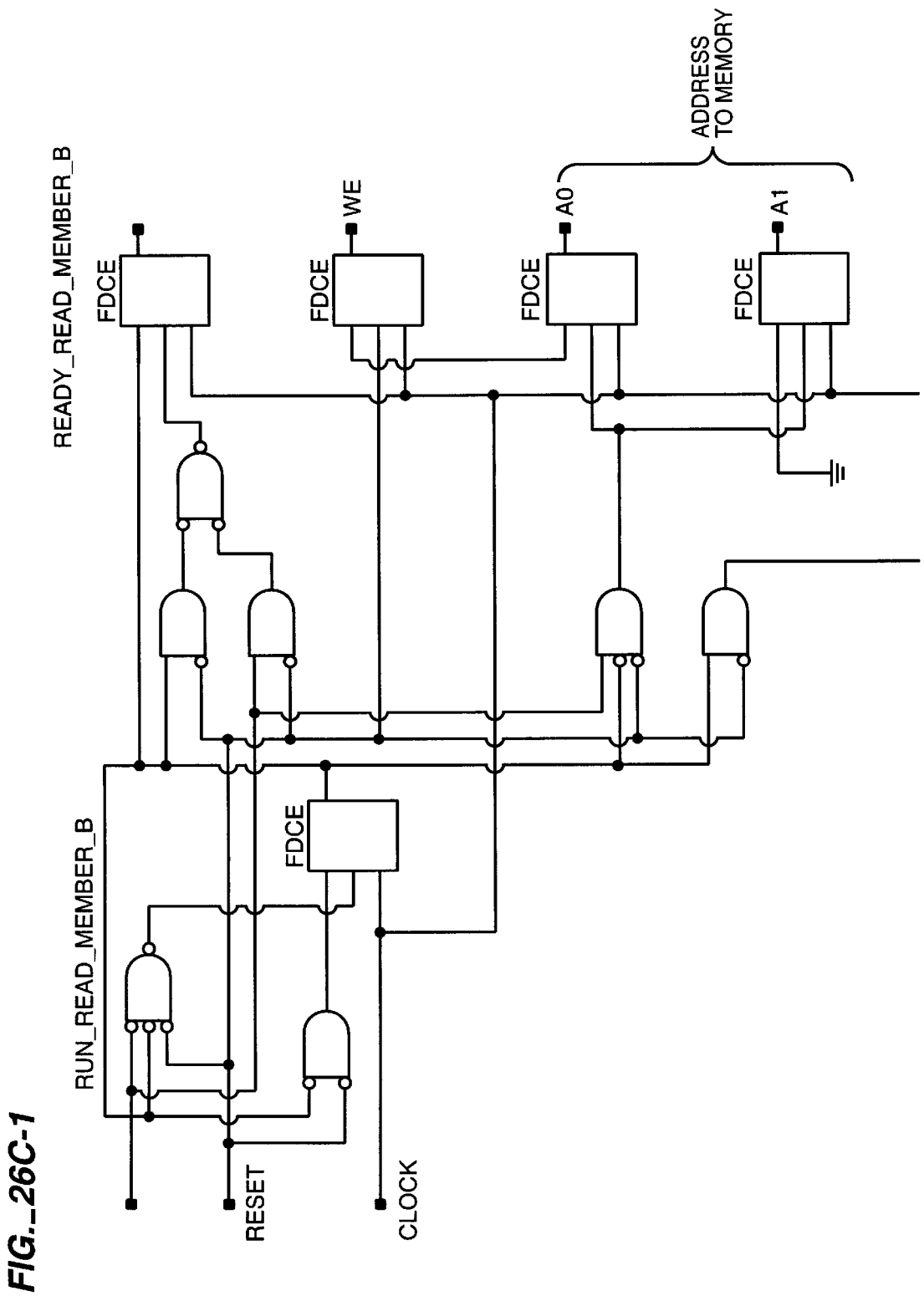
FIG._26C-1

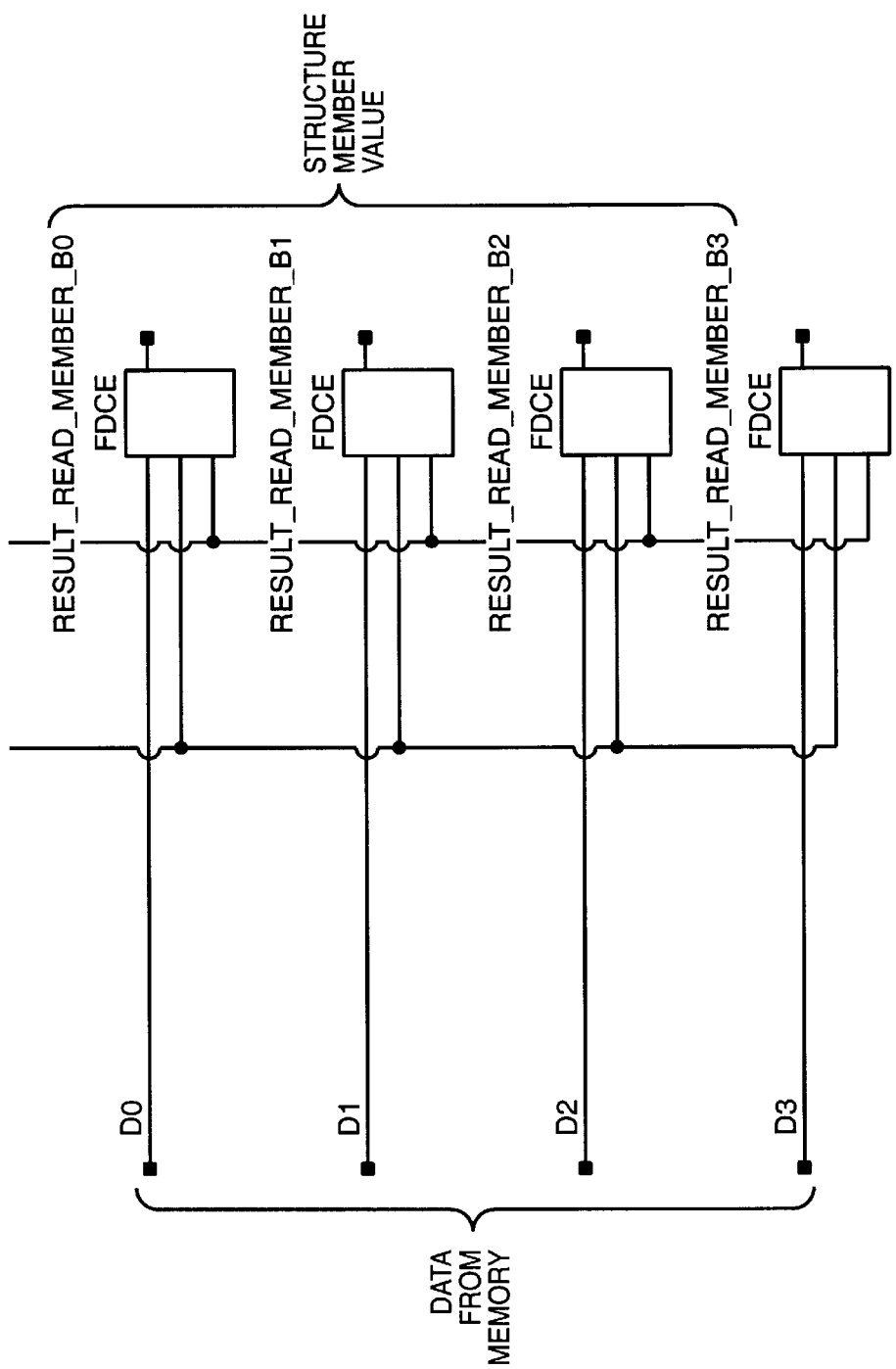
FIG._26C-2
FIG._26C-1
FIG._26C-2
FIG._26C

```
typedef struct
{
        int a;
        int b;
} STRUCTURE;

STRUCTURE s;

void write_member_b (int n)

```
`define _s 2'h1
module Struct5(clock,reset,a,d,o,we,param_write_member_b_n,run_write_member_b,ready_write_member_b);
    input        clock, reset, run_write_member_b;
    input  [3:0] param_write_member_b_n, o;
    output       we, ready_write_member_b;
    output [1:0] a;
    output [3:0] d;
    reg          we, ready_write_member_b, state;
    reg    [1:0] a;
    reg    [3:0] d;
    always @(posedge clock)
    begin
      if (reset)
      begin
        we = 0;
        state = 0;
      end
      else
      begin
        case (state)
        0: begin
            if (run_write_member_b)
            begin
              ready_write_member_b = 0;
              a = (`_s + 4'd1);
              d = param_write_member_b_n;
              we = 1;
              state = 1;
            end
          end
        1: begin
            we = 0;
            ready_write_member_b = 1;
            state = 0;
          end
        default: ;
        endcase
      end
    end
endmodule
```

FIG._27B

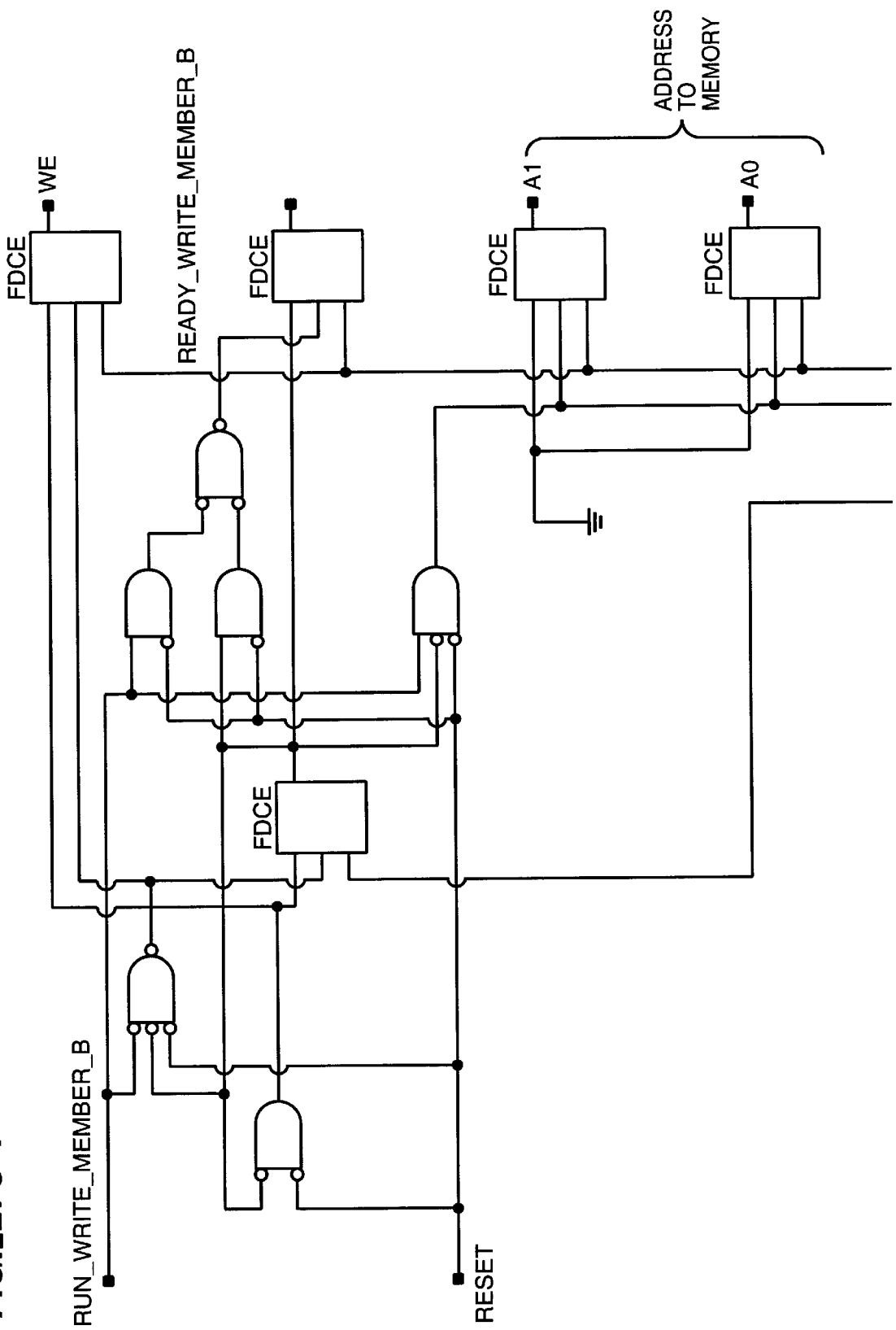
FIG._27C-1

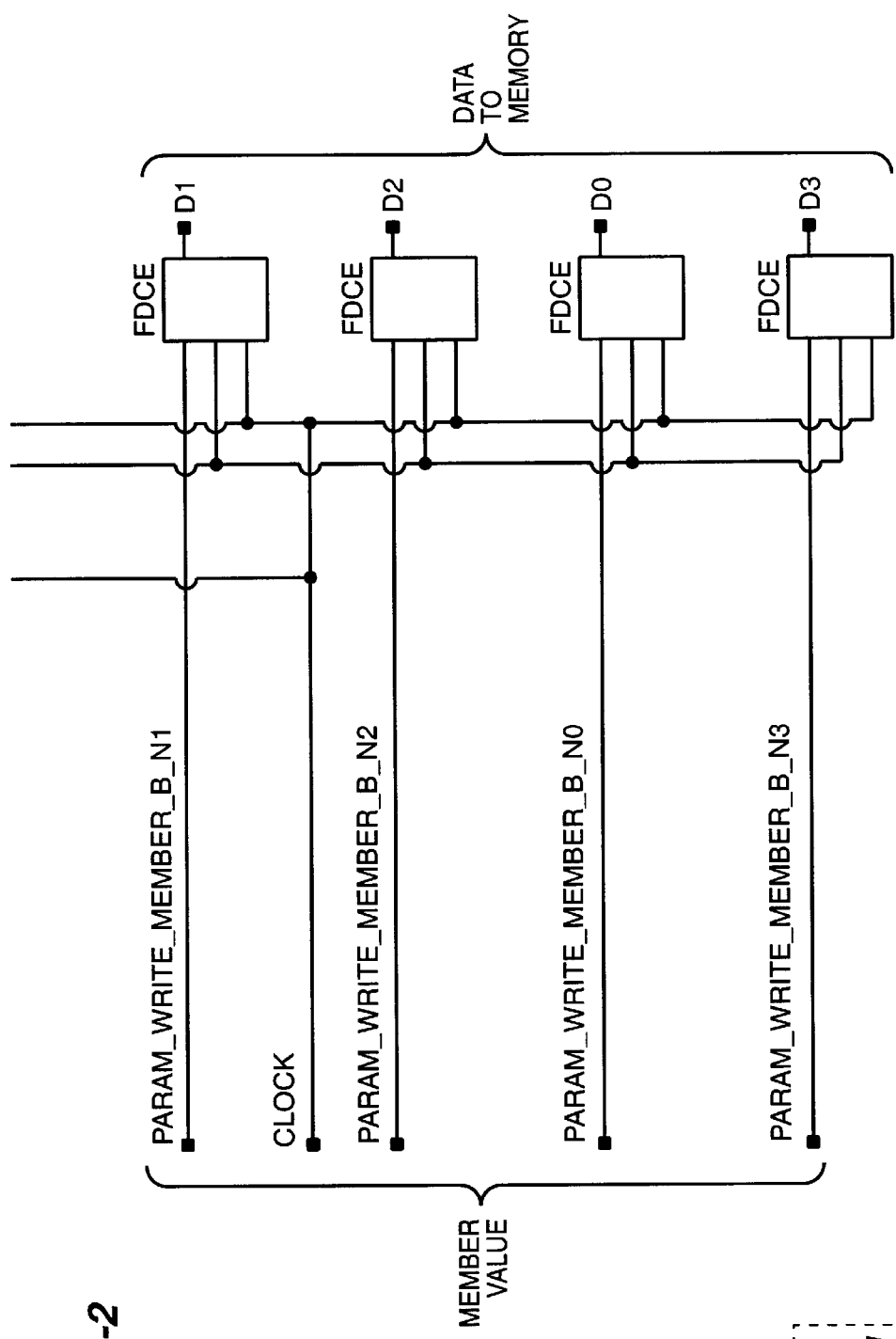

SYSTEM FOR CONVERTING HARDWARE DESIGNS IN HIGH-LEVEL PROGRAMMING LANGUAGE TO HARDWARE IMPLEMENTATIONS

CROSS-REFERENCE TO MICROFICHE APPENDIX

Appendix A, which is a part of the present disclosure, is a microfiche appendix consisting of two sheets of microfiche having a total of 176 frames. Microfiche Appendix A is a source code listing of a portion of the code comprising one embodiment of a system for converting hardware designs in a highlevel programming language (ANSI C) into a register transfer level hardware description language (Verilog), which is described in more detail below.

A portion of the disclosure of this patent document contains material which is subject to copyright protection. The copyright owner has no objection to the facsimile reproduction by anyone of the patent document or the patent disclosure, as they appear in the U.S. Patent and Trademark Office patent files or records, but otherwise reserves all copyright rights whatsoever.

FIELD OF THE INVENTION

This invention relates to configuring digital circuits, especially computationally intensive digital circuitry, such as field programmable gate arrays (FPGAs) and other programmable logic hardware and application specific integrated circuits (ASICs), and, more particularly, to computer aided design of such computationally intensive digital circuitry. Specifically, one embodiment of the invention provides a system for converting a hardware design rendered in a high-level programming language, such as ANSI C, into an actual hardware implementation, for example, as an FPGA.

Various persons have previously attempted to address the long-felt need for an easy approach.to designing computationally intensive digital circuits, such as FPGAs. The prior art evidences two divergent approaches for designing actual implementations for digital hardware.

One prior art approach has been to create a specific hardware description language (HDL) for designing hardware. Various commercially available HDLs have been developed, such as Verilog, VHDL, ABEL, CUPL, AHDL, MACHX, and PALASM. After a hardware design is rendered in an HDL, the HDL design is processed into a gate-level hardware representation using one of various hardware- or manufacturer-specific synthesis programs to interpret the HDL design. Then, the gate-level representation is reduced to an actual hardware implementation using conventional physical design tools.

HDLs are specific computer aided design tools for hardware designers and require a level of expertise in the use of the particular HDL being employed to render a hardware design and are difficult to learn and use. See, for example, Tuck, B., "Raise Your Sights to the System Level," Computer Design, June, 1997, pp. 53, 69. Therefore, only persons who frequently design hardware typically use HDLs. If a circuit application arises in which design and implementation of an FPGA is economically justified, the vast majority of persons must retain an expert or confront the difficult task of learning an HDL. Furthermore, these HDLs are not typically universal for the design of FPGAs, since many HDLs are supported by only a single or a limited number of hardware manufacturers. Consequently, even experienced users of an HDL, such as fill-time hardware designers, may not be sufficiently familiar with other HDLs to be able to render a design which can be implemented in a variety of hardware systems from a number of different hardware manufacturers. There is therefore a need for an easy-to-use, universal computer aided hardware design tool by both experts and occasional hardware designers as well.

A second prior art approach recognizes that the development of computationally intensive hardware would be available to a wider population of persons if hardware designs could be rendered in a standard high-level programming language which is more universally known, easier to use, and more frequently employed than HDLs. One such high-level programming language is ANSI C. Others, many of which have several extensions, are: APL, Ada, Algol, B, Basic, Kernighan & Ritchie C, C++, CLOS, COBOL, Clu, Common Lisp, Coral, Dylan, Eiffel, Emacs Lisp, Forth, Fortran, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC.

Unfortunately, prior art attempts to base computer aided hardware design tools on high-level programming languages have been incomplete. Consequently, these attempts to realize the goal of providing an effective tool for designing hardware using a high-level programming language have not achieved widespread use. All the prior art attempts have each suffered three or more of the following shortcomings:

1. Prior art computer aided hardware design tools generate so many unhandled exceptions and language restrictions when presented with typical high-level language programs (e.g., a C program) that it renders such tools virtually useless for practical hardware design. Therefore, persons using such tools are required to read manuals and attempt to create work-arounds for portions of the high-level programming language, which are not implemented.

2. Hardware generated using prior art computer aided hardware design tools is typically based on simple line-by-line, table-driven translation and as such does not contain the necessary widely scoped optimizations that produce practical and useful hardware designs for most applications.

3. Design output of the prior art computer aided hardware design tool can be in so-called "behavioral HDL" for modeling hardware but in many cases cannot be synthesized by existing synthesis programs into a gate-level representation of the hardware.

4. Prior art computer aided hardware design tools attempt to generate designs which only apply to a single manufacturer hardware family, such as the creation of an XNF file for the Xilinx XC4000 FPGA family.

5. The language employed by prior art computer aided hardware design tools has added and limited so many constructs that it is difficult to consider the employed language as the high-level programming language purportedly being emulated. That is, the result language is more like a new specialized HDL.

Considered in more detail, one prior art computer aided hardware design tool which purports to enable persons to render hardware designs in a high-level programming language is Transmogrifier (TMCC), a tool developed in 1994–1995 at the University of Toronto, Canada. A comprehensive compiler typically requires at least ten times the 4,900 lines of code which comprise TMCC. TMCC does not support such common C-type programming language features as "do" loops, "for" loops, local or global arrays (i.e., the [ ] operator), the operators ->, unary &, unary *, etc.

Another prior art computer aided hardware design tool is NLC developed at Ecole Polytechnique Federale de Lausanne, Switzerland in 1994–1995. The code for NLC is based on the public domain compiler known as GNU. Like Transmogrifier, NLC supports a severely restricted subset of C-type programming language, for example, "for" loop bounds must be known at compile time, and functions cannot return values. The NLC library generates hardware designs only in XNF format for the Xilinx XC4000 FPGA family.

A prior art computer aided design tool for hardware which purports to be a high-level programming language is Handel-C, originally developed at the Computing Laboratory of Oxford University, England in 1995–1996 and presently supported by Embedded Solutions Limited in Berkshire, England. Although Handel-C has been described by its developers as a subset of ANSI C with some Occam-like extensions, the vast majority of ANSI C programs cannot be processed by Handel-C. For example, functions in Handel-C must be declared in main, have no return values, and have no parameters. There are no structs, unions, enums, struct bit fields, character constants, externs, pointers, etc. The output of Handel-C is in XNF format for the Xillinx XC4000 FPGA family. Since the language is so unlike a high-level programming language, Handel-C is better classified as an HDL for the xilinx XC4000 FPGA family.

A further prior art computer aided hardware design tool is XC. XC was developed at Giga Operations Corporation in Berkeley, Calif. XC appears to be generally disclosed in Taylor, U.S. Pat. No. 5,535,342 issued on Jul. 9, 1996 and in Taylor et al., U.S. Pat. No. 5,603,043 issued on Feb. 11, 1997, both assigned to Giga Operations. There is little resemblance to C-type programming language. XC does not appear to implement structures, pointers, multidimensional arrays, unary &, unary *, etc., as evidenced by various examples published by Giga Operations at its web site. The output of XC is targeted only at the XC4000 board manufactured by Giga Operations that incorporates the Xilinx XC4000 FPGA family.

Finally, an analysis of the prior art would be incomplete without mention of the JRS ANSI C to VHDL Translator (JRS) developed at JRS Research Laboratories, Inc., Orange, Calif. in 1996. JRS appears to handle a wider range of high-level programming language features than other known prior art attempts but still lacks such standard features as multidimensional arrays, abstract declarators, automatic type conversions, pointers to arrays, pointers to functions, functions returning pointers, variable-length argument lists, and "goto" statements. An even more significant deficiency of JRS is that the output of JRS is in general not synthesizable VHDL. JRS utilizes constructs in VHDL considered "behavioral VHDL," that are useful to describe hardware for simulation, but in general cannot be implemented into gate-level hardware representations by existing synthesis tools. As such, JRS is appropriately classified as a language translator, not a compiler that outputs realizable hardware designs. JRS does not address register transfer level (RTL) HDL problems of translating a high-level language to a hardware design.

Consequently, there is a long-felt but unsolved need for a system in which a hardware design can be rendered in a high-level programming language in a way to enable the full power of that language to be employed as a computer aided design tool for hardware. There is also a concomitant need for a computer aided design tool for hardware which is familiar and therefore easier to use than HDLs and which is nevertheless universal in that the resulting hardware designs can be implemented by a broad range of hardware manufacturers.

SUMMARY OF THE INVENTION

The present invention provides a solution to the problem of facilitating the design of an actual hardware implementation for digital circuits using a high-level programming language by providing in one embodiment a system for converting a C-type language program to a hardware design implementation, such as an FPGA or other programmable logic or an ASIC. A method in accordance with one embodiment of the invention comprises the steps of creating an algorithmic representation for a preliminary hardware design in a given C-type programming language and compiling the C-type programming language description into a register transfer level (RTL) hardware description language (HDL) design which can be synthesized. Preferably, the method of the invention additionally comprises the step of synthesizing the HDL design into a gate-level hardware representation using a conventional synthesis program to interpret the HDL design.

In order to produce an actual hardware implementation, the method in accordance with the invention preferably further comprises the step of using conventional physical design tools to implement the gate-level hardware representation as an actual hardware implementation. These physical design tools include a place and route program. In the case of an FPGA, the physical design tools also include a hardware configuration system which processes the file produced by the place and route program and creates a bit stream to personalize the FPGA. In the case of an ASIC, the physical design tools include a place and route program for creating a file for patterning an integrated circuit mask for use in fabricating the ASIC.

The C-type programming language used to render an algorithmic representation for the preliminary hardware design may be any standard C-type programming language including ANSI C, B, C++, Java, Kernighan & Ritchie C, and Objective C. The method of the invention is robust in that the method converts any typical hardware design rendered with the C-type programming language into a standard HDL. The standard HDLs include Verilog, VHDL, ABEL, CUPL, AHDL, MACHX, and PALASM. The method in accordance with the invention first converts the preliminary hardware design to a register transfer level HDL, which enables the HDL design to be synthesized into a gate-level hardware representation using a standard synthesis program and then implemented a an actual hardware implementation using conventional physical design tools. In accordance with the invention, an embodiment of apparatus comprising a personal computer or workstation and executable code that implements the method of the inventing is also provided.

The method in accordance with the invention can further comprise simulating the HDL synthesizable design prior to synthesizing the HDL design. Any conventional simulation program used to simulate a standard HDL design can be employed for simulating the hardware design converted from a rendition in C-type programming language to HDL. This enables the design originally rendered in a C-type programming language to be simulated and the design to be modified before the hardware is actually synthesized and implemented using conventional physical design tools. Consequently, hardware designs rendered in the C-type programming language can be optimized before the hardware implementation phase. Unlike the prior art, the method of the invention enables a hardware design originally rendered in a C-type programming language to be both simulated and implemented in an actual hardware implementation. The apparatus in accordance with the invention can also be utilized to simulate the HDL synthesizable design following compilation to HDL using code that executes the standard simulation program.

In a preferred embodiment of the method in accordance with the invention, compilation of the C-type programming language into HDL comprises mapping predetermined C-type programming language expressions to functionally equivalent HDL program language expressions, assigning input/output as defined in the C-type program to specific wires in the HDL synthesizable design, and configuring in the HDL synthesizable design an interface for the gate-level hardware representation. This is sufficient for basic hardware designs rendered in the C-type programming language.

Additionally, efficient conversion of basic hardware designs from the C-type programming language to HDL preferably entails compilation of a plurality of selected C-type functions that can execute simultaneously into a plurality of executable HDL program language expressions that operate in parallel. Efficient conversion further entails compilation of a plurality of interdependent C-type functions into a plurality of executable HDL program language expressions that operate either simultaneously or sequentially in a data processing pipeline. Preferably, in order to effect efficient conversion, a callable C-type function is also compiled into an executable HDL program language expression that is executed either synchronously or a synchronously on the occurrence of an external event.

In the preferred embodiment of the method in accordance with the invention, compilation can comprise compiling a C-type program control flow into an HDL state machine. The method further comprises assigning input/output as defined in the C-type program to specific wires in the HDL synthesizable design and configuring in the HDL synthesizable design an interface for the gate-level hardware representation.

Also, the C-type program is preferably analyzed for determining the presence of any C-type pointers in the C-type program and compiling any C-type pointers and pointer indirection into an HDL state-machine-based memory access protocol. Therefore, unlike prior art computer aided hardware design tools, the method in accordance with the invention supports the use of memory structures and pointers typically employed in C-type programming language during the original rendering of the hardware design.

Additionally, the C-type program is preferably analyzed for determining the presence of any non-addressable variables in the C-type program and mapping any non-addressable variables onto hardware registers formed in HDL. Similarly, the C-type program is also analyzed for determining the presence of any addressable variables in the C-type program and mapping any addressable variables onto addressable hardware memory and/or an addressable array of hardware registers formed in HDL.

Finally, the C-type program is preferably analyzed for determining the presence of any complicated C-type mathematical operations in the C-type program and compiling multiple occurrences of any complicated C-type mathematical operation into a given HDL functional block that implements such an operation invoked on each occurrence by different states driven by the state machine. The complicated C-type mathematical operations include integer operations, such as signed and unsigned multiplication, signed and unsigned division, signed and unsigned remainder operation, variable-shift left shift, variable-shift right shift with or without sign extension, etc., and floating point operations, such as addition, subtraction, subtraction from zero (unary−), multiplication, division, and conversions involving floating point types. The given HDL functional block is effectively re-used to provide resource-sharing for conversion to an efficient HDL synthesizable design.

Preferably, compilation in accordance with the method of the invention employs state machines for efficient conversion from the C-type programming language to the HDL program language. More particularly, a plurality of selected C-type functions that can execute simultaneously are compiled into a plurality of HDL state machines that operate in parallel. A plurality of selected C-type functions that can execute simultaneously are further preferably compiled into a plurality of HDL state machines that operate in parallel. Also, a plurality of interdependent C-type functions are compiled into a plurality of executable HDL program language expressions that operate either simultaneously or sequentially in a data processing pipeline. A callable C-type function is also preferably compiled into at least one executable HDL state machine which is executed either synchronously or a synchronously on the occurrence of an external event.

Also in accordance with the present invention, a solution is provided to the problem of facilitating the design of an actual hardware implementation using any high-level programming language by providing in one embodiment a system for initially translating from an algorithmic representation for a hardware design in any given standard high-level programming language to an algorithmic representation for the hardware design in a C-type programming language and then converting the C-type language program to a hardware design implementation, such as an FPGA or other programmable logic or an ASIC. Standard high-level programming languages that can be translated to a C-type programming language utilizing conventional compilers include APL, Ada, Algol, B, Basic, Kernighan & Ritchie C, C++, CLOS, COBOL, Clu, Common Lisp, Coral, Dylan, Eiffel, Emacs Lisp, Forth, Fortran, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC.

Accordingly, the invention also provides in one embodiment a method which comprises the steps of creating an algorithmic representation for a preliminary hardware design in a given high-level programming language, translating the high-level programming language preliminary hardware design into an algorithmic representation for the preliminary hardware design in a C-type programming language, and compiling the C-type programming language description into a register transfer level HDL design which can be synthesized. Preferably, the method of the invention additionally comprises the step of synthesizing the HDL design into a gate-level hardware representation using a conventional synthesis program to interpret the HDL design. In order to produce an actual hardware implementation, the method in accordance with the invention preferably further comprises the step of using conventional physical design tools to implement the gate-level hardware representation as an actual hardware implementation.

The steps of compiling the C-type programming language description for the preliminary hardware design into an HDL synthesizable design and synthesizing the HDL design using a conventional synthesis program are identical to the steps performed if the hardware design were initially rendered in the C-type programming language. Also, the step of then implementing the gate-level representation resulting from synthesizing the HDL design as an actual hardware implementation using conventional physical design tools is identical to the step performed after synthesis in the case where the algorithmic representation for the hardware design was initially rendered in the C-type programming language. This enables hardware designs rendered in virtually any standard high-level programming language to be implemented in hardware. Also, the method can further comprise simulating the HDL synthesizable design prior to synthesizing the HDL design. In accordance with the invention, an embodiment of apparatus comprising a personal computer or workstation and executable code that implements the method of the invention is also provided.

The system in accordance with the invention has significant advantages compared to the purported high-level language computer aided hardware design tools known in the prior art. The system of the invention is the only ANSI C compiler. The system in accordance with the invention supports C-type programming language pointers and pointer arithmetic, variable argument functions, pointers to functions, recursion, structure assignment, and floating point arithmetic. The system of the invention also supports C-type programming language structures, unions, enums, and typedefs, as well as the complete set of C-type programming language control flow operators, including "for," "while", and "do" loops, "if", "switch", "break", "continue", "goto", and "return". The system in accordance with the invention also supports C char type, including strings literals, character constants, character arrays, and character pointers. All basic C integer types and type conversions are supported by the system of the invention, and the system follows ANSI C rules for integer promotion in operations. The system in accordance with the invention converts an ANSI C algorithmic representation for a hardware design to a synthesizable hardware design in HDL, such as Verilog, and, therefore, is compliant with multiple hardware technologies, whereas the known prior art computer aided hardware design tools generate hardware- and/or manufacturer-specific files, such as an XNF file for the Xilinx XC4000 FPGA family. Unlike prior art computer aided hardware design tools that generate "behavioral VHDL" models that can only be simulated, the system of the invention enables both simulation and synthesis that leads to an actual hardware implementation.

BRIEF DESCRIPTION OF THE DRAWINGS

The above and other objectives and features and the concomitant advantages of the present invention will be better understood and appreciated by those skilled in the art in view of the description of the preferred embodiments given below in conjunction with the accompanying drawings. In the drawings:

FIG. 1 illustrates one embodiment of the computer aided hardware design tool for compiling C-type programming language into hardware description language (HDL) to enable conversion from a hardware design in a high-level programming language to a synthesizable HDL hardware design in accordance with the invention;

FIG. 2 is a flowchart of one embodiment of the method in accordance with the invention for compiling high-level programming language, such as C-type programming language, into HDL to enable conversion from a hardware design in a high-level programming language to a synthesizable HDL hardware design;

The remainder of the figures illustrates various examples of compilation of C-type programming language into a register transfer level (RTL) HDL to enable conversion from a hardware design in a high-level programming language to a synthesizable HDL hardware design by the computer aided hardware design tool in accordance with the invention shown in FIG. 1, specifically:

FIG. 3A shows an initial C-language description having simple expression functions ("func1" and "func2");

FIG. 3B shows HDL created by compiling the C-type program shown in FIG. 3A, illustrating simple expression functions ("func1" and "func2") which do not require state machines implemented in RTL Verilog;

FIG. 4A shows an initial C-language description having "non-simple" expression functions ("func1", "func2", and "func3") using data conversions and "if-then-else" statements;

FIG. 4B shows HDL created by compiling "non-simple" expression functions ("func1", "func2", and "func3") of the C-type program shown in FIG. 4A, which do not require state machines implemented in RTL Verilog;

FIG. 5A shows an initial C-language description using "for" loop expressions and non-addressable variables;

FIG. 5B, comprising FIGS. 5B1–5B4, shows HDL created by compiling the C-type program shown in FIG. 5A, including a "for" loop and non-addressable variables mapped into registers using a state machine implemented in RTL Verilog;

FIG. 6A shows an initial C-language description with input/output (I/O) function calls;

FIG. 6B shows HDL created by compiling ANSI C printf and scanf arguments of the C-type program shown in FIG. 6A into wire assignments in RTL Verilog;

FIG. 7A shows an initial C-language description with multiple occurrences of complicated mathematical operations;

FIG. 7B, comprising FIGS. 7B1–7B4, shows HDL created by compiling the C-type program shown in FIG. 7A into functional blocks in RTL Verilog for complicated mathematical operations invoked on each occurrence by different states of the generated state machine;

FIG. 8A shows an initial C-language description having interdependent C-type functions;

FIG. 8B shows HDL created by compiling the C-type program shown in FIG. 8A into a simple data processing pipeline implemented in RTL Verilog;

FIG. 8C is a block diagram of the data processing pipeline implemented in the RTL Verilog shown in FIG. 8B;

FIG. 9A shows an initial C-language description having floating point arithmetic;

FIG. 9B, comprising FIGS. 9B1–9B4, shows HDL created. by compiling the C-type program shown in FIG. 9A, illustrating subtraction from zero (unary−), addition, multiplication, subtraction, division, and conversion operations involving floating point arithmetic in RTL Verilog;

FIG. 10A shows an initial C-language description of two complex number addition with structures, including structure assignments, structure function parameters, and structure function return values;

FIG. 10B, comprising FIGS. 10B1–10B5, shows HDL created by compiling the C-type program shown in FIG. 10A, illustrating structure function parameters and structure return values implemented in hardware registers in RTL Verilog;

FIG. 11A, comprising FIGS. 11A1–11A2, shows an initial C-language description having pointers and pointer indirection;

FIG. 11B, comprising FIGS. 11B1–11B8, shows HDL created by compiling the C-type program shown in FIG. 11A, illustrating a non-addressable variable "p" implemented in a hardware register, addressable variables "pTree" and "Nodes" implemented in memory locations identified by addresses of "'_pTree" and "'_Nodes" in externally addressable hardware memory, and "while" loops, "if-then-else" statements, "return" statements, and function calls in RTL Verilog;

FIG. 12A shows an initial C-language description with a callable function;

FIG. 12B shows HDL created by compiling the C-type program shown in FIG. 12A, illustrating detection of the event "event_occurred" on the occurrence of the positive edge of a clock signal using "always" statements;

FIG. 13A shows an initial C-language description having a callable function and a pragma which directs compilation for asynchronous event detection;

FIG. 13B shows HDL created by compiling the C-type program shown in FIG. 13A illustrating detection of the event "event_occured" when the signal "run_on_event" transitions from false to true, which occurs a synchronously with the positive edge of a clock signal;

FIG. 14A shows an initial C-language description with parallel processing of two complex functions ("func1" and "func2") which do not interfere with each other;

FIG. 14B, comprising FIGS. 14B1–14B2, shows HDL created by compiling the C-type program shown in FIG. 14A, illustrating parallel processing of two complex non-interfering functions with two state machines implemented in RTL Verilog running simultaneously;

FIG. 15A shows an initial C-language description having variable argument function calls;

FIG. 15B, comprising FIGS. 15B1–15B7, shows HDL created by compiling the C-type program shown in FIG. 15A, illustrating variable argument function calls using a temporary parameter storage location in addressable memory implemented in RTL Verilog and using on-chip Xilinx RAM macros;

FIG. 16A shows an initial C-language description having a recursive function and recursive function call;

FIG. 16B, comprising FIGS. 16B1–16B5, shows HDL created by compiling the C-type program shown in FIG. 16A, illustrating a recursive function call to "MoveRing" utilizing addressable memory and a "stack_pointer" hardware register implemented in RTL Verilog;

FIG. 17A shows an initial C-language description having a function-call-by-pointer;

FIG. 17B, comprising FIGS. 17B1–17B2, shows HDL created by compiling the C-type program shown in FIG. 17A, illustrating the C-language pointer function implemented using a hardware register "state" assignment value corresponding to a first state of function "_main_f" in RTL Verilog;

FIG. 18A shows an initial C-language description having addressable variables;

FIG. 18B, comprising FIGS. 18B1–18B5, shows HDL created by compiling the C-type program shown in FIG. 18A, illustrating addressable memory implemented utilizing a hardware register file in RTL Verilog;

FIG. 19A shows an initial C-language description having multiple interdependent C-type functions;

FIG. 19B, comprising FIGS. 19B1–19B3, shows HDL created by compiling the C-type program shown in FIG. 19A, comprising multiple state machines implemented in RTL Verilog that operate in a data processing pipeline;

FIG. 19C is a block diagram of the data processing pipeline implemented by the RTL Verilog shown in FIG. 19B;

FIG. 20A shows an initial C-language description for a blinking light counter hardware design implemented utilizing a Xilinx FPGA on an APS-X84 hardware board;

FIG. 20B, comprising FIGS. 20B1–20B2, shows HDL created by compiling the C-type program shown in FIG. 20A for a blinking light counter hardware design implemented utilizing a Xilinx FPGA on an APS-X84 hardware board;

FIG. 21A shows an initial C-language description for a callable function;

FIG. 21B shows HDL created by compiling the C-type program shown in FIG. 21A illustrating the use of a state machine to implement a cumulative adder function in RTL Verilog;

FIG. 21C shows HDL created by compiling the C-type program shown in FIG. 21A, illustrating the use of a state machine to implement the cumulative adder function in VHDL;

FIG. 22A shows an initial C-language description for reading a memory word located at the memory address referenced by the variable parameter "p" which has an ANSI C "pointer" type;

FIG. 22B shows HDL created by compiling the C-type program shown in FIG. 22A, illustrating reading a memory word located at the memory address referenced by the variable parameter "p", which has an ANSI C "pointer" type, in RTL Verilog;

FIG. 22C shows a gate-level schematic comprised of clock enabled flip-flop hardware registers and control logic for reading 4-bit data located in external addressable memory at the location pointed by the 4-bit address, illustrating the compilation of the C-type program shown in FIG. 22A to a gate-level description;

FIG. 23A shows an initial C-language description for writing the content of the parameter variable "d" into a memory word located at the memory address referenced by the variable parameter "p" which has an ANSI C "pointer" type;

FIG. 23B shows HDL created by compiling the C-type program shown in FIG. 23A, which writes the content of the parameter variable "d" into a memory word located at the memory address referenced by the variable parameter "p", which has an ANSI C "pointer" type, in RTL Verilog;

FIG. 23C shows a gate-level schematic comprised of clock enabled flip-flop hardware registers and control logic for writing 4-bit data into the external addressable memory at the addressable memory location pointed by the 4-bit address, illustrating the compilation of the C-type program shown in FIG. 23A to a gate-level description;

FIG. 24A shows an initial C-language description for reading a structure member by using pointer to structure;

FIG. 24B shows HDL created by compiling the C-type program shown in FIG. 24A for reading a structure member by using pointer to structure in RTL Verilog;

FIG. 24C shows a gate-level schematic comprised of clock enabled flip-flop hardware registers, control logic, and an adder for providing a constant offset to a given address for reading 4-bit data from the external addressable memory at the addressable memory location pointed by the 4-bit address plus offset, illustrating the compilation of the C-type program shown in FIG. 24A to a gate-level description;

FIG. 25A shows an initial C-language description for writing into a structure member using pointer to structure;

FIG. 25B shows HDL created by compiling the C-type program shown in FIG. 25A for writing into a structure member using pointer to structure in RTL Verilog;

FIG. 25C shows a gate-level schematic comprised of clock enabled flip-flop hardware registers, control logic, and an adder for providing a constant offset to a given address for writing 4-bit data into the external addressable memory at the addressable memory location pointed by the 4-bit address plus offset, illustrating the compilation of the C-type program shown in FIG. 25A to a gate-level description;

FIG. 26A shows an initial C-language description for reading a structure member from memory using a dot (".") operation;

FIG. 26B shows HDL created by compiling the C-type program shown in FIG. 26A for reading a structure member from memory using a dot (".") operation in RTL Verilog;

FIG. 26C shows a gate-level schematic comprised of clock enabled flip-flop hardware registers and control logic for reading 4-bit data from the external addressable memory at an address fixed at compile time on output wires "A0–1", illustrating the compilation of the C-type program shown in FIG. 26A to a gate-level description;

FIG. 27A shows an initial C-language description for writing to a structure member located in memory;

FIG. 27B shows HDL created by compiling the C-type program shown in FIG. 27A for writing to a structure member located in memory in RTL Verilog; and FIG. 27C shows a gate-level schematic comprised of clock enabled flip-flop hardware registers and control logic for writing 4-bit data into the external addressable memory at an address fixed at compile time on output wires "A0–1", illustrating the compilation of the C-type program shown in FIG. 27A to a gate-level description.

DETAILED DESCRIPTION OF THE PREFERRED EMBODIMENTS

The computer aided hardware design tool in accordance with the various embodiments of the invention is executed on a computer 12, as shown in FIG. 1. The computer aided hardware design tool in accordance with one embodiment of the invention is preferably a 32-bit electronic computer aided design (ECAD) application compatible with a Microsoft Windows 95 or Microsoft NT 3.51 or later operating system available from Microsoft Corporation located in Redmond, Wash. The computer 12 comprises a minimum of 16 MB of random access memory (RAM) and preferably include 32 MB of RAM. The computer 12 also comprises a hard disk drive having 40 MB of free storage space available.

In an alternative embodiment, the computer aided hardware design tool can be available by connecting to the web site of the supplier of the computer aided hardware design tool. The computer 12 is provided with an Internet connection, such as a modem, for connection to the web site of the supplier of the computer aided hardware design tool. The computer aided hardware design tool can be ported to the web and executed on a web server. Therefore, the requirements for computer 12 would be reduced.

As shown in FIG. 1, means for displaying information preferably in the form of a monitor 14 connected to computer 12 is also provided. The monitor 14 can be a 640×480, 8-bit (256 colors) VGA monitor and is preferably an 800× 600, 24-bit (16 million colors) SVGA monitor. The computer 12 is also preferably connected to a CD-ROM drive 16. As shown in FIG. 1, a keyboard 18 and a mouse 20 are provided for entry of an algorithmic representation for a hardware design in a high-level programming language, such as ANSI C, as well as mouse-driven navigation between menus displayed by the computer aided hardware design tool. The mouse 20 also enables persons utilizing the computer aided hardware design tool (referred to hereafter as "users") to select simulation of a hardware design prior to implementation of a hardware design.

The computer aided hardware design tool in accordance with the invention enables a user to design hardware utilizing a high-level programming language, such as ANSI C. The fundamentals of ANSI C programming language are described, for example, in Kernighan, B. W., and Ritchie, D. M., *The C Programming Language*, Prentice Hall: New Jersey, 2d Ed., 1988. The computer aided hardware design tool of the invention then compiles the high-level program for the hardware design into a register transfer level (RTL) hardware description language (HDL) design which can be synthesized. The HDL may be, for example, Verilog, the fundamentals of which are described in Palnitkar, S., *Verilog HDL: A Guide to Digital Design and Synthesis*, SunSoft Press, Prentice Hall, 1996. For general information regarding compilers, see, for example, Aho, A. V., and Ullman, J. D., *Principles of Compiler Design*, Addison-Wesley Publishing Company, 2d Printing, March, 1978, and Hunter, R., *The Design and Construction of Compilers*, John Wiley & Sons, 1981.

The method in accordance with the invention for rendering a hardware design in a standard high-level programming language and converting that design into an actual hardware implementation will now be described. In accordance with one embodiment of the method of the invention, a user initially renders a preliminary hardware design as an algorithmic representation in a given standard high-level programming language. If the high-level programming language is not a C-type programming language, the high-level programming language preliminary hardware design is next translated from a preliminary hardware design rendered in the high-level programming language to a preliminary hardware design in a C-type programming language. Then, the C-type programming language preliminary hardware design is converted to a gate-level hardware representatior which can be reduced to an actual hardware implementation, such as an FPGA or other programmable logic or an ASIC, using conventional physical design tools. This enables hardware designs rendered in virtually any standard high-level programming language to be implemented in hardware.

Considered in more detail, one embodiment of the method in accordance with the invention is shown in FIG. 2. A user can initially create an algorithmic representation corresponding to a preliminary hardware design using a given standard high-level programming language, as indicated by the step 30. Preferably, the high-level programming language is a programming language that can be translated into a C-type programming language, such as ANSI C, utilizing a conventional compilation program. Standard high-level programming languages that can be compiled to a C-type programming language utilizing conventional compilers include APL, Ada, Algol, B, Basic, Kernighan & Ritchie C, C++, CLOS, COBOL, Clu, Common Lisp, Coral, Dylan, Eiffel, Emacs Lisp, Forth, Fortran, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC.

As indicated by the step 32 shown in FIG. 2, the high-level programming language algorithmic representation corresponding to the preliminary hardware design produced at step 30 is next translated into a C-type programming language preliminary hardware design. Translation results in a C-type programming language preliminary hardware design file, as indicated by the numeral 34 shown in FIG. 2. Preferably, the C-type programming language into which the high-level programming language preliminary hardware design is translated is ANSI C, such that an ANSI C preliminary hardware design file is produced at step 34.

Alternatively, the user can initially create the algorithmic representation corresponding to the preliminary hardware design in a C-type programming language, as indicated by the step 36 shown in FIG. 2. Preferably, the C-type programming language is ANSI C, such that an ANSI C preliminary hardware design file is produced at step 34. Therefore, the method in accordance with the invention enables a user to directly design hardware in a C-type programming language, preferably ANSI C programming language This avoids the need at step 32 to translate from a different high-level programming language to a C-type programming language, for example, ANSI C.

As shown in FIG. 2, the C-type programming language preliminary hardware design file 34 can be run through a C compiler, as indicated by the step 38 shown in FIG. 2. This enables the user to verify or debug the C-type programming language preliminary hardware design.

Whether an algorithmic representation of a preliminary hardware design is initially created in a given standard high-level programming language translatable to a C-type programming language or created directly in the C-type programming language, such as ANSI C, the preliminary hardware design is compiled into a hardware description language (HDL) synthesizable design, as indicated by the step 40 shown in FIG. 2. For example, the C-type programming language preliminary hardware design can be compiled into to a Verilog synthesizable design to produce an RTL hardware design file 42, as shown in FIG. 2. The compilation of the C-type programming language preliminary hardware design into a synthesizable HDL design will be described in more detail below.

After the HDL design is produced, the method in accordance with the invention preferably comprises the step of simulating the HDL synthesizable design prior to synthesizing the HDL design, as indicated by the step 44 shown in FIG. 2. If the user desires to modify the preliminary hardware design in view of the simulation, the user renders a modified hardware design using either the given standard high-level programming language at step 30 or the C-type programming language, such as ANSI C at step 36.

After an acceptable HDL design is obtained, the RTL hardware design file 42 representative of the HDL design is synthesized into a gate-level hardware representation using a conventional synthesis program to interpret the HDL design, as indicated by the step 46 shown in FIG. 2. This typically requires preselection of a particular hardware technology, such as an FPGA or ASIC, prior to the execution of the synthesis program. Synthesis programs are commercially available and do not constitute the invention per se. Therefore, the synthesis programs will not be described in detail.

In order to produce an actual hardware implementation, the method in accordance with the invention preferably further comprises the step of using conventional physical design tools to implement the gate-level hardware representation as an actual hardware implementation. These physical design tools include a place and route program. In the case of an FPGA, the physical design tools also include a hardware configuration system which processes the file produced by the place and route program and creates a bit stream to personalize the FPGA, as indicated by the step 48 shown in FIG. 2. In the case of an ASIC, the physical design tools include a place and route program for creating a file for patterning an integrated circuit mask for use in fabricating the ASIC, as indicated by the step 50 shown in FIG. 2. Physical design tools utilized to produce actual hardware implementations are commercially available and do not constitute the invention per se. Therefore, the physical design tools will not be described in detail. As shown in FIG. 2, an actual hardware implementation is produced, as indicated by the numeral 52.

A detailed description of the steps required for compiling a C-type programming language algorithmic representation for a preliminary hardware design into an HDL synthesizable design will now be provided by way of example. In the example, the C-type programming language is ANSI C and the HDL is preferably Verilog. However, it will be understood by persons skilled in the art that the principles of compiling a C-type programming language algorithmic representation for a preliminary hardware design into an HDL synthesizable design apply to other C-type programming languages besides ANSI C. For example, the C-type programming language may alternatively be any standard C-type programming language including ANSI C, B, C++, Java, Kernighan & Ritchie C, and Objective C. Moreover, the HDL synthesizable design into which the C-type programming language algorithmic representation for the preliminary hardware design is translated may be other than Verilog. For example, the HDL may alternatively be any standard HDL including VHDL, ABEL, CUPL, AHDL, MACHX, and PALASM.

The following describes compilation of the operations and functions that comprise ANSI C high-level programming language needed for hardware design into an exemplary HDL, namely, Verilog. As will be described later, the HDL may also be a different HDL, such as VHDL.

The method in accordance with the invention comprises mapping predetermined C-type programming language expressions to functionally equivalent HDL program language expressions. FIG. 3A illustrates a simple expression function in ANSI C programming language, and FIG. 3B represents the function shown in FIG. 3A compiled into RTL Verilog HDL.

In this regard, statements in ANSI C high-level programming language used to render hardware designs vary. For example, various ANSI C functions can be classified "simple expression functions," such as "func1" and "func2" shown in FIG. 3A. These functions have no side effects, do not require static memory access in HDL, and do not require a state machine in HDL to run. The determination of whether or not "simple expression functions" are present is performed by the code that appears in microfiche Appendix A in file OSYMBOLS.CPP at lines 5052–5232. Consequently, these functions can be compiled into simple RTL Verilog continuous assignments "result_func1" and "result_func2", as shown in FIG. 3B. Compilation of the ANSI C expressions to functionally equivalent HDL expressions is performed by the code shown in the source code listing which appears in microfiche Appendix A in file GCODE.CPP at lines 5889–5990.

Furthermore, FIG. 3A illustrates C-type programming language expressions "a+b^c<<3" and "(a^b) & c". In these expressions, "a", "b", and "c" are integer variables. FIG. 3B illustrates that these expressions are mapped into RTL Verilog expressions "((param_func1_a+param_func1_b) ^(param_func1_c <<16'd3))" and "((param_func2_a^param_func2_b) & param_func2_c)", respectively. Also, integer variables "a", "b", and "c" in FIG. 3A are mapped onto wires "param_func1_a", "param_func1_b", and "param_func1_c" for ANSI C function "func1" and wires "param_func2_a", "param_func2_b", and "param_func2_c" for ANSI C function "func2", respectively. This is because the ANSI C functions "func1" and "func2" are simple C-type functions which do not require implementation in RTL Verilog as state machines. The same mapping would occur if variables "a", "b", and "c" were defined as ANSI C floating point, pointer, enum, or union variables.

Additionally, FIGS. 3A and 3B illustrate assigning input/output as defined in the C-type program to specific wires in the HDL synthesizable design. The determination of whether or not C-type variables are to be mapped onto input/output wires of the generated RTL Verilog module is performed by the code shown in the source code listing which appears in microfiche Appendix A in file OSYMBOLS.CPP at lines 4802–5001. For example, parameters "a", "b", and "c" of the function "func1" shown in FIG. 3A are assigned to input wires, namely, "param_func1_a", "param_func1_b", and "param_func1_c", respectively, of the module generated in RTL Verilog, as shown in FIG. 3B. Also, the result of the function "func1" (FIG. 3A) is assigned to an output wire "result_func1" in RTL Verilog (FIG. 3B).

FIGS. 3A and 3B also illustrate a plurality of selected C-type functions that can execute simultaneously, which are compiled into a plurality of executable HDL program language expressions that operate in parallel. The determination of whether or not a plurality of simultaneously executable C-type functions is present is performed by the code shown in the source code listing which appears in microfiche Appendix A in file OSYMBOLS.CPP at lines 5052–5232. Compilation of the plurality of simultaneously executable C-type functions to a plurality of HDL expressions that operate in parallel is performed by the code shown in the source code listing which appears in microfiche Appendix A in file GCODE.CPP at lines 5889–5990.

FIGS. 4A and 4B also illustrate mapping predetermined C-type programming language expressions to functionally equivalent HDL program language expressions. FIGS. 4A and 4B show compilation from ANSI C (FIG. 4A) into RTL Verilog HDL (FIG. 4B) where no HDL state machine is required to implement the conversion of ANSI C functions. These ANSI C functions have no side effects, do not require static memory access in HDL, and do not require a state machine in HDL to run. The advantage of utilizing state machines only when they are needed is that the compiled HDL design runs faster in hardware.

However, in contrast to the ANSI C functions shown in FIG. 3A, the ANSI C functions shown in FIG. 4A cannot be classified as "simple expression functions," because they have data conversions or comprise at least one "if-then-else" statement. For example, "func1" shown in FIG. 4A contains a comparison operator that has different semantics in ANSI C than in RTL Verilog (i.e., utilizes temporary registers in Verilog). Therefore, "func1" cannot be classified as a "simple expression function," but it can be classified as a "function outside the HDL state machine." These functions, such as "func1", cannot be converted into one continuous assignment in HDL but must instead be converted into multiple HDL statements within an "always" block. Note that FIGS. 4A and 4B also illustrate assigning input/output as defined in the C-type program to specific wires in the HDL synthesizable design, as described earlier in connection with FIGS. 3A and 3B.

FIGS. 5A and 5B illustrate compiling a C-type program control flow into an HDL state machine. FIG. 5A shows a simple "for" loop in ANSI C, and FIG. 5B shows compilation of the "for" loop into RTL Verilog HDL. The determination of whether or not a C-type program control flow that is to be converted to an HDL state machine is present is performed by the code shown in the source code listing which appears in microfiche Appendix A in file OSYMBOLS.CPP at lines 3735–4271.

As shown in FIG. 5B, the "for" loop is implemented in RTL Verilog using a state machine. A state machine is utilized to implement the ANSI C program control flow, because the state machine provides the mechanism to execute the ANSI C operators in the required sequence. Compilation of the C-type program control flow into the HDL state machine is performed by the code shown in the source code listing which appears in microfiche Appendix A in file GCODE.CPP at lines 5930–6250.

FIGS. 5A and 5B also illustrate mapping non-addressable variables onto hardware registers formed in HDL as a result of compilation. The compilation is performed by the code shown in the source code listing which appears in microfiche Appendix A in file OSYMBOLS.CPP at lines 4802–5001. The non-addressable variables "n", "i", and "sum" employed in the ANSI C program shown in FIG. 5A are mapped onto hardware registers "_sum1_n", "_2_sum_i", and "_2_sum1_sum", respectively, shown in FIG. 5B.

Additionally, FIGS. 5A and 5B illustrate mapping addressable variables onto addressable on-chip static memory formed in HDL as a result of compilation. The compilation is performed by the code shown in the source code listing which appears in microfiche Appendix A in file OSYMBOLS.CPP at lines 4802–5001. FIG. 5A shows that the ANSI C program includes an array "array" which is mapped onto addressable on-chip static memory having a starting memory address "'_5_main_array", as shown in FIG. 5B.

FIGS. 5A and 5B also illustrate assigning input/output as defined in the C-type program to specific wires in the HDL synthesizable design. The determination of whether or not C-type variables are to be mapped onto input/output wires of the generated RTL Verilog module is performed by the code which appears in microfiche Appendix A in file OSYMBOLS.CPP at lines 4802–5001. For example, parameter "n" of the function "sum1" shown in FIG. 5A is assigned to an input wire, namely, "param_sum1_n", of the module generated in RTL Verilog, as shown in FIG. 5B. Also, the result of the function "sum1" (FIG. 5A) is assigned to an output wire "result_sum1" in RTL Verilog (FIG. 5B).

FIGS. 6A and 6B illustrate compilation of standard ANSI C input/output (I/O) function calls into RTL Verilog HDL. The I/O function arguments (namely, "scanf" and "printf" arguments) defined in the ANSI C program shown in FIG. 6A are assigned to specific wires in RTL Verilog, as shown in FIG. 6B.

The input function call "scanf" for reading data into ANSI C variables "a" and "b" shown in FIG. 6A is compiled into RTL Verilog for reading data from input wires, namely, "scanf_0_1_line_19_a" and "scanf_0_2_line_19_b", into registers "_3_main_a" and "_3_main_b", respectively, as shown FIG. 6B. Accordingly, variables "a" and "b" in the ANSI C program (FIG. 6A) are mapped into registers "_3_main_a" and "_3_main_b" in RTL Verilog (FIG. 6B). The output function call "printf" for writing the result of the ANSI C expression "a+b" shown in FIG. 6A is compiled into writing the result of the HDL expression "_3_main_a+_3_main_b" to an output wire, namely, "printf_1_1_line_20" in RTL Verilog, as shown FIG. 6B.

As also shown in FIG. 6B, a Verilog statement "$write ("a+b=% d\n", printf_1_1_line_20);" is preferably generated for the purpose of debugging the generated Verilog code. This statement is not used in connection with synthesis of the HDL design.

FIGS. 7A and 7B illustrate compiling multiple occurrences of a complicated C-type mathematical operation into a given HDL functional block that implements such an operation. The functional block is invoked on each occurrence by different states driven by the state machine.

FIG. 7A shows a C-type programming language expression "a/b+c/d". This expression includes two divisions, namely, "a/b" and "c/d". These divisions share the same divider unit implemented in RTL Verilog HDL. The divider unit is implemented in RTL Verilog, as follows. First, a divider module is defined, namely, "sdivmod16". Second, the divider module "sdivmod16" is instantiated in the module "DivEx" comprising the state machine implemented in RTL Verilog. Third, the shared divider unit is driven employing the different states of the state machine, as shown in FIG. 7B. Since a single divider module is preferably utilized to reduce required hardware resources, the state machine is needed to sequentially multiplex arithmetic parameters to the inputs of the shared divider module in synchronization with the hardware clock. Compilation of the complicated C-type mathematical operation for division into a given HDL functional block for division that is invoked on the occurrence of different states of the state machine is performed by the code shown in the source code listing which appears in microfiche Appendix A in files GDIVMOD.CPP at lines 8487–9243, GEXPR.CPP at lines 7324–7646, and GFLOAT.CPP at lines 9244–9738. Based on the compilation of a division operation disclosed in FIGS. 7A and 7B, it should be apparent to persons skilled in the art how to handle other complicated arithmetic and logic operations, such as signed and unsigned integer multiplication, signed and unsigned integer remainder, variable-shift left shift, variable-shift right shift with or without sign extension, etc.

ANSI C variables "a", "b", "c", and "d" shown in FIG. 7A are defined as integer variables. These variables are mapped onto wires "param_func_a", "param_func_b", "param_func_c", and "param_func_d" of the RTL Verilog module, respectively. The same mapping would occur if variables "a", "b", "c", and "d" were defined as ANSI C floating point, pointer, enum, or union variables.

ANSI C does not support the concept of "pipelining." However, it has been determined that ANSI C constructs can be utilized to define a hardware data processing pipeline.

As shown in FIGS. 8A and 8B, the method in accordance with the invention may also comprise compiling a plurality of interdependent C-type functions into a plurality of executable HDL program language expressions that operate either simultaneously or sequentially in a data processing pipeline. C-type functions are interdependent when the input of one of the functions is dependent upon the output of another function. FIGS. 8A and 8B illustrate compilation of three simple ANSI C functions (FIG. 8A) into a data processing pipeline implemented in RTL Verilog HDL (FIG. 8B).

As shown in FIG. 8C, the data processing pipeline consists of three stages. The first stage of the pipeline corresponds to the ANSI C function "pipeline_stage_1". This first stage is an adder which adds the value "1" to the value from the input wire "_data_in", which corresponds to the ANSI C variable "data_in", and writes the sum into the hardware register "_out1", which corresponds to the ANSI C variable "out1". The second stage of the pipeline corresponds to the ANSI C function "pipeline_stage_2" which uses the output "_out1" and adds that value to itself and writes the sum into the hardware register "_out2" which corresponds to the ANSI C variable "out2". The third stage of the pipeline corresponds to the ANSI C function "pipeline_stage_3" which uses the output "_out2" of the second stage and performs an "XOR" logic function with the value "1234" and writes the result onto the output wire "_data_out" which corresponds to the ANSI C variable "data_out". FIG. 8B illustrates that the three stages of the data processing pipeline are implemented by three "always" blocks in RTL Verilog, which operate simultaneously. Alternatively, the stages of the data processing pipeline implemented in RTL Verilog may be operated sequentially depending upon usage of input signals "run_pipeline_1", "run_pipeline_2", and "run_pipeline_3". The compilation is performed by the code shown in the source code listing which appears in microfiche Appendix A in file OSYMBOLS.CPP at lines 4896–4950.

Variable "data_in" shown in the ANSI C program (FIG. 8A) has "external scope," as defined in the ANSI C standard. The address of "data_in" is not used by any C-type function or for C-type initialization of any variable. Furthermore, "data_in" is never used as an 1-value. That is, "data_in" is used in the ANSI C program as a readable variable, but it is not used as a writable variable. Also, "data_in" is not initialized in the ANSI C program.

Because "data_in" has these attributes, it is mapped onto an input wire "_data_in" of an HDL module, as shown in FIG. 8B. The input wire is utilized as an input wire of a hardware pipeline stage implemented in RTL Verilog (FIG. 8B).

Variable "data_out" shown in the ANSI C program (FIG. 8A) also has "external scope." The address of "data_out" is not used by any C-type function or for C-type initialization of any variable. Furthermore, "data_out" is used only as an 1-value. That is, "data_out" is used in the ANSI C program as a writable variable, but it is not used as a readable variable. Also, "data_out" is not initialized in the ANSI C program.

Since "data_out" has the above attributes, it is mapped onto an output wire "_data_out" of the HDL module, as shown in FIG. 8B. The output wire is utilized as an output wire of the hardware pipeline stage implemented in RTL Verilog (FIG. 8B).

FIGS. 8A and 8B illustrate a simple pipeline. That is, the ANSI C program shown in FIG. 8A is compiled into RTL Verilog without the need for an HDL state machine.

FIGS. 9A and 9B illustrate floating point arithmetic and double precision floating point arithmetic in ANSI C (FIG. 9A) and compilation into RTL Verilog HDL (FIG. 9B). This demonstrates that the method in accordance with the invention can convert floating point operations into a state-machine-based protocol of transactions to an external floating point arithmetic unit (FPU) preferably implemented in adjunct hardware. Since FPUs are commercially available, definition of an FPU in the RTL Verilog generated during compilation of the ANSI C arithmetic operations is not required. Instead, all that is needed is the assignment of output and input wires to such an FPU, which defines an interface between the RTL Verilog generated design and the FPU.

As shown in FIGS. 9A and 9B, each of the ANSI C arithmetic operations is compiled into a sequence of states of the state machine in RTL Verilog. During a first state, the parameters needed for the floating point operations are written to output wires assigned in RTL Verilog, which are read by the external floating point arithmetic unit. During a second state, the state machine awaits completion of performance of the arithmetic operations by the arithmetic unit. During a third state, the results of the floating point arithmetic operations are written by the arithmetic unit onto the input wires defined in RTL Verilog and read.

FIGS. 9A and 9B show compilation from ANSI C into RTL Verilog for subtraction from zero (unary−), addition, multiplication, subtraction, division, and conversion operations, which involve floating point arithmetic. Therefore, in view of the methodology shown in FIGS. 7A, 7B, 9A, and 9B, it will be apparent to persons skilled in the art that all complicated integer and floating point operations can be compiled into RTL Verilog.

FIGS. 10A and 10B illustrate compilation of descriptions with structures, including structure assignment, structure function parameters, and structure function return values, which are commonly employed to implement algorithms, in ANSI C (FIG. 10A) and following compilation into RTL Verilog HDL (FIG. 10B). FIG. 10A shows the addition of two complex numbers implemented as ANSI C structures. The expression "z=add (x, add (x,y))" contains the structure assignment to structure "z", and structures "x" and "y" are employed as structure function parameters of the function "add". Function "add" returns a structure return value which is equal to structure "c". FIG. 10A also illustrates structure members "real" and "image", which are employed both as 1-value (value on the left-hand side of the assignment operation) and r-value (value on the right-hand side of the assignment operation). FIG. 10B illustrates that structure function parameters and structure function return values are implemented utilizing wide (i.e., 32-bit) hardware registers which can store the entire structure, including structure members (i.e., "real" and "image"). Temporary wide (i.e., 32-bit) hardware registers are also utilized for the structure assignment translation to read the r-value structure from external memory and to write the 1-value structure to the external memory. Compilation of structure assignment and structure return values and assignment of structure function parameters is performed by the code shown in the source code listing which appears in microfiche Appendix A in file GEXPR.CPP at lines 8101–8255. It will be understood by persons skilled in the art that the same compilation process can be applied to C-type programming language structure assignment, structure function parameters, and structure function return values in C-type programs which do not require implementation of a state machine in RTL Verilog.

FIGS. 11A and 11B illustrate compiling C-type pointers and pointer indirection into an HDL state-machine-based memory access protocol. FIG. 11A shows C-type pointers, such as local variable "p", return value of function "FindNode", global variable "pTree", and structure members "pLeft" and "pRight". On the one hand, local variable "p" is not addressable, that is, its address is never read. Therefore, this non-addressable variable is mapped onto a hardware register formed in RTL Verilog HDL, namely, "_7_FindNode_p", as shown in FIG. 11B. On the other hand, variable "pTree" is addressable, that is, its address is read in the expression "p=& pTree;", as shown in FIG. 11A. Therefore, this addressable variable is mapped onto a memory location identified by the address "'_pTree" in external addressable hardware memory, as shown in FIG. 11B. Compilation of C-type pointers and pointer indirection into an HDL state-machine-based memory access protocol is performed by the code shown in the source code listing which appears in microfiche Appendix A in files GRW.CPP at lines 10040–10438 and GEXPR.CPP at lines 6724–6750, 7252–7282, and 8101–8255.

Also, "Nodes" is an addressable variable because it is a C-type programming language array. Therefore, this addressable variable is mapped onto a memory location identified by the address "'_Nodes" in external addressable hardware memory, as shown in FIG. 11B.

FIG. 11A also illustrates a "while" loop, "if-then-else" statement, "return", and function call (i.e., "FindNode" is called by the function "FindValue") in ANSI C programming language, and FIG. 11B illustrates implementation of these as a state machine in RTL Verilog. FIGS. 11A and 11B also provide another illustration of the handling of C-type programming language structures, including translation of the operation "->" (i.e., structure member dereferencing by pointer).

The method of the invention may also comprise compiling a callable C-type function into a functionally equivalent HDL program language expression that is executed synchronously on the occurrence of an external event. FIGS. 12A and 12B illustrate a simple case of synchronous event detection in the case where the HDL expression does not require a state machine. The C-type function "on_event" represents any executable C-type function, which is called for execution by another C-type function, for example, "main." This call is converted into RTL Verilog HDL that is executable on the occurrence of an external event, such as assertion of a signal on an input wire. The determination of whether or not a callable C-type function is present is performed by the code shown in the source code listing which appears in microfiche Appendix A in file OSYMBOLS.CPP at lines 5052–5232. Thus, the C-type function "on_event" (FIG. 12A) is compiled into RTL Verilog that is executed when signal "run_on_event" is asserted true (FIG. 12B). Compilation of the callable C-type function into a functionally equivalent HDL program language expression which is executed synchronously on the occurrence of an external event is performed by the code shown in the source code listing which appears in microfiche Appendix A in file GCODE.CPP at lines 5889–5990. Event detection in this implementation is synchronous, that is, the event is detected only on a positive edge of a clock signal. It will be understood by persons skilled in the art that the same compilation process can be applied to a callable C-type function which requires implementation of a state machine in RTL Verilog in the case in which the state machine is executed synchronously on the occurrence of an external event. The following example will illustrate asynchronous event detection.

FIGS. 13A and 13B illustrate compiling a callable C-type function into a functionally equivalent HDL program language expression that is executed asynchronously after the occurrence of an external event. FIGS. 13A and 13B illustrate a simple case of asynchronous event detection in the case where the HDL expression does not require a state machine. The determination of whether or not a callable C-type function is present is performed by the code shown in the source code listing which appears in microfiche Appendix A in file OSYMBOLS.CPP at lines 5052–5232.

As in the case of FIG. 12A, the C-type function "on_event" shown in FIG. 13A again represents any executable C-type function which is called for execution by another C-type function, for example, "main." However, as shown in FIG. 13B, this call is converted into RTL Verilog HDL that is executable following occurrence of an external event, such as transition of a signal on an input wire. That is, the pragma causes the C-type function "on_event" (FIG. 13A) to be compiled into RTL Verilog which is executed when signal "run_on_event" transitions from false to true (FIG. 13B). This occurs a synchronously relative to the occurrence of the positive edge of a clock signal ("posedge clock"). Compilation of the callable C-type function into a functionally equivalent HDL program language expression which is executed a synchronously on the occurrence of an external event is performed by the code shown in the source code listing which appears in microfiche Appendix A in file GCODE.CPP at lines 5889–5990. Note that asynchronous event processing must handle timing constraints that do not occur in the synchronous event implementation shown in FIGS. 12A and 12B.

It will be understood by persons skilled in the art that a similar compilation process can be applied to a callable C-type function that requires implementation of a state machine in RTL Verilog HDL. In the case in which the state machine is executed a synchronously with respect to the occurrence of an external event, instantiation of a flip-flop is required in RTL Verilog to store the occurrence of the event. If this flip-flop is set, the state machine runs on the next-occurring positive edge of a clock signal.

FIGS. 14A and 14B illustrate parallel processing of two complex C-type functions and two state machines running simultaneously. These functions ("func1" and "func2") do not interfere with each other, which means they: 1) do not call each other; 2) do not share external or on-chip static memory; 3) do not share an HDL functional block that performs a complicated mathematical operation; and 4) do not write into the same hardware register. Because of this fact, these functions can be performed simultaneously. External logic can safely assert signals "run_func1" and "run_func2" at any time independently of each other, as shown in FIG. 14B. Compilation of the complex C-type functions that can execute simultaneously into a plurality of HDL state machines that operate in parallel is performed by the code shown in the source code listing which appears in microfiche Appendix A in file GCODE.CPP at lines 5615–6251. Since these functions require state machines to implement them, their execution is synchronous with the positive edge of a clock signal.

FIGS. 15A and 15B illustrate compilation of ANSI C variable argument functions and variable argument function calls into RTL Verilog HDL. As shown in FIG. 15A, the ANSI C variable argument function "average" is called from another ANSI C function "main". In order to convert the variable argument function call "average" to RTL Verilog, a temporary parameter storage location in addressable memory is utilized. This temporary storage location resides immediately after the location of the last fixed parameter, namely, "'_average_first", of the variable argument function "average", as shown in FIG. 15B. When function "main" calls function "average", function "main" sets the parameters for function "average" by writing values for those parameters into the addressable memory at the temporary parameter storage location.

The method in accordance with the invention also supports the use of ANSI C recursive function calls. The C-type program is parsed to determine whether or not a direct or indirect recursive function call is present. That is, a global analysis of the C-type program is performed to determine which functions are recursive. Any identifiable direct or indirect recursive function call is compiled into an HDL state machine which has an interface to a stack implemented utilizing either external or internal memory or, alternatively, an array of hardware registers. The generated RTL Verilog module has a stack pointer implemented utilizing a hardware register employed to store and restore local variables of the recursive function and other recursive function information.

FIGS. 16A and 16B illustrate compilation of an ANSI C recursive function and recursive function call into RTL Verilog HDL. As shown in FIG. 16A, the ANSI C recursive function "MoveRing" is called from itself and from another ANSI C function "Hanoi". In order to translate the recursive function call to "MoveRing" into RTL Verilog:

1. A designated region of addressable memory at the location "'recursion_stack" is established in RTL Verilog, as shown in FIG. 16B.

2. A designated hardware register, namely "stack_pointer" is defined in RTL Verilog, as also shown in FIG. 16B.

3. Before the recursive function "MoveRing" calls itself (i.e., the recursive function "MoveRing"), recursive function "MoveRing" saves its local context into the established stack which consists of the designated region of the addressable memory at the location "'recursion_stack" and the designated hardware register, namely, "stack_pointer". The recursive function "MoveRing" local context contains recursive function "MoveRing" local variable and parameter registers, namely, "_MoveRing_nRings", "_MoveRing_Tower1", "_MoveRing_Tower2", "_MoveRing_Tower3", and the recursive function "MoveRing" return state register, namely, "return_state_MoveRing".

4. After the recursive function "MoveRing" call, the recursive function "MoveRing" restores its local context, as shown in FIG. 16B.

By storing and restoring its local context before and after the recursive call, respectively, the recursive function "MoveRing" avoids losing its local context. Before the recursive function calls itself, it saves the local context on the memory stack (an addressable memory). After executing the function, the recursive function restores its local context.

FIGS. 17A and 17B illustrate compilation of an ANSI C function-call-by-pointer into RTL Verilog HDL. As shown in FIG. 17A, the ANSI C functions "f1" and "f2" are called from the ANSI C function "main" using a pointer variable "f". Depending upon the value of parameter "n" of the ANSI C function "main", either pointer-to-function "f1" or pointer-to-function "f2" is assigned to the pointer variable "f". Then, the ANSI C function "main" calls one of "f1" or "f2" using the pointer variable "f". This ANSI C function-call-by-pointer is translated into RTL Verilog by assigning the hardware register "state" a value corresponding to the first state of the function, namely, "_main_f", as shown in FIG. 17B. The assigned value becomes the current state of the generated state machine. Depending upon the value of the "_main_n" hardware register in RTL Verilog, the pointer-to-function hardware register "_main_f" is assigned to either state "_f1" or to state "_f2" in RTL Verilog, which correspond to ANSI C functions "f1" and "f2", respectively.

FIGS. 18A and 18B illustrate mapping addressable variables defined in C-type programming language onto an addressable array of hardware registers formed in HDL. Specifically, "array" is an addressable variable, because it is a C-type programming language array, as shown in FIG. 18A. Therefore, this ANSI C array is mapped onto addressable memory implemented as an addressable array of hardware registers, namely, "memory" in RTL Verilog HDL, as shown in FIG. 18B. The compilation is performed by the code shown in the source code listing which appears in microfiche Appendix A in file OSYMBOLS.CPP at lines 4802–5001. The starting address of the ANSI C "array" in the "memory" array in RTL Verilog shown in FIG. 18B is "'offset_main_3_main_array".

The method in accordance with the invention may also comprise compiling a plurality of interdependent C-type functions into a plurality of HDL state machines that operate in a data processing pipeline. FIGS. 19A and 19B illustrate compilation of three ANSI C functions (FIG. 19A) into a data processing pipeline implemented in RTl Verilog HDL (FIG. 19B). In contrast to the three-stage data processing pipeline shown in FIG. 8C, the three-stage data processing pipeline shown in FIG. 19C comprises a separate state machine to implement each of the three stages of the data processing pipeline in RTL Verilog. Otherwise, the configuration of the data processing pipeline shown in FIG. 19C is similar to the configuration of the data processing pipeline shown in FIG. 8C. Although the implementation of the data processing pipeline in RTL Verilog shown in FIG. 19B includes a state machine for each stage, other ANSI C functions do not require the implementation of state machines, as in the case of the data processing pipeline shown in FIG. 8B. Alternatively, the data processing pipeline may comprise a combination of simple HDL functional blocks and state machines. The compilation is performed by the code shown in the source code listing which appears in microfiche Appendix A in file OSYMBOLS.CPP at lines 4896–4950.

FIGS. 20A and 20B illustrate that a hardware design originally rendered in ANSI C programming language may be implemented in actual hardware. The target hardware was a xilinx FPGA on an APS-X84 hardware board. The board was installed in a slot in a computer. The result was to implement a counter whose operation is evidenced by a blinking LCD on the board. The frequency of blinking is determined by the on-board clock rate and the user-specified terminal count. FIG. 20A illustrates the hardware design rendered in ANSI C programming language, and FIG. 20B shows the Verilog code after compilation.

FIG. 20B also shows configuration of an interface in the HDL synthesizable design for the gate-level hardware representation. That is, an additional interface Verilog module with wire assignments is needed to map the hardware I/O pins of the target hardware (APS-X84 FPGA) to the computer bus. This is shown in FIG. 20B after the comment "// APSX84.v—Verilog wrapper module which instantiates module Light.v.".

The HDL design may be simulated prior to and/or after the wire assignments are mapped to the I/O pins. For example, one of various simulation programs commercially available from Wellspring Solutions, Cadence Design Systems, Mentor Graphics Corporation, Synopsis, Viewlogic Systems, or Veri Best, Inc. may be used for simulation of the HDL design.

The hardware implementation may be performed using physical design tools to implement the gate-level representation produced by synthesizing the Verilog code using one of various synthesis programs commercially available from Synplicity, Synopsys, or Exemplar Logic. In this example, the physical design tool that was used is commercially available from Xilinx.

The foregoing describes compilation of a hardware design rendered in ANSI C high-level programming language into an HDL synthesizable design in RTL Verilog HDL. The following example illustrates the compilation of a hardware design rendered in ANSI C into an HDL synthesizable design in both Verilog and VHDL. Therefore, the computer aided hardware design tool in accordance with the invention can provide compilation of a hardware design rendered in ANSI C high-level programming language into any of various HDLs.

FIGS. 21A–21C illustrate compilation of a hardware design from a high-level programming language to several HDLs commonly employed for hardware design. FIG. 21A shows a hardware design for a callable function rendered in ANSI C high-level programming language. FIG. 21A comprises the ANSI C text for the hardware design. FIG. 21B shows the same hardware design compiled into RTL Verilog HDL. FIG. 21B comprises the Verilog text for the hardware design. FIG. 21C shows the same hardware design compiled into another commercially available HDL, namely, VHDL. FIG. 21C comprises the VHDL text for the hardware design.

In accordance with one aspect of the invention, ANSI C pointer and structure operations are translated into transactions to external or on-chip static memory in a gate-level hardware representation. The known prior art does not process ANSI C pointers or structures and therefore disallows the use of pointers and structures in rendering a hardware design.

In accordance with a preferred embodiment of the invention, the ANSI C pointer operations are compiled into HDL that is synthesized to a gate-level hardware representation. FIG. 22A illustrates an ANSI C programming language description for reading a memory word located at the memory address referenced by the variable parameter "p" which has an ANSI C "pointer" type. FIG. 22B illustrates compilation of the ANSI C pointer operation "*" into RTL Verilog HDL that can be synthesized into a gate-level hardware design file, or netlist. FIG. 22C is a gate-level schematic diagram created from the netlist. FIG. 22C shows clock-enabled flip-flop hardware registers and control logic for reading 4-bit data located in external addressable memory at the location pointed by a 4-bit address on wires "PARAM_READ_P0–3", which illustrates the compilation of the C-type program to a gate-level hardware description. The external or on-chip memory is addressed by the address stored on wires "A0–3" at the Q outputs of the flip-flops shown in the lower portion of FIG. 22C. The memory returns the addressed data on wires "D0–3". The addressed data are clocked to the Q outputs of the flip-flops shown in the top portion of FIG. 22C onto wires "RESULT_READ0–3". Although FIGS. 22A–22C show a 4-bit-wide variable, the variable may have any desired width, such as a 16- or 32-bit width.

FIG. 23A illustrates an ANSI C programming language description for writing the content of the parameter variable "d" into a memory word located at the memory address referenced by the variable parameter "p" which has an ANSI C "pointer" type. FIG. 23B illustrates compilation of the ANSI C 4-bit-wide variable "d" into RTL Verilog HDL that can be synthesized into a netlist. FIG. 23C is a gate-level schematic diagram created from the netlist. FIG. 23C shows clock-enabled flip-flop hardware registers and control logic for writing 4-bit data to external addressable memory at the location pointed by a 4-bit address on wires "PARAM_WRITE_P0–3". The external memory is addressed by the values stored on wires "A0–3" at the Q outputs of the flip-flops shown in the top portion of FIG. 23C. The data to be stored are clocked from the wires "PARAM_WRITE_D0–3" to the D inputs of the flip-flops shown in the lower portion of FIG. 23C onto wires "D0–3". Although FIGS.

23A–23C show a 4-bit-wide variable, the variable may have any desired width, such as a 16- or 32-bit width.

Also in accordance with a preferred embodiment of the invention, ANSI C structure operations are compiled into HDL that is synthesized to a gate-level hardware representation. FIG. 24A illustrates an ANSI C programming language description for reading a memory word located at the memory address referenced by the variable parameter "p" which has an ANSI C "pointer-to-structure" type and a fixed offset corresponding to the structure member "b". FIG. 24B illustrates compilation of the ANSI C structure operation "->" into RTL Verilog HDL that can be synthesized into a gate-level hardware design file, or netlist. FIG. 24C is a gate-level schematic diagram created from the netlist. FIG. 24C shows clock-enabled flip-flop hardware registers, control logic, and an adder for providing a constant offset to a given address for reading 4-bit data located in external addressable memory at the location pointed by a 4-bit address on wires "PARAM_READ_MEMBER_B_P0–3" plus the offset provided by the adder, which illustrates the compilation of the C-type program to a gate-level hardware description. The external or on-chip memory is addressed by the address stored on wires "A0–3" at the Q outputs of the flip-flops shown in the upper portion of FIG. 24C. The memory returns the addressed data on wires "D0–3". The addressed data are clocked to the Q outputs of the flip-flops shown in the lower portion of FIG. 24C onto wires "RESULT_READ_MEMBER_B0–3". Although FIGS. 24A–24C show a 4-bit-wide variable, the variable may have any desired width, such as a 16- or 32-bit width.

FIG. 25A illustrates an ANSI C programming language description for writing the content of the parameter variable "n" into a memory word located at the memory address referenced by the variable parameter "p" which has an ANSI C "pointer-to-structure" type and a fixed offset corresponding to the structure member "b". FIG. 25B illustrates compilation of the ANSI C structure operation "->" into RTL Verilog HDL that can be synthesized into a netlist. FIG. 25C is a gate-level schematic diagram created from the netlist. FIG. 25C shows clock-enabled flip-flop hardware registers, control logic, and an adder for providing a constant offset to a given address for writing 4-bit data to external addressable memory at the location pointed by a 4-bit address on wires "PARAM_WRITE_MEMBER_B_P0–3" plus the offset provided by the adder. The external memory is addressed by the values stored on wires "A0–3" at the Q outputs of the flip-flops shown in the top portion of FIG. 25C. The data to be stored are clocked from the wires "PARAM_WRITE_MEMBER_B_N0–3" to the D inputs of the flip-flops shown in the lower portion of FIG. 25C onto wires "D0–3". Although FIGS. 25A–25C show a 4-bit-wide variable, the variable may have any desired width, such as a 16- or 32-bit width.

FIG. 26A illustrates an ANSI C programming language description for reading a memory word located at the memory address referenced by the fixed address determined at compile time of the "b" member of structure "s". FIG. 26B illustrates compilation of the ANSI C structure operation "." into RTL Verilog HDL that can be synthesized into a gate-level hardware design file, or netlist. FIG. 26C is a gate-level schematic diagram created from the netlist. FIG. 26C shows clock-enabled flip-flop hardware registers and control logic for reading 4-bit data located in external addressable memory at the location pointed by a fixed address "2", which illustrates the compilation of the C-type program to a gate-level hardware description. The external or on-chip memory is addressed by the address stored on wires "A0–1" at the Q outputs of the flip-flops shown in the middle portion of FIG. 26C. The memory returns the addressed data on wires "D0–3". The addressed data are clocked to the Q outputs of the flip-flops shown in the lower portion of FIG. 26C onto wires "RESULT_READ_MEMBER_B0–3". Although FIGS. 26A–26C show a 4-bit-wide variable, the variable may have any desired width, such as a 16- or 32-bit width.

FIG. 27A illustrates an ANSI C programming language description for writing the content of the parameter variable "n" into a memory word located at the memory address referenced by the fixed address determined at compile time of the "b" member of structure "s". FIG. 27B illustrates compilation of the ANSI C structure operation "." into RTL Verilog HDL that can be synthesized into a netlist. FIG. 27C is a gate-level schematic diagram created from the netlist. FIG. 27C shows clock-enabled flip-flop hardware registers and control logic for writing 4-bit data to external addressable memory at the location pointed by a fixed address "2". The external memory is addressed by the values stored on wires "A0–1" at the Q outputs of the flip-flops shown in the middle portion of FIG. 27C. The data to be stored are clocked from the wires "PARAM_WRITE_MEMBER_B_N0–3" to the D inputs of the flip-flops shown in the lower portion of FIG. 27C onto wires "D0–3". Although FIGS. 27A–27C show a 4-bit-wide variable, the variable may have any desired width, such as a 16- or 32-bit width.

According to one modification, ANSI C pointer and structure operations for a read operation may be directly implemented in a gate-level hardware description by configuring a series of flip-flops in hardware corresponding to the number of bits of memory address and another series of flip-flops corresponding in number to the number of bits of data to be read, and by providing control logic that enables data to be read from addressable external or on-chip hardware memory to output wires. ANSI C pointer and structure operations for a write operation may also be directly implemented in a gate-level hardware description by configuring a series of flip-flops in hardware corresponding to the number of bits of memory address and another series of flip-flops corresponding in number to the number of bits of data to be written, and by providing control logic that enables data to be written from addressable external or on-chip hardware memory to input wires. For example, a generalized circuit configuration may be defined in a library, and the number m of bits of data and the number n of bits of address would be directly derived from the ANSI C pointer to define the schematic for the circuit. Therefore, ANSI C pointer and structure operations may be automatically converted by a parameterizable library look-up using values for m and n to gate-level hardware descriptions similar to the schematics shown in FIGS. 22C and 23C for pointer operations and in FIGS. 24C, 25C, 26C, and 27C for structure operations, respectively.

In summary, prior art computer aided hardware design tools generate so many unhandled exceptions and language restrictions when presented with typical high-level language programs (e.g., a C-type program) that it renders such tools virtually useless for practical hardware design. Therefore, persons using such tools are required to read manuals and attempt to create work-arounds for portions of the high-level programming language that are not implemented. In contrast, a salient feature of the system in accordance with the invention is that almost any ANSI C (or high-level programming language translatable to a C-type programming language) can be compiled, thereby obviating the need for the user to read manuals and attempt to create work-arounds for portions of the high-level programming language that are not implemented. Existing programs in a high-level programming language can typically be fed directly into the system in accordance with the invention without any error messages being generated.

Hardware generated using prior art computer aided hardware design tools is typically based on simple line-by-line, table-driven translation and as such does not contain the necessary widely scoped optimizations that produce practical and useful hardware designs for most applications. The system in accordance with the invention supports all functions of the high-level programming language in which the hardware design is rendered at compile time and re-uses HDL functional blocks for hardware design efficiency.

Design output of the prior art computer aided hardware design tool can be in so-called "behavioral HDL," which in many cases cannot be synthesized by existing synthesis programs into a gate-level representation of the hardware. The system in accordance with the invention generates register transfer level HDL that can always be synthesized.

Prior art computer aided hardware design tools attempt to generate designs that only apply to a single manufacturer hardware family, such as the creation of an XNF file for the Xilinx XC4000 FPGA family. In contrast, the system of the invention converts to a synthesizable HDL which can be synthesized by standard synthesis programs for implementation on hardware platforms of any one of a number of manufacturers, including Altera, Xilinx, Actel, Texas Instruments, LSI Logic, VLSI Technology, Lucent Technologies, NEC, Hitachi, Toshiba, Fujitsu, and others.

Finally, the language employed by prior art computer aided hardware design tools has added and limited so many constructs that it is difficult to consider the employed language as the high-level language it purports to be. That is, the resultant language is more like a new specialized HDL. In contrast, the system in accordance with the invention enables the user to truly use a highlevel programming language, such as ANSI C, to design hardware.

The table below summarizes which prior art attempts described earlier have which shortcomings and shows the advantageous features of the system in accordance with the invention. The table clearly evidences that the system of the invention is a unique contribution to the state-of-the-art.

ating system platform, such as a UNIX operating system platform. These contemplated alternative embodiments and other modifications, changes, and adaptations are intended to be comprehended within the meaning and range of equivalents of the appended claims.

What is claimed is:

1. A method for converting a C-type language program to a hardware design, comprising the steps of:
    creating an algorithmic representation in a given C-type programming language corresponding to a preliminary hardware design;
    compiling the C-type programming language preliminary hardware design into a hardware description language (HDL) synthesizable design, wherein the step of compiling comprises the steps of:
        compiling a C-type program control flow into an HDL state machine; and
        assigning input/output as defined in the C-type program to specific wires in the HDL synthesizable design;
    configuring in the HDL synthesizable design an interface for a gate-level hardware representation;
    determining the presence of any C-type pointers in the C-type program; and
    compiling any C-type pointers and pointer indirection into an HDL state-machine-based memory access protocol.

2. The method of claim 1, further comprising the step of synthesizing the HDL design into the gate-level hardware representation using a synthesis program to interpret the HDL design.

3. The method of claim 2, further comprising the step of using physical design tools to implement the gate-level representation as an actual hardware implementation.

4. The method of claim 1 wherein the C-type programming language is selected from among the group of C-type programming languages consisting of ANSI C, B, C++, Java, Kernighan & Ritchie C, and Objective C.

5. The method of claim 1 wherein the hardware description language is selected from among the group of hardware description languages consisting of Verilog, VHDL, ABEL, CUPL, AHDL, MACHX, and PALASM.

6. A method for converting a C-type language program to a hardware design, comprising the steps of:

| Feature | Invention | TMCC | JRS | NLC | Handel-C | XC |
|---|---|---|---|---|---|---|
| 1. Substantially full ANSI C | Yes | No | No | No | No | No |
| 2. Logic design optimized | Yes | No | No | No | Yes | Yes |
| 3. Design synthesizable | Yes | Yes | No | Yes | Yes | Yes |
| 4. Targets general HDL | Yes | No | Yes | No | No | No |
| 5. Is high-level programming language (not specialized new HDL) | Yes | Yes | Yes | Yes | No | No |

It will be understood and appreciated that the embodiments of the present invention described above are susceptible to various modifications, changes, and adaptations. For example, the computer aided hardware design tool in accordance with the invention can also convert other high-level programming languages than those that are specifically identified to a synthesizable hardware description language. Also, although the preferred embodiments have been described for a personal computer (PC) operating system platform, it will be appreciated that the computer aided design tool in accordance with the invention can alternatively be adapted for execution on any other type of opercreating an algorithmic representation in a given C-type programming language corresponding to a preliminary hardware design;
compiling the C-type programming lanauage preliminary hardware design into a hardware description language (HDL) synthesizable design, wherein the step of compiling comprises the steps of:
    compiling a C-type program control flow into an HDL state machine; and
    assigning input/output as defined in the C-type program to specific wires in the HDL synthesizable design;

configuring in the HDL synthesizable design an interface for a gate-level hardware representation;

determining the presence of any non-addressable variables in the C-type program; and mapping any non-addressable variables onto hardware registers formed in HDL.

7. The method of claim 6 wherein the C-type programming language variables include at least one of integer, floating point, pointer, enum, struct, and union variables.

8. The method of claim 6, further comprising the step of synthesizing the HDL design into the gate-level hardware representation using a synthesis program to interpret the HDL design.

9. The method of claim 8, further comprising the step of using physical design tools to implement the gate-level representation as an actual hardware implementation.

10. The method of claim 6 wherein the C-type programming language is selected from among the group of C-type programming languages consisting of ANSI C, B, C++, Java, Kernighan & Ritchie C, and Objective C.

11. The method of claim 6 wherein the hardware description language is selected from among the group of hardware description languages consisting of Verilog, VHDL, ABEL, CUPL, AHDL, MACHX, and PALASM.

12. A method for converting a C-type language program to a hardware design, comprising the steps of:

creating an algorithmic representation in a given C-type programming language corresponding to a preliminary hardware design;

compiling the C-type programming language preliminary hardware design into a hardware description language (HDL) synthesizable design, wherein the step of compiling comprises the steps of:

compiling a C-type program control flow into an HDL state machine; and assigning input/output as defined in the C-type program to specific wires in the HDL synthesizable design;

configuring in the HDL synthesizable design an interface for a gate-level hardware representation;

determining the presence of any addressable variables in the C-type program; and mapping any addressable variables onto at least one of addressable hardware memory and an addressable array of hardware registers formed in HDL.

13. The method of claim 12 wherein the C-type programming language variables include at least one of integer, floating point, pointer, enum, struct, and union variables.

14. The method of claim 12, further comprising the step of synthesizing the HDL design into the gate-level hardware representation using a synthesis program to interpret the HDL design.

15. The method of claim 14, further comprising the step of using physical design tools to implement the gate-level representation as an actual hardware implementation.

16. The method of claim 12 wherein the C-type programming language is selected from among the group of C-type programming languages consisting of ANSI C, B, C++, Java, Kernighan & Ritchie C, and Objective C.

17. The method of claim 12 wherein the hardware description language is selected from among the group of hardware description languages consisting of Verilog, VHDL, ABEL, CUPL, AHDL, MACHX, and PALASM.

18. A method for converting a C-type language program to a hardware design, comprising the steps of:

creating an algorithmic representation in a given C-type programming language corresponding to a preliminary hardware design;

compiling the C-type programming language preliminary hardware design into a hardware description language (HDL) synthesizable design, wherein the step of compiling comprises the steps of:

compiling a C-type program control flow into an HDL state machine; and assigning input/output as defined in the C-type program to specific wires in the HDL synthesizable design;

configuring in the HDL synthesizable design an interface for a gate-level hardware representation;

determining the presence of any complicated C-type mathematical operations in the C-type program; and compiling multiple occurrences of any complicated C-type mathematical operation into a given HDL functional block that implements such an operation invoked on each occurrence by different states driven by the state machine.

19. The method of claim 18, further comprising the step of synthesizing the HDL design into the gate-level hardware representation using a synthesis program to interpret the HDL design.

20. The method of claim 19, further comprising the step of using physical design tools to implement the gate-level representation as an actual hardware implementation.

21. The method of claim 18 wherein the C-type programming language is selected from among the group of C-type programming languages consisting of ANSI C, B, C++, Java, Kernighan & Ritchie C, and Objective C.

22. The method of claim 18 wherein the hardware description language is selected from among the group of hardware description languages consisting of Verilog, VHDL, ABEL, CUPL, AHDL, MACHX, and PALASM.

23. A method for converting a C-type language program to a hardware design, comprising the steps of:

creating an algorithmic representation in a given C-type programming language corresponding to a preliminary hardware design;

compiling the C-type programming language preliminary hardware design into a hardware description language (HDL) synthesizable design, wherein the step of compiling comprises the steps of:

compiling a C-type program control flow into an HDL state machine; and assigning input/output as defined in the C-type program to specific wires in the HDL synthesizable design;

configuring in the HDL synthesizable design an interface for a gate-level hardware representation; and determining the presence of any recursion in the C-type program, and wherein at least one of an identifiable direct and indirect recursive function call is compiled into an HDL state machine which has an interface to a stack implemented utilizing one of external and internal memory and an array of hardware registers, wherein the state machine has a stack pointer implemented utilizing a hardware register employed to store and restore local variables of the recursive function and other recursive function information in the stack.

24. The method of claim 23, further comprising the step of synthesizing the HDL design into the gate-level hardware representation using a synthesis program to interpret the HDL design.

25. The method of claim 24, further comprising the step of using physical design tools to implement the gate-level representation as an actual hardware implementation.

26. The method of claim 23 wherein the C-type programming language is selected from among the group of C-type programming languages consisting of ANSI C, B, C++, Java, Kernighan & Ritchie C, and Objective C.

27. The method of claim 23 wherein the hardware description language is selected from among the group of hardware description languages consisting of Verilog, VHDL, ABEL, CUPL, AHDL, MACHX, and PALASM.

28. A method for converting a high-level language program to a hardware design, comprising the steps of:

creating an algorithmic representation in a given high-level programming language corresponding to a preliminary hardware design;

translating the high-level programming language preliminary hardware design into a C-type programming language preliminary hardware design;

compiling the C-type programming language preliminary hardware design into a hardware description language (HDL) synthesizable design, wherein the step of compiling comprises the steps of:

compiling a C-type program control flow into an HDL state machine; and assigning input/output as defined in the C-type program to specific wires in the HDL synthesizable design;

configuring in the HDL synthesizable design an interface for a gate-level hardware representation;

determining the presence of any C-type pointers in the C-type program; and compiling any C-type pointers and pointer indirection into an HDL state-machine-based memory access protocol.

29. The method of claim 28, further comprising the step of synthesizing the HDL design into the gate-level hardware representation using a synthesis program to interpret the HDL design.

30. The method of claim 29, further comprising the step of using physical design tools to implement the gate-level hardware representation as an actual hardware implementation.

31. The method of claim 28 wherein the high-level programming language is selected from among the group of C-type programming languages consisting of APL, Ada, Algol, B, Basic, Kernighan & Ritchie C, C++, CLOS, COBOL, Clu, Common Lisp, Coral, Dylan, Eiffel, Emacs Lisp, Forth, Fortran, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC.

32. The method of claim 28 wherein the hardware description language is selected from among the group of hardware description languages consisting of Verilog, VHDL, ABEL, CUPL, AHDL, MACHX, and PALASM.

33. A method for converting a high-level language program to a hardware design, comprising the steps of:

creating an algorithmic representation in a given high-level programming language corresponding to a preliminary hardware design;

translating the high-level programming language preliminary hardware design into a C-type programming language preliminary hardware design;

compiling the C-type programming language preliminary hardware design into a hardware description language (HDL) synthesizable design, wherein the step of compiling comprises the steps of:

compiling a C-type program control flow into an HDL state machine; and assigning input/output as defined in the C-type program to specific wires in the HDL synthesizable design;

configuring in the HDL synthesizable design an interface for a gate-level hardware representation;

determining the presence of any non-addressable variables in the C-type program; and mapping any non-addressable variables onto hardware registers formed in HDL.

34. The method of claim 33 wherein the C-type programming language variables include at least one of integer, floating point, pointer, enum, struct, and union variables.

35. The method of claim 33, further comprising the step of synthesizing the HDL design into the gate-level hardware representation using a synthesis program to interpret the HDL design.

36. The method of claim 35, further comprising the step of using physical design tools to implement the gate-level hardware representation as an actual hardware implementation.

37. The method of claim 33 wherein the high-level programming language is selected from among the group of C-type programming languages consisting of APL, Ada, Algol, B, Basic, Kernighan & Ritchie C, C++, CLOS, COBOL, Clu, Common Lisp, Coral, Dylan, Eiffel, Emacs Lisp, Forth, Fortran, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC.

38. The method of claim 33 wherein the hardware description language is selected from among the group of hardware description languages consisting of Verilog, VHDL, ABEL, CUPL, AHDL, MACHX, and PALASM.

39. A method for converting a high-level language program to a hardware design, comprising the steps of:

creating an algorithmic representation in a given high-level programming language corresponding to a preliminary hardware design;

translating the high-level programming language preliminary hardware design into a C-type programming language preliminary hardware design;

compiling the C-type programming language preliminary hardware design into a hardware description language (HDL) synthesizable design, wherein the step of compiling comprises the steps of:

compiling a C-type program control flow into an HDL state machine; and assigning input/output as defined in the C-type program to specific wires in the HDL synthesizable design;

configuring in the HDL synthesizable design an interface for a gate-level hardware representation;

determining the presence of any addressable variables in the C-type program; and mapping any addressable variables onto at least one of addressable hardware memory and an addressable array of hardware registers formed in HDL.

40. The method of claim 39 wherein the C-type programming language variables include at least one of integer, floating point, pointer, enum, struct, and union variables.

41. The method of claim 39, further comprising the step of synthesizing the HDL design into the gate-level hardware representation using a synthesis program to interpret the HDL design.

42. The method of claim 41, further comprising the step of using physical design tools to implement the gate-level hardware representation as an actual hardware implementation.

43. The method of claim 39, wherein the high-level programming language is selected from among the group of C-type programming languages consisting of APL, Ada, Algol, B, Basic, Kernighan & Ritchie C, C++, CLOS, COBOL, Clu, Common Lisp, Coral, Dylan, Eiffel, Emacs Lisp, Forth, Fortran, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC.

44. The method of claim 39 wherein the hardware description language is selected from among the group of hardware description languages consisting of Verilog, VHDL, ABEL, CUPL, AHDL, MACHX, and PALASM.

45. A method for converting a high-level language program to a hardware design, comprising the steps of:

creating an algorithmic representation in a given high-level programming language corresponding to a preliminary hardware design;

translating the high-level programming language preliminary hardware design into a C-type programming language preliminary hardware design;

compiling the C-type programming language preliminary hardware design into a hardware description language (HDL) synthesizable design, wherein the step of compiling comprises the steps of:

compiling a C-type program control flow into an HDL state machine; and assigning input/output as defined in the C-type program to specific wires in the HDL synthesizable design;

configuring in the HDL synthesizable design an interface for a gate-level hardware representation;

determining the presence of any complicated C-type mathematical operations in the C-type program; and compiling multiple occurrences of any complicated C-type mathematical operation into a given HDL functional block that implements such an operation invoked on each occurrence by different states driven by the state machine.

46. The method of claim 45, further comprising the step of synthesizing the HDL design into the gate-level hardware representation using a synthesis program to interpret the HDL design.

47. The method of claim 46, further comprising the step of using physical design tools to implement the gate-level hardware representation as an actual hardware implementation.

48. The method of claim 45 wherein the high-level programming language is selected from among the group of C-type programming languages consisting of APL, Ada, Algol, B, Basic, Kernighan & Ritchie C, C++, CLOS, COBOL, Clu, Common Lisp, Coral, Dylan, Eiffel, Emacs Lisp, Forth, Fortran, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC.

49. The method of claim 45 wherein the hardware description language is selected from among the group of hardware description languages consisting of Verilog, VHDL, ABEL, CUPL, AHDL, MACHX, and PALASM.

50. A method for converting a high-level language program to a hardware design, comprising the steps of:

creating an algorithmic representation in a given high-level programming language corresponding to a preliminary hardware design;

translating the high-level programming language preliminary hardware design into a C-type programming language preliminary hardware design;

compiling the C-type programming language preliminary hardware design into a hardware description language (HDL) synthesizable design, wherein the step of compiling comprises the steps of:

compiling a C-type program control flow into an HDL state machine; and assigning input/output as defined in the C-type program to specific wires in the HDL synthesizable design;

configuring in the HDL synthesizable design an interface for a gate-level hardware representation; and determining the presence of any recursion in the C-type program, and wherein at least one of an identifiable direct and indirect recursive function call is compiled into an HDL state machine which has an interface to a stack implemented utilizing one of external and internal memory and an array of hardware registers, wherein the state machine has a stack pointer implemented utilizing a hardware register employed to store and restore local variables of the recursive function and other recursive function information in the stack.

51. The method of claim 50, further comprising the step of synthesizing the HDL design into the gate-level hardware representation using a synthesis program to interpret the HDL design.

52. The method of claim 51, further comprising the step of using physical design tools to implement the gate-level hardware representation as an actual hardware implementation.

53. The method of claim 50 wherein the high-level programming language is selected from among the group of C-type programming languages consisting of APL, Ada, Algol, B, Basic, Kernighan & Ritchie C, C++, CLOS, COBOL, Clu, Common Lisp, Coral, Dylan, Eiffel, Emacs Lisp, Forth, Fortran, IDL, Icon, Java, Jovial, Lisp, LOGO, ML, Modula, Oberon, Objective C, PL/I, PL/M, Pascal, Postscript, Prolog, Python, RTL, Rexx, SETL, Simula, Sather, Scheme, Smalltalk, Standard ML, TCL, and TRAC.

54. The method of claim 50 wherein the hardware description language is selected from among the group of hardware description languages consisting of Verilog, VHDL, ABEL, CUPL, AHDL, MACHX, and PALASM.

* * * * *